(12) United States Patent
Kim et al.

(10) Patent No.: US 11,377,458 B2
(45) Date of Patent: Jul. 5, 2022

(54) ORGANOMETALLIC COMPOUND AND ORGANIC LIGHT-EMITTING DEVICE INCLUDING THE SAME

(71) Applicants: Samsung Electronics Co., Ltd., Suwon-si (KR); Samsung SDI Co., Ltd., Yongin-si (KR)

(72) Inventors: Juhyun Kim, Suwon-si (KR); Wook Kim, Suwon-si (KR); Youngchun Kwon, Yongin-si (KR); Sangmo Kim, Hwaseong-si (KR); Changho Noh, Suwon-si (KR); Minsik Min, Suwon-si (KR); Sangho Park, Anyang-si (KR); Hyejin Bae, Suwon-si (KR); Wonseok Oh, Suwon-si (KR); Hasup Lee, Seoul (KR); Yongsik Jung, Yongin-si (KR); Younsuk Choi, Seongnam-si (KR)

(73) Assignees: SAMSUNG ELECTRONICS CO., LTD., Gyeonggi-Do (KR); SAMSUNG SDI CO., LTD., Gyeonggi-Do (KR)

(*) Notice: Subject to any disclaimer, the term of this patent is extended or adjusted under 35 U.S.C. 154(b) by 406 days.

(21) Appl. No.: 16/161,559

(22) Filed: Oct. 16, 2018

(65) Prior Publication Data
US 2019/0112324 A1   Apr. 18, 2019

(30) Foreign Application Priority Data

Oct. 16, 2017 (KR) .................. 10-2017-0134248
Oct. 12, 2018 (KR) .................. 10-2018-0121776

(51) Int. Cl.
*H01L 51/00* (2006.01)
*C07F 15/00* (2006.01)
(Continued)

(52) U.S. Cl.
CPC ........ *C07F 15/0033* (2013.01); *C07F 15/002* (2013.01); *C07F 15/0086* (2013.01);
(Continued)

(58) Field of Classification Search
None
See application file for complete search history.

(56) References Cited

U.S. PATENT DOCUMENTS 9,359,549 B2   6/2016  Rayabarapu et al.
10,003,035 B2  6/2018  Hwang et al.
(Continued)

FOREIGN PATENT DOCUMENTS

| CN | 105505378 A | * | 4/2016 | ............. C09K 11/06 |
| CN | 107417738 A | * | 12/2017 | ............. C07F 15/00 |

(Continued)

OTHER PUBLICATIONS

Machine translation of CN-107417738, translation generated Jul. 2021, 39 pages. (Year: 2021).*
(Continued)

*Primary Examiner* — Robert S Loewe
(74) *Attorney, Agent, or Firm* — Cantor Colburn LLP

(57) ABSTRACT

An organometallic compound represented by Formula 1:

$$M(L_1)_{n1}(L_2)_{n2}(L_3)_{n3} \qquad \text{Formula 1}$$

wherein in Formula 1, M, $L_1$, $L_2$, $L_3$, n1, n2, and n3 are the same as defined in the specification.

17 Claims, 1 Drawing Sheet

(51) Int. Cl.
*H01L 51/50* (2006.01)
*H01L 51/52* (2006.01)

(52) U.S. Cl.
CPC ...... *H01L 51/0085* (2013.01); *H01L 51/0087* (2013.01); *H01L 51/0088* (2013.01); *H01L 51/5012* (2013.01); *H01L 51/5092* (2013.01); *H01L 51/5096* (2013.01); *H01L 51/5016* (2013.01); *H01L 51/5056* (2013.01); *H01L 51/5072* (2013.01); *H01L 51/5206* (2013.01); *H01L 51/5221* (2013.01); *H01L 2251/308* (2013.01)

(56) References Cited

U.S. PATENT DOCUMENTS

| | | | |
|---|---|---|---|
| 10,079,349 B2 | 9/2018 | Tsai et al. | |
| 2006/0134462 A1* | 6/2006 | Yeh | H05B 33/14 428/690 |
| 2011/0285275 A1* | 11/2011 | Huang | H01L 51/0085 313/504 |
| 2013/0033171 A1* | 2/2013 | Huang | H05B 33/10 313/504 |
| 2013/0033172 A1* | 2/2013 | Huang | H05B 33/10 313/504 |
| 2015/0097169 A1* | 4/2015 | Xia | C07F 15/0033 257/40 |
| 2015/0188059 A1* | 7/2015 | Chao | C09K 11/06 257/40 |
| 2015/0188060 A1* | 7/2015 | Chao | C07F 15/0033 257/40 |
| 2015/0325807 A1* | 11/2015 | Choi | H01L 51/0088 257/40 |
| 2016/0164006 A1* | 6/2016 | Chao | C07F 15/0033 257/40 |
| 2016/0164007 A1* | 6/2016 | Lin | H01L 51/0085 257/40 |
| 2016/0204358 A1 | 7/2016 | Stoessel et al. | |
| 2017/0155063 A1* | 6/2017 | Wu | C09K 11/06 |
| 2017/0294596 A1* | 10/2017 | Ishibe | H01L 51/0085 |
| 2018/0175309 A1* | 6/2018 | Lin | C07F 15/0033 |
| 2018/0240989 A1 | 8/2018 | Tsai et al. | |

FOREIGN PATENT DOCUMENTS

| | | | | |
|---|---|---|---|---|
| CN | 107573386 A | * | 1/2018 | ............. C07F 15/00 |
| KR | 10-2012-0026486 A | | 3/2012 | |
| KR | 10-2014-0027389 A | | 3/2014 | |
| KR | 10-2015-0039846 A | | 4/2015 | |
| KR | 10-2015-0083017 A | | 7/2015 | |
| KR | 10-2016-0064951 A | | 6/2016 | |
| WO | 2002-015645 A1 | | 2/2002 | |
| WO | 2010118029 A1 | | 10/2010 | |

OTHER PUBLICATIONS

Machine translation of CN-105505378, translation generated Oct. 2021, 39 pages. (Year: 2021).*

Ruben Seifert et al. "Chemical degradation mechanisms of highly efficient blue phosphorescent emitters used for organic light emitting diodes", Organic Electronics 14 (2013) 115-123.

* cited by examiner

ORGANOMETALLIC COMPOUND AND ORGANIC LIGHT-EMITTING DEVICE INCLUDING THE SAME

CROSS-REFERENCE TO RELATED APPLICATION

This application claims priority to Korean Patent Applications Nos. 10-2017-0134248, filed on Oct. 16, 2017, and 10-2018-0121776, filed on Oct. 12, 2018, in the Korean Intellectual Property Office, and all the benefits accruing therefrom under 35 U.S.C. 119, the contents of which are incorporated herein in their entirety by reference.

BACKGROUND

1. Field

One or more embodiments relate an organometallic compound and an organic light-emitting device including the same.

2. Description of the Related Art

Organic light-emitting devices (OLEDs) are self-emission devices that produce full-color images, and that also have wide viewing angles, high contrast ratios, short response times, and excellent characteristics in terms of brightness, driving voltage, and response speed, compared to devices in the art.

In an example, an organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Various types of organic light emitting devices are known. However, there still remains a need in OLEDs having low driving voltage, high efficiency, high brightness, and long lifespan.

SUMMARY

Aspects of the present disclosure provide a novel organometallic compound and an organic light-emitting device including the same.

Additional aspects will be set forth in part in the description which follows and, in part, will be apparent from the description, or may be learned by practice of the presented embodiments.

An aspect provides an organometallic compound represented by Formula 1:

Formula 1

$$M(L_1)_{n1}(L_2)_{n2}(L_3)_{n3}$$

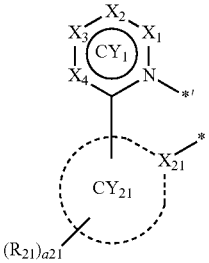

2

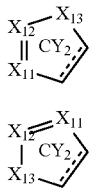

4A

4B

In Formula 1, M may be a transition metal,
in Formula 1, $L_1$ may be a ligand represented by Formula 2,
in Formula 1, n1 may be 1, 2, or 3, wherein, when n1 is two or more, two or more of groups $L_1$ may be identical to or different from each other,
in Formula 1, $L_2$ and $L_3$ may each independently be selected from a monodentate ligand, a bidentate ligand, a tridentate ligand, and a tetradentate ligand,
in Formula 1, n2 and n3 may each independently be 0, 1, 2, 3, or 4, wherein, when n2 is two or more, two or more of groups $L_2$ may be identical to or different from each other, and when n3 is two or more, two or more of groups $L_3$ may be identical to or different from each other,
in Formula 2, $X_1$ may be $C(R_1)$ or N, $X_2$ may be $C(R_2)$ or N, $X_3$ may be $C(R_3)$ or N, and $X_4$ may be $C(R_4)$ or N,
in Formulae 4A and 4B, $X_{11}$ may be $C(R_{11})$ or N, $X_{12}$ may be $C(R_{12})$ or N, and $X_{13}$ may be O, S, Se, $N(R_{13})$, $B(R_{13})$, $P(R_{13})$, or $C(R_{13})(R_{14})$,
in Formulae 4A and 4B, when $X_{11}$ is $C(R_{11})$ and $X_{12}$ is $C(R_{12})$, $R_{11}$ and $R_{12}$ may not be linked to each other,
in Formulae 4A and 4B, ∦ represents a single bond or a double bond,
in Formula 2, i) $X_1$ may be $C(R_1)$ and $X_2$ may be $C(R_2)$, wherein $R_1$ and $R_2$ may be linked to each other to form ring $CY_2$ represented by Formula 4A or 4B, ii) $X_2$ may be $C(R_2)$ and $X_3$ may be $C(R_3)$, wherein $R_2$ and $R_3$ may be linked to each other to form ring $CY_2$ represented by Formula 4A or 4B, or iii) $X_3$ may be $C(R_3)$ and $X_4$ may be $C(R_4)$, wherein $R_3$ and $R_4$ may be linked to each other to form ring $CY_2$ Formula 4A or 4B,
ring $CY_1$ in Formula 2 and ring $CY_2$ represented by Formula 4A or 4B may be condensed with each other,
a) when $X_2$ in Formula 2 is $C(R_2)$ and $X_3$ is $C(R_3)$, $R_2$ and $R_3$ may be linked to each other to form ring $CY_2$ represented by Formula 4A or 4B, or b) when $X_{13}$ in Formula 4A and 4B is $N(R_{13})$, at least one of $X_{11}$ and $X_{12}$ in Formula 4A and 4B may be N,
in Formula 2, $X_{21}$ may be C or N,
in Formula 2, ring $CY_{21}$ may be a $C_5$-$C_{30}$ carbocyclic group or a $C_1$-$C_{30}$ heterocyclic group,
$R_1$ to $R_4$, $R_{11}$ to $R_{14}$, and $R_{21}$ may each independently be selected from hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, and —$P(=O)(Q_8)(Q_9)$, a21 may be an integer from 0 to 20, two of a plurality of neighboring groups $R_{21}$ may be optionally linked to each other to form a substituted or unsubstituted $C_5$-$C_{30}$ carbocyclic group or a substituted or unsubstituted $C_1$-$C_{30}$ heterocyclic group, in Formula 2, * and *' each indicate a binding site to M in Formula 1, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —$N(Q_{31})(Q_{32})$, —$Si(Q_{33})(Q_{34})(Q_{35})$, —$B(Q_{36})(Q_{37})$, and —$P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

Another aspect provides an organic light-emitting device including:

a first electrode;

a second electrode; and an organic layer disposed between the first electrode and the second electrode, wherein the organic layer includes an emission layer and at least one organometallic compound.

In the organic layer, the organometallic compound may serve as a dopant.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
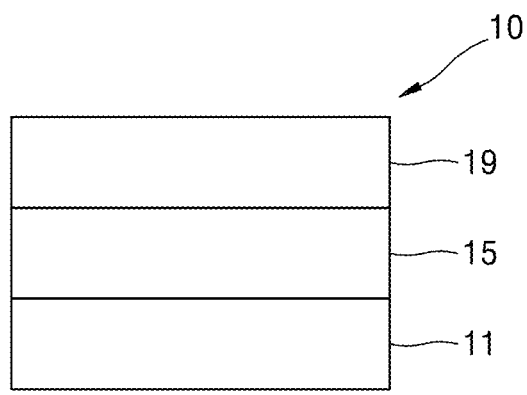
FIG. 1 is a schematic view of an organic light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In one or more exemplary embodiments, an organometallic compound is provided. According to the one or more exemplary embodiments, an organometallic compound may be represented by Formula 1:

$$M(L_1)_{n1}(L_2)_{n2}(L_3)_{n3} \qquad \qquad \text{Formula 1}$$

In Formula 1, M may be a transition metal. For example, M in Formula 1 may be selected from a first-row transition metal, a second-row transition metal, and a third-row transition metal, of the Periodic Table of Elements.

For example, $M_1$ may be iridium (Ir), platinum (Pt), osmium (Os), titanium (Ti), zirconium (Zr), hafnium (Hf), europium (Eu), terbium (Tb), thulium (Tm), or rhodium (Rh).

In an embodiment, M may be Ir, Pt, or Os, but embodiments of the present disclosure are not limited thereto.

In Formula 1, $L_1$ may be a ligand represented by Formula 2. Formula 2 will be described in detail below. In Formula 1, n1 indicates the number of $L_1$, and may be 1, 2, or 3. When n1 is two or more, two or more of groups $L_1$ may be identical to or different from each other:

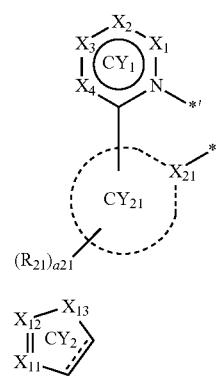

In Formula 1, $L_2$ and $L_3$ may each independently be selected from a monodentate ligand, a bidentate ligand, a tridentate ligand, and a tetradentate ligand. Examples of $L_2$ and $L_3$ will be described in detail below.

In Formula 1, n2 and n3 each indicate the number of $L_2$ and the number of $L_3$, respectively, and may each independently be 0, 1, 2, 3, or 4. When n2 is two or more, two or more of groups $L_2$ may be identical to or different from each other, and when n3 is two or more, two or more of groups $L_3$ may be identical to or different from each other.

In an embodiment, in Formula 1, M may be Ir or Os, and the sum of n1+n2+n3 may be 3 or 4; or M may be Pt, and the sum of n1+n2+n3 may be 2.

In one or more embodiments, in Formula 1, M may be Ir, n1 may be 3, and n2 and n3 may each be 0; or M may be Pt, n1 may be 2, and n2 and n3 may each be 0.

In one or more embodiments, in Formula 1, M may be Ir, n1 may be 3, n2 and n3 may each be 0, and three groups $L_1$ may be identical to each other; or M may be Pt, n1 may be 2, n2 and n3 may each be 0, and two groups $L_1$ may be identical to each other.

In Formula 2, $X_1$ may be $C(R_1)$ or N, $X_2$ may be $C(R_2)$ or N, $X_3$ may be $C(R_3)$ or N, and $X_4$ may be $C(R_4)$ or N. $R_1$ to $R_4$ will be described in detail below.

For example, in Formula 2, $X_1$ may be $C(R_1)$, $X_2$ may be $C(R_2)$, $X_3$ may be $C(R_3)$, and $X_4$ may be $C(R_4)$, but embodiments of the present disclosure are not limited thereto.

In Formulae 4A and 4B, may be $C(R_{11})$ or N, $X_{12}$ may be $C(R_{12})$ or N, and $X_{13}$ may be O, S, Se, $N(R_{13})$, $B(R_{13})$, $P(R_{13})$, or $C(R_{13})(R_{14})$. $R_{11}$ to $R_{14}$ will be described in detail below.

For example, in Formulae 4A and 4B, $X_{13}$ may be O, S, or $N(R_{13})$.

In an embodiment, when $X_{11}$ in Formulae 4A and 4B is $C(R_{11})$ and $X_{12}$ in Formulae 4A and 4B is $C(R_{12})$, $R_{11}$ and $R_{12}$ are not linked to each other. That is, when in Formulae 4A and 4B is $C(R_{11})$ and $X_{12}$ in Formulae 4A and 4B is $C(R_{12})$, $R_{11}$ and $R_{12}$ are not linked to each other to form no other rings.

In Formulae 4A and 4B, ⫶ represents a single bond or a double bond.

In Formula 2,
i) $X_1$ may be $C(R_1)$, and $X_2$ may be $C(R_2)$, wherein $R_1$ and $R_2$ are linked to each other to form ring $CY_2$ represented by Formula 4A or 4B,
ii) $X_2$ may be $C(R_2)$, and $X_3$ may be $C(R_3)$, wherein $R_2$ and $R_3$ are linked to each other to form ring $CY_2$ represented by Formula 4A or 4B, or
iii) $X_3$ may be $C(R_3)$, and $X_4$ may be $C(R_4)$, wherein $R_3$ and $R_4$ are linked to each other to form ring $CY_2$ represented by Formula 4A or 4B,
wherein ring $CY_1$ of Formula 2 and ring $CY_2$ of Formula 4A or 4B are condensed with each other.

The above-described structure of $L_1$ refers to Formulae 2-1 to 2-6 or Formulae 2(1) to 2(6).

Here, a) when $X_2$ in Formula 2 is $C(R_2)$ and $X_3$ in Formula 2 is $C(R_3)$, $R_2$ and $R_3$ are linked to each other to form ring $CY_2$ represented by Formula 4A or 4B, or b) when $X_{13}$ in Formulae 4A and 4B is $N(R_{13})$, at least one of $X_{11}$ and $X_{12}$ (for example, $X_{11}$) in Formulae 4A and 4B may be N.

In an embodiment, when $X_2$ in Formula 2 is $C(R_2)$ and $X_3$ in Formula 2 is $C(R_3)$, $R_2$ and $R_3$ are linked to each other to form ring $CY_2$ represented by Formula 4A or 4B, wherein $X_{13}$ in Formulae 4A and 4B may be O or S.

In one or more embodiments, when $X_2$ in Formula 2 is $C(R_2)$ and $X_3$ in Formula 2 is $C(R_3)$, $R_2$ and $R_3$ are linked to each other to form ring $CY_2$ represented by Formula 4A or 4B, wherein, in Formulae 4A and 4B, $X_{11}$ may be N, and $X_{13}$ may be $N(R_{13})$.

In Formula 2, $X_{21}$ may be C or N.

In an embodiment, in Formula 2, $X_{21}$ may be C, but embodiments of the present disclosure are not limited thereto.

In Formula 2, ring $CY_2$, may be a $C_5$-$C_{30}$ carbocyclic group or a $C_1$-$C_{30}$ heterocyclic group.

For example, ring $CY_2$, may be selected from a cyclopentene group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-on group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-on group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzooxadiazole group, a benzothiadiazole group, a 5,6,7,8-tetrahydroisoquinoline group, and a 5,6,7,8-tetrahydroquinoline group.

In an embodiment, ring $CY_{21}$ may be selected from i) a first ring, ii) a second ring, iii) a ring in which at least two second rings are condensed with each other, and iv) a ring in which at least one first ring and at least one second rings are condensed with each other.

The first ring may be selected from a cyclopentadiene group, a furan group, a thiophene group, a pyrrole group, a silole group, an oxazole group, an isoxazole group, an oxadiazole group, an isozadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, and a triazasilole group, but embodiments of the present disclosure are not limited thereto.

The second ring may be selected from an adamantane group, a norbornane group, a norbornene group, a cyclohexane group, a cyclohexene group, a benzene group, a pyridine group, a pyrimidine group, a pyrazine group, a pyridazine group, and a triazine group, but embodiments of the present disclosure are not limited thereto.

In an embodiment, $R_1$ to $R_4$, $R_{11}$ to $R_{14}$, and $R_{21}$ may each independently be selected from hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, and —$P(=O)(Q_8)(Q_9)$, wherein $Q_1$ to $Q_9$ are the same as described above.

For example, $R_1$ to $R_4$, $R_{11}$ to $R_{14}$, and $R_{21}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{29}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —$N(Q_1)(Q_2)$, —$Si(Q_3)(Q_4)(Q_5)$, —$B(Q_6)(Q_7)$, and —$P(=O)(Q_8)(Q_9)$, and $Q_1$ to $Q_9$ may each independently be selected from:
—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —CHDCD$_2$H, —CHDCDH$_2$, —CHDCD$_3$, —CD$_2$CD$_3$, —CD$_2$CD$_2$H, and —CD$_2$CDF$_{12}$, an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a C$_1$-C$_{10}$ alkyl group, and a phenyl group, but embodiments of the present disclosure are not limited thereto.

In one or more embodiments, R$_1$ to R$_4$, R$_{11}$ to R$_{14}$, and R$_{21}$ may each independently be selected from hydrogen, deuterium, —F, a cyano group, a nitro group, —SF$_5$, —CH$_3$, —CD$_3$, —CD$_2$H, —CDH$_2$, —CF$_3$, —CF$_2$H, —CFH$_2$, groups represented by Formulae 9-1 to 9-19, and groups represented by Formulae 10-1 to 10-194, but embodiments of the present disclosure are not limited thereto:

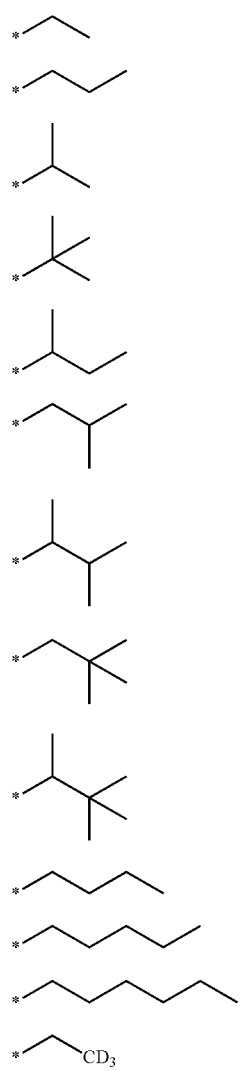
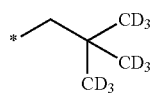
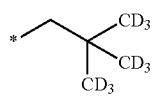
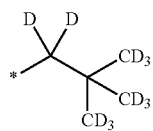
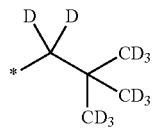
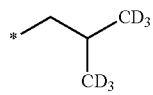
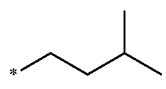
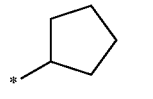
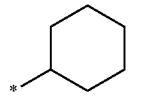
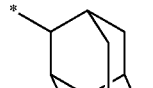
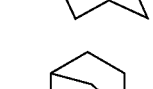
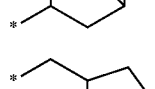
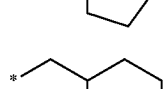
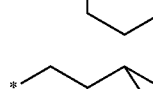

-continued
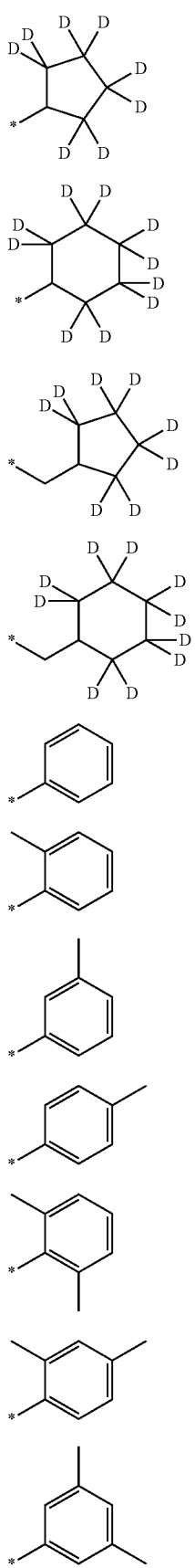
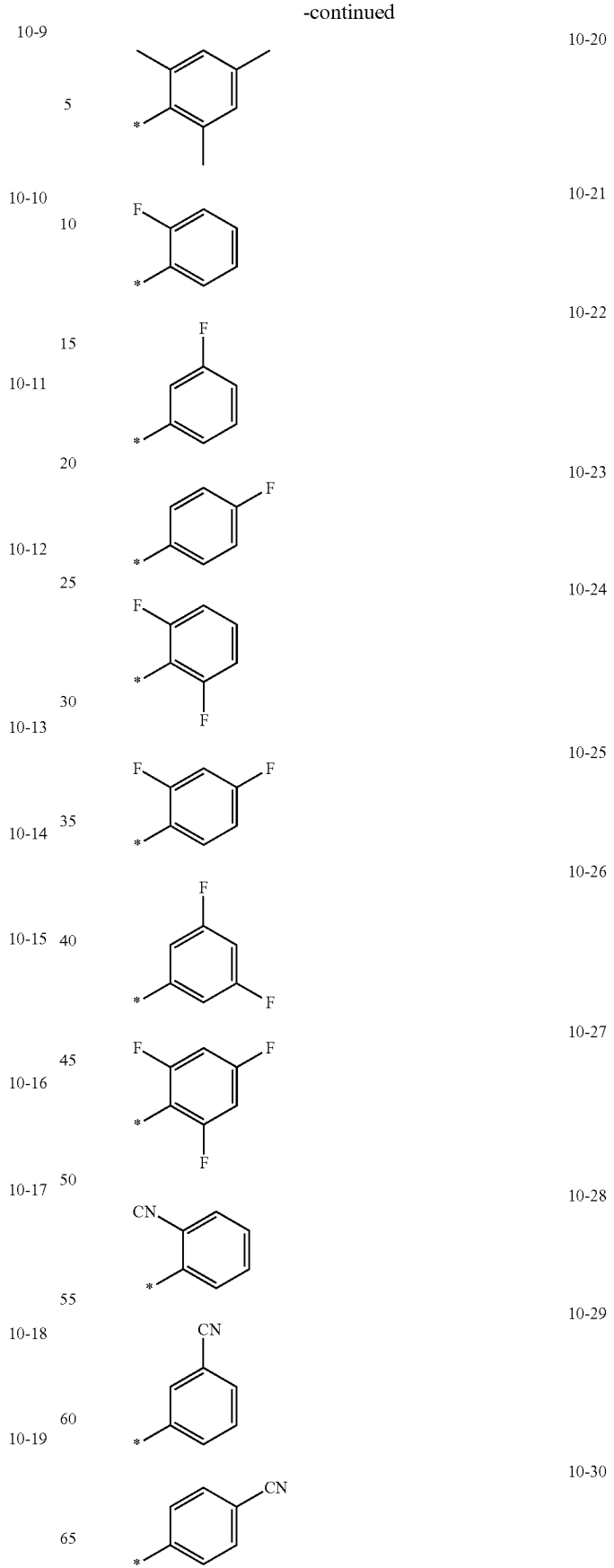

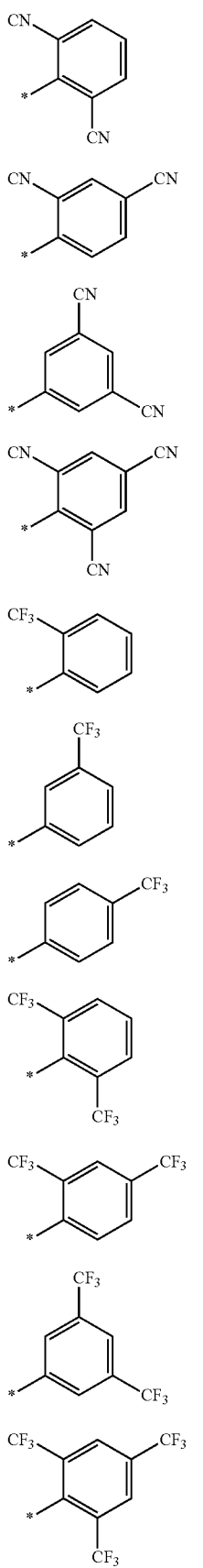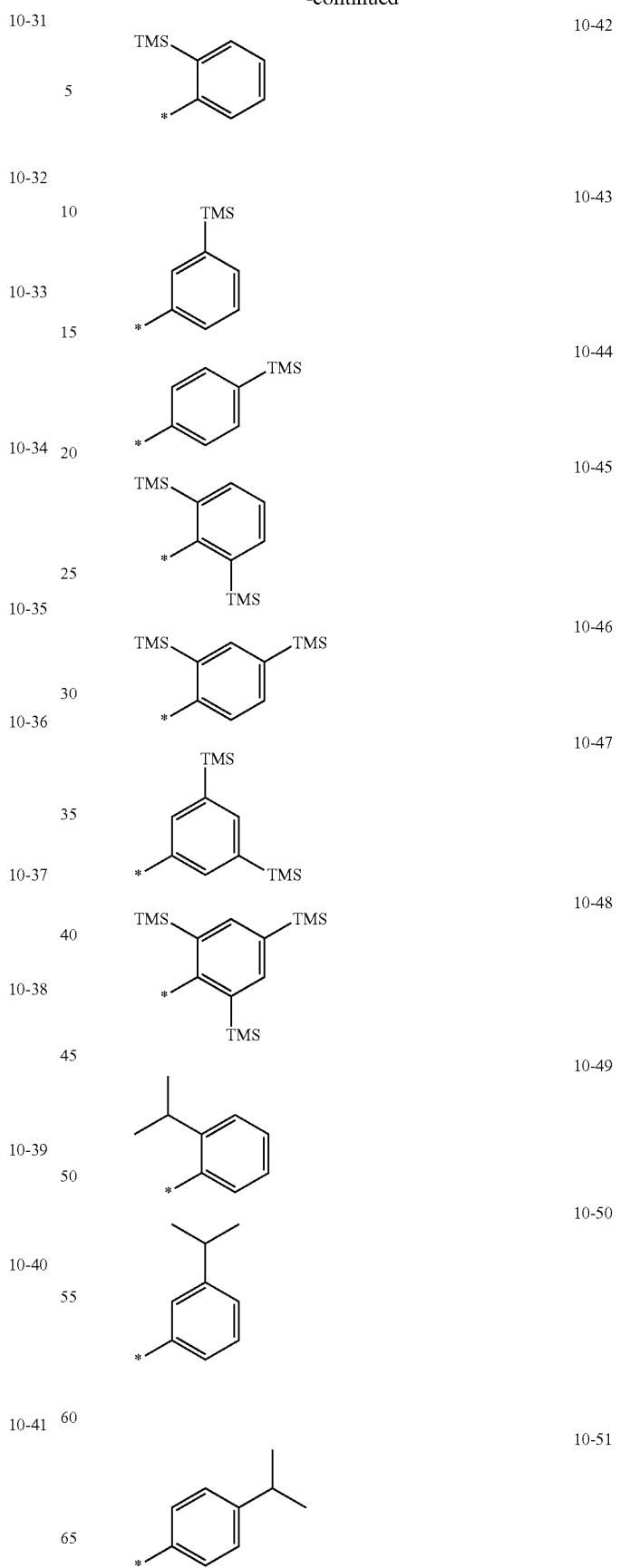

10-52 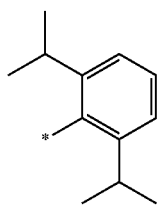
10-53 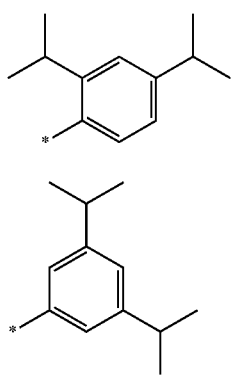
10-54 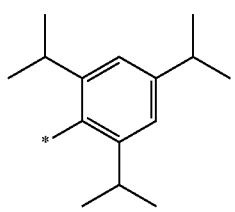
10-55 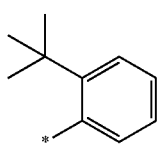
10-56 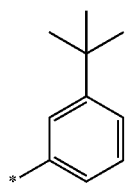
10-57 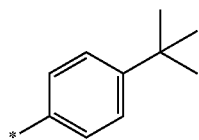
10-58 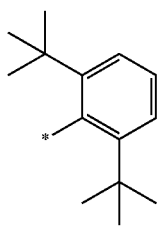
10-59 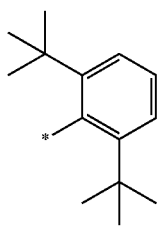
10-60 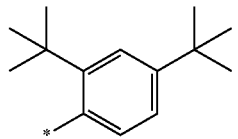
10-61 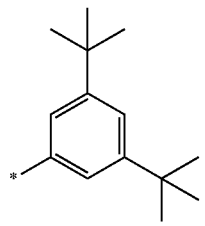
10-62 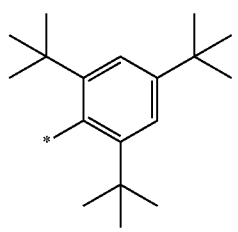
10-63 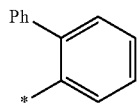
10-64 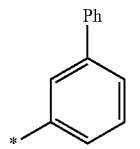
10-65 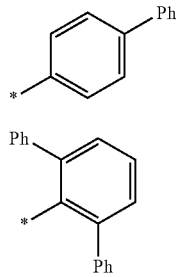
10-66 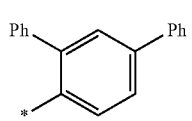
10-67 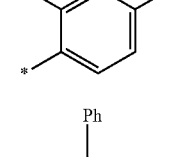
10-68 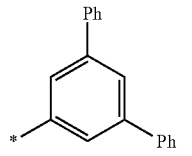
10-69 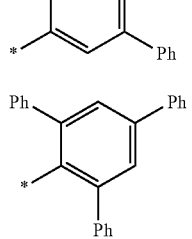

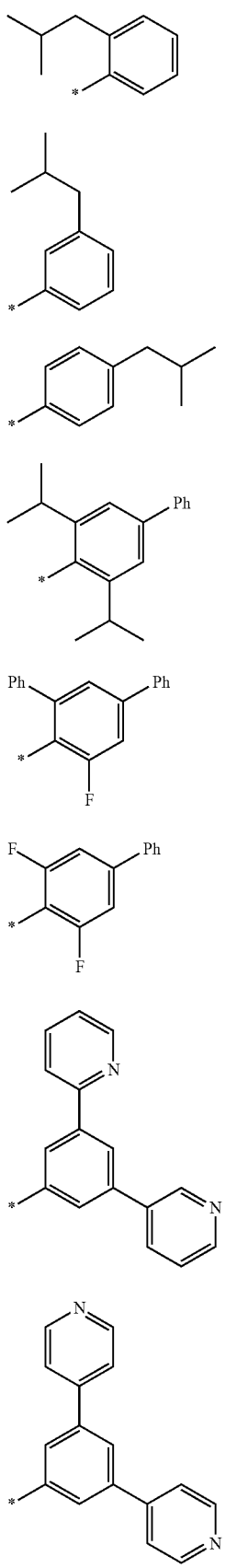
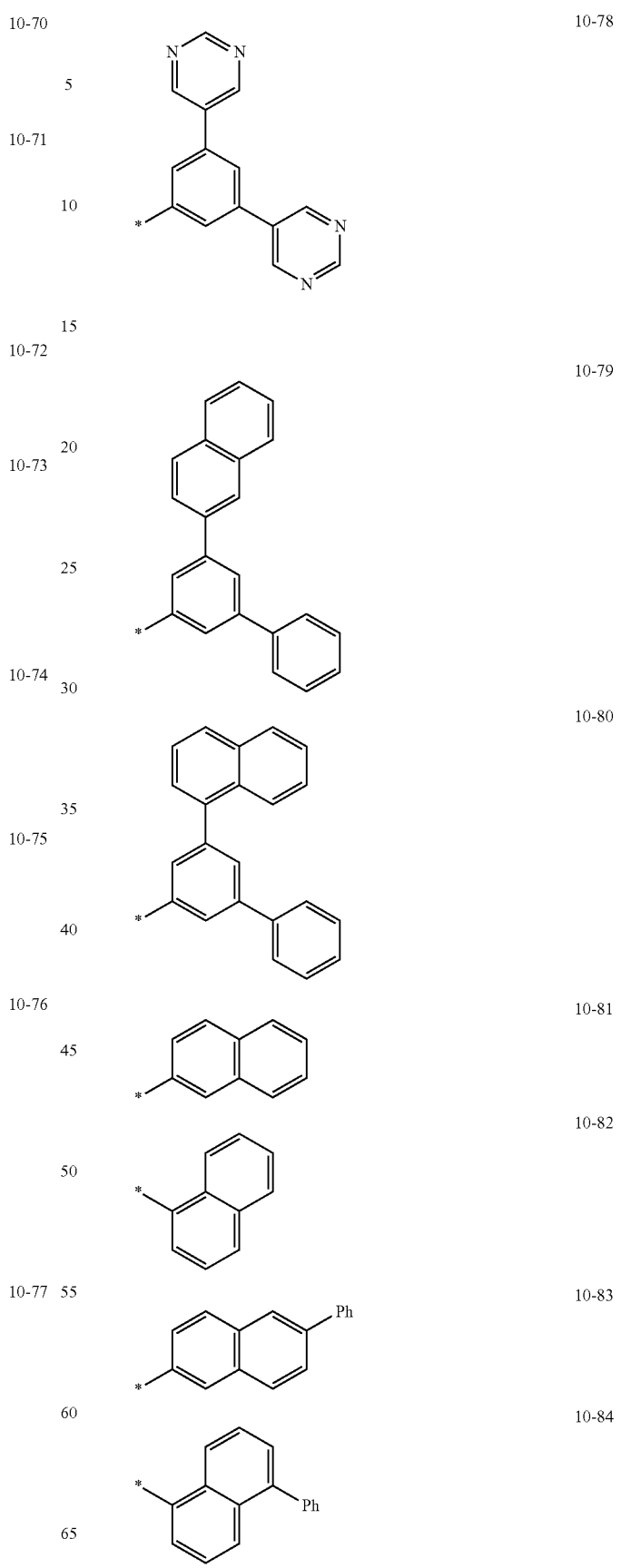

-continued
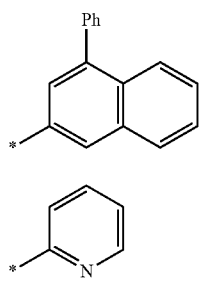
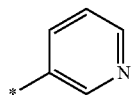  10-85
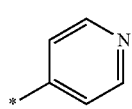  10-86
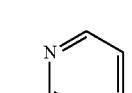  10-87
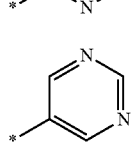  10-88
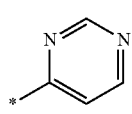  10-89
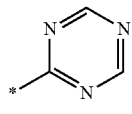  10-90
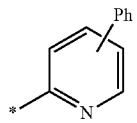  10-91
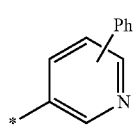  10-92
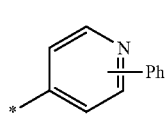  10-93
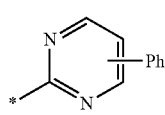  10-94
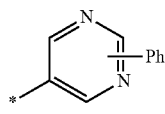  10-95
10-96
10-97
-continued
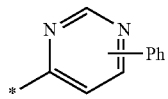  10-98
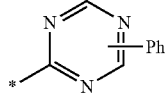  10-99
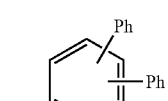  10-100
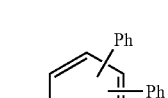  10-101
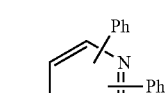  10-102
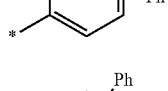  10-103
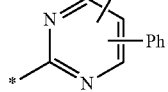  10-104
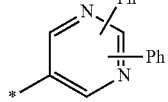  10-105
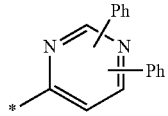  10-106
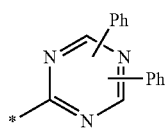  10-107
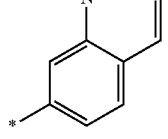  10-108

-continued
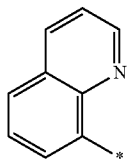
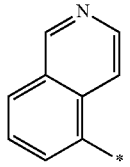
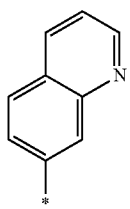
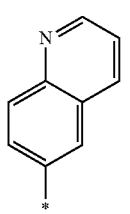
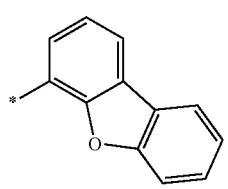
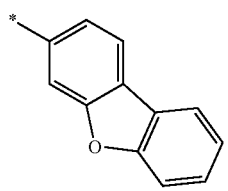
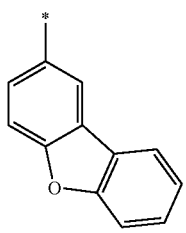
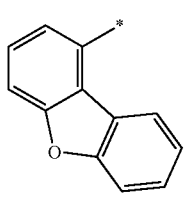
-continued
10-109
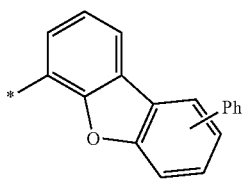 10-117
10-110
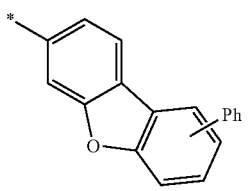 10-118
10-111
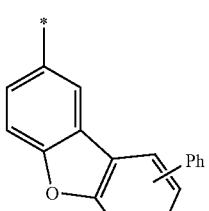 10-119
10-112
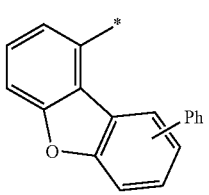 10-120
10-113
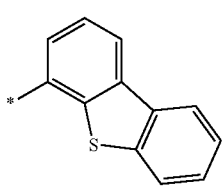 10-121
10-114
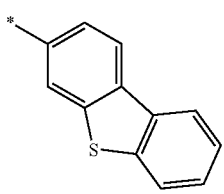 10-122
10-115
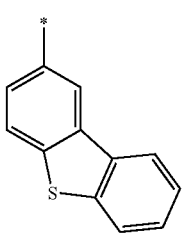 10-123
10-116
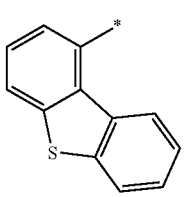 10-124

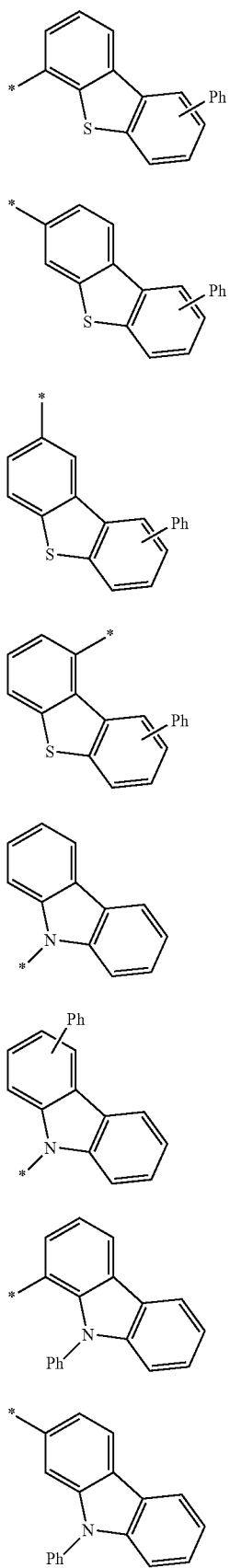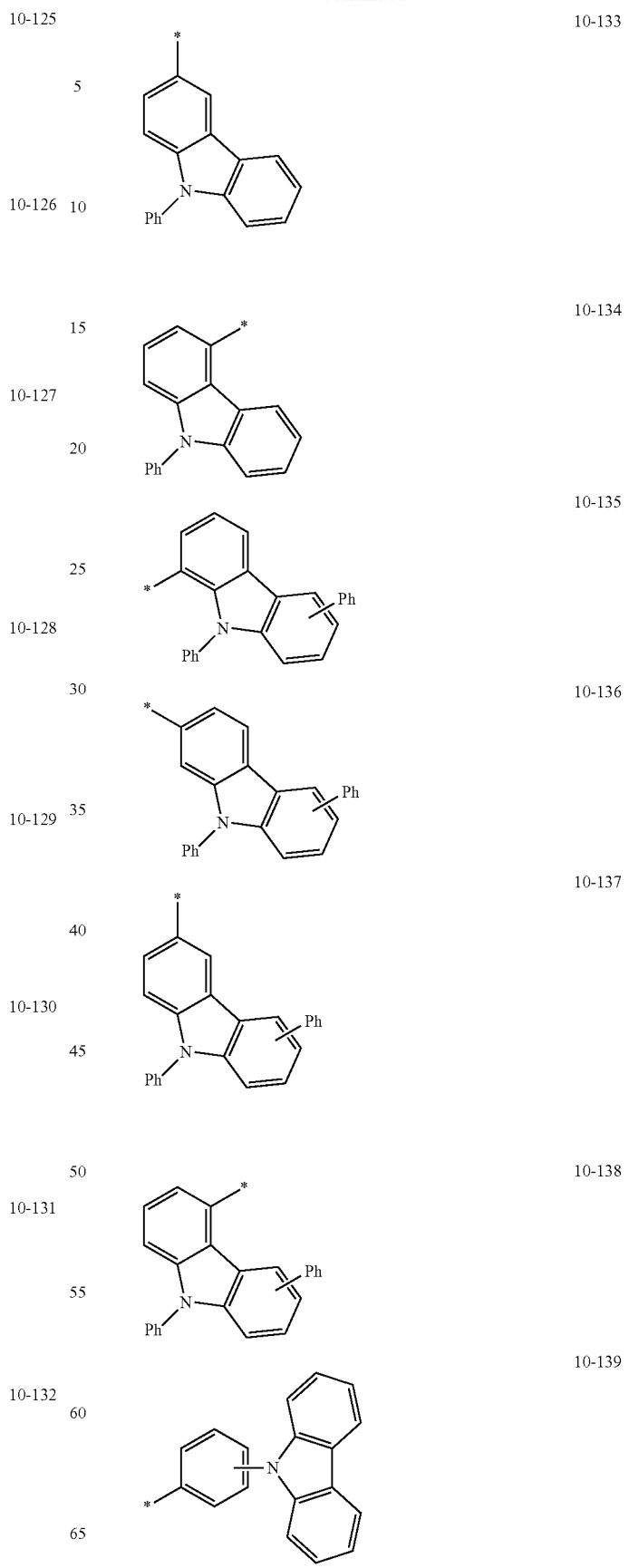

-continued
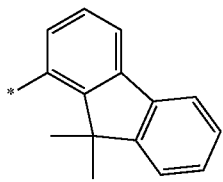
10-140
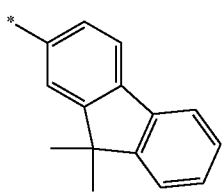
10-141
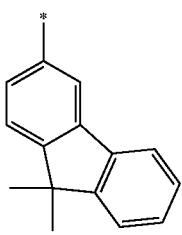
10-142
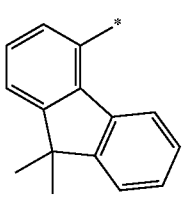
10-143
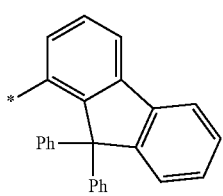
10-144
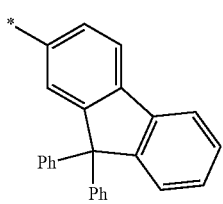
10-145
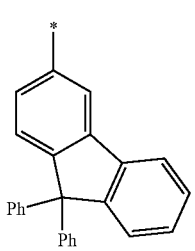
10-146
-continued
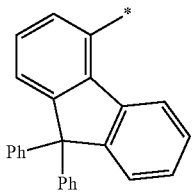
10-147
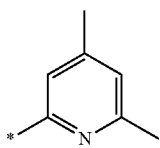
10-148
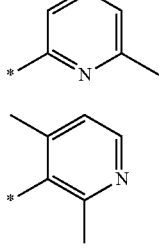
10-149
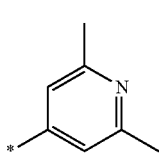
10-150
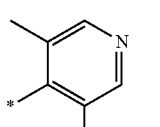
10-151
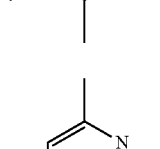
10-152
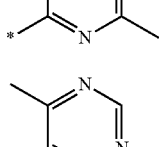
10-153
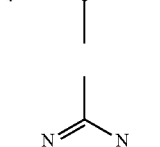
10-154
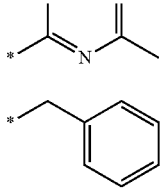
10-155
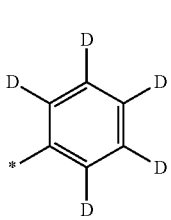
10-156

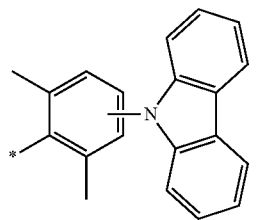
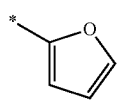
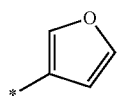
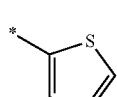
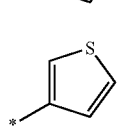
10-157
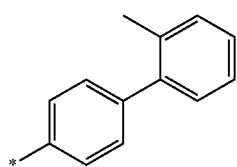
10-158
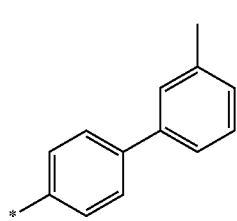
10-159
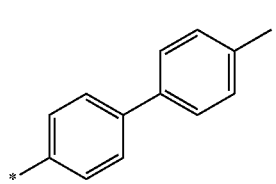
10-160
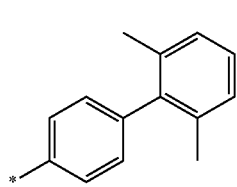
10-161
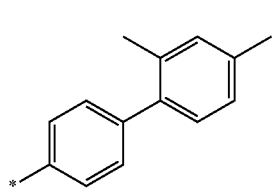
10-162
10-163
10-164
10-165
10-166
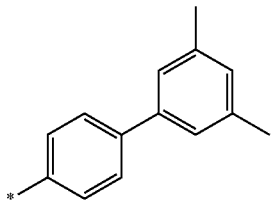
10-167
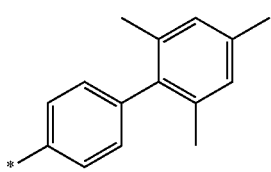
10-168
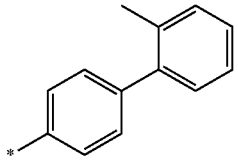
10-169
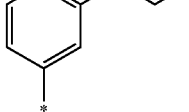
10-170
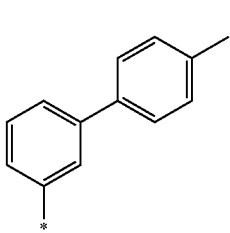
10-171
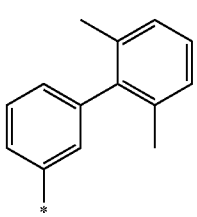
10-172
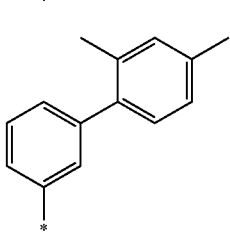
10-173

-continued
10-174 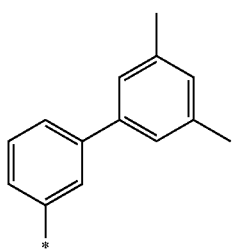
10-175 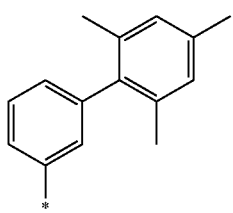
10-176 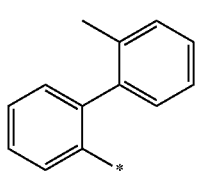
10-177 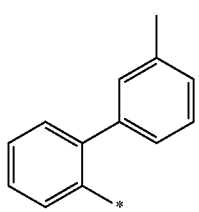
10-178 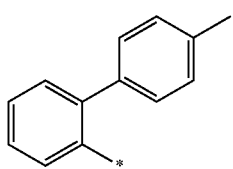
10-179 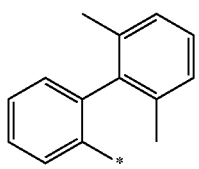
10-180 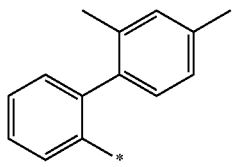
10-181 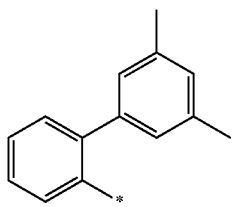
-continued
10-182 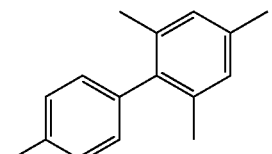
10-183 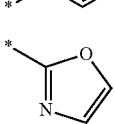
10-184 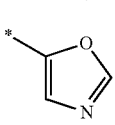
10-185 
10-186 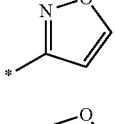
10-187 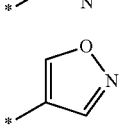
10-188 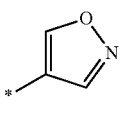
10-189 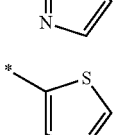
10-190 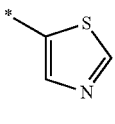
10-191 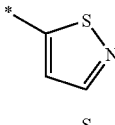
10-192 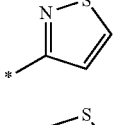
10-193 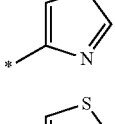
10-194 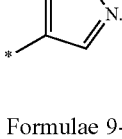
In Formulae 9-1 to 9-19 and Formulae 10-1 to 10-194, * indicates a binding site to a neighboring atom, Ph indicates a phenyl group, and TMS indicates a trimethylsilyl group.
In Formula 2, a21 indicates the number of $R_{21}$, and may be an integer from 0 to 20. When a21 is two or more, two or more of groups $R_{21}$ may be identical to or different from each other. For example, a21 may be 0, 1, 2, 3, 4, 5, or 6.

In an embodiment, at least one of groups $R_{21}$ in the number of a21 in Formula 2 may be a cyano group.

In Formula 2, two of a plurality of neighboring groups $R_{21}$ may optionally be linked to each other to form a $C_5$-$C_{30}$ carbocyclic group unsubstituted or substituted with at least one $R_{20}$ or a $C_1$-$C_{30}$ heterocyclic group unsubstituted or substituted with at least one $R_{20}$. The $C_5$-$C_{30}$ carbocyclic group and the $C_1$-$C_{30}$ heterocyclic group are each defined the same as ring $CY_{21}$, and $R_{20}$ is defined the same as $R_{21}$.

In Formula 2, * and *' each indicate a binding site to M in Formula 1.

In an embodiment, a group represented by

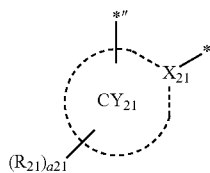

in Formula 2 may be selected from groups represented by Formulae CY21-1 to CY21-25:

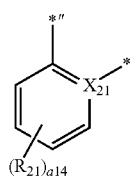
CY21-1

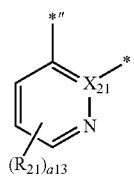
CY21-2

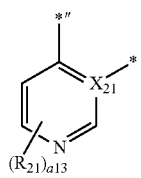
CY21-3

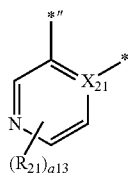
CY21-4

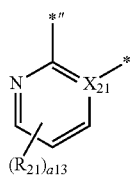
CY21-5

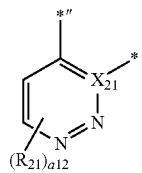
CY21-6

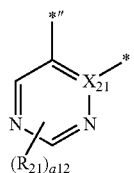
CY21-7

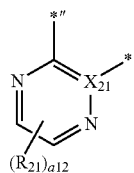
CY21-8

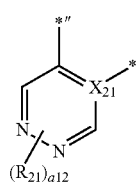
CY21-9

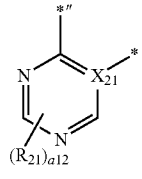
CY21-10

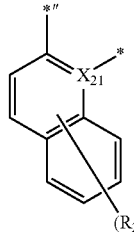
CY21-11

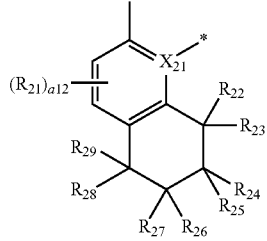
CY21-12

-continued
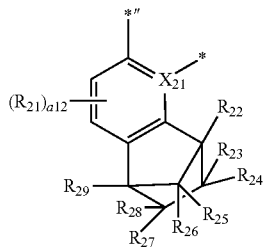
CY21-13
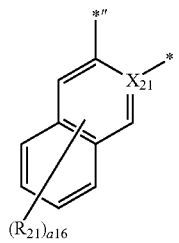
CY21-14
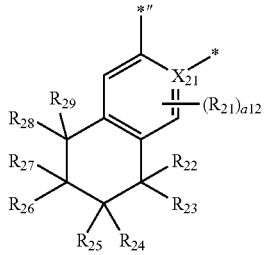
CY21-15
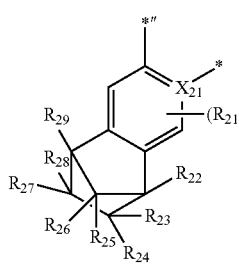
CY21-16
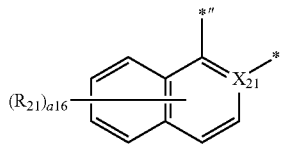
CY21-17
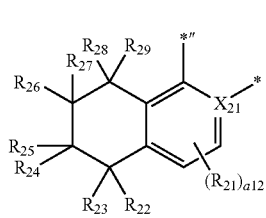
CY21-18
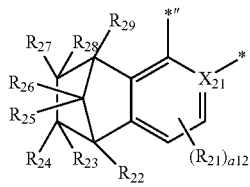
CY21-19
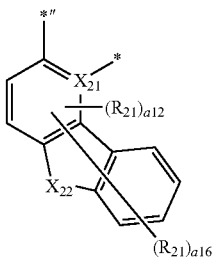
CY21-20
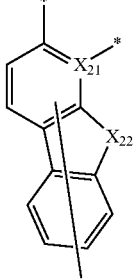
CY21-21
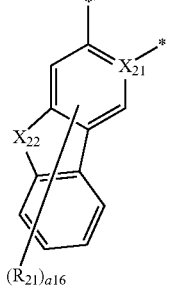
CY21-22
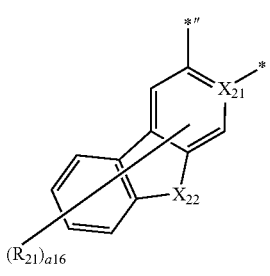
CY21-23
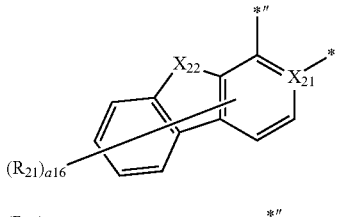
CY21-24
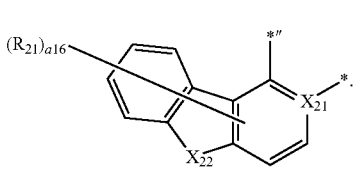
CY21-25
In Formulae CY21-1 to CY21-25,
$X_{21}$ and $R_{21}$ are the same as defined above,
$X_{22}$ may be $C(R_{22})(R_{23})$, $N(R_{22})$, O, S, Se, or $Si(R_{22})(R_{23})$, $R_{22}$ to $R_{29}$ are each defined the same as $R_{21}$, a16 may be an integer from 0 to 6, a14 may be an integer from 0 to 4, a13 may be an integer from 0 to 3, a12 may be an integer from 0 to 2,

*″ indicates a binding site to ring $CY_1$ in Formula 2, and

* indicates a binding site to M in Formula 1.

In one or more embodiments, a group represented by

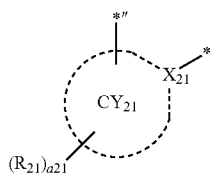

in Formula 2 may be selected from groups represented by Formulae CY21(1) to CY21(56), but embodiments of the present disclosure are not limited thereto:

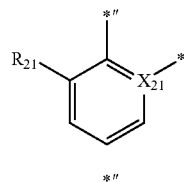
CY21(1)

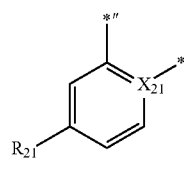
CY21(2)

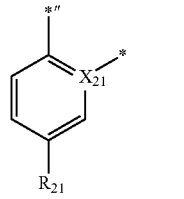
CY21(3)

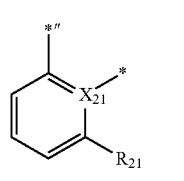
CY21(4)

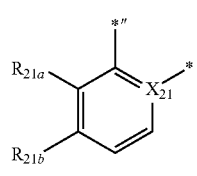
CY21(5)

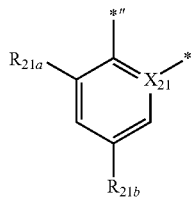
CY21(6)

-continued

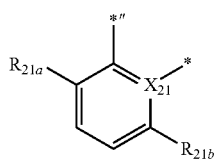
CY21(7)

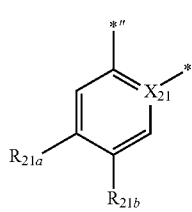
CY21(8)

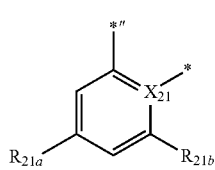
CY21(9)

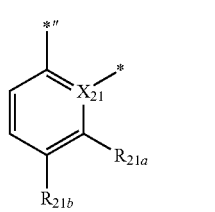
CY21(10)

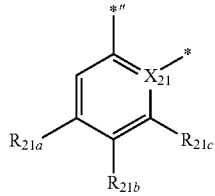
CY21(11)

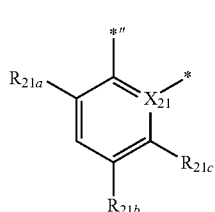
CY21(12)

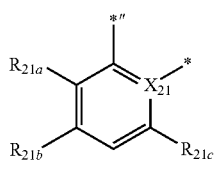
CY21(13)

CY21(14)

-continued
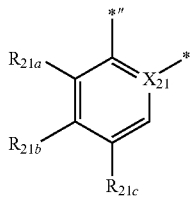
CY21(15)
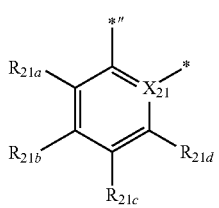
CY21(16)
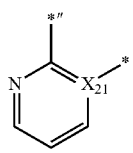
CY21(17)
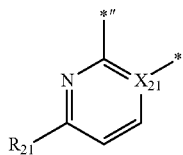
CY21(18)
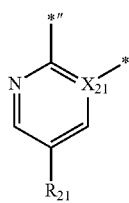
CY21(19)
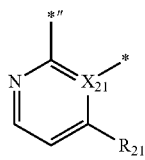
CY21(20)
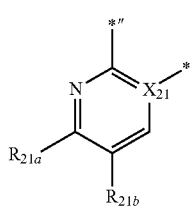
CY21(21)
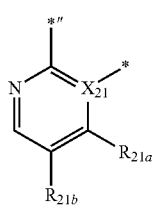
CY21(22)
-continued
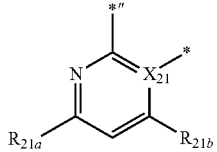
CY21(23)
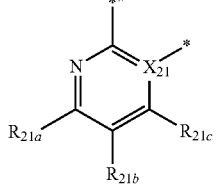
CY21(24)
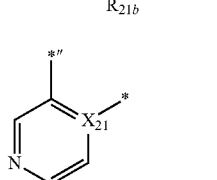
CY21(25)
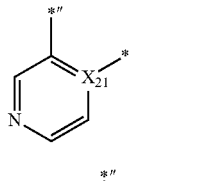
CY21(26)
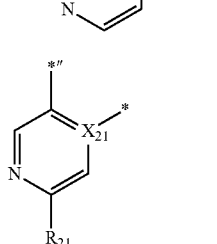
CY21(27)
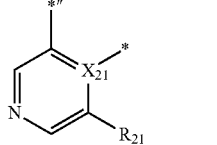
CY21(28)
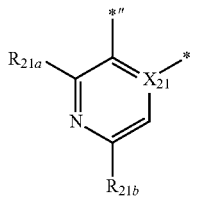
CY21(29)
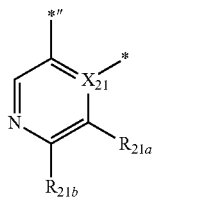
CY21(30)
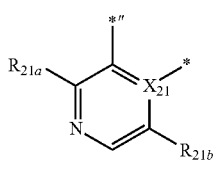
CY21(31)

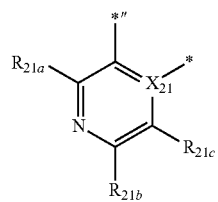
CY21(32)
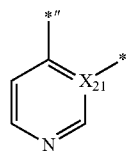
CY21(33)
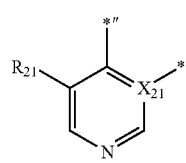
CY21(34)
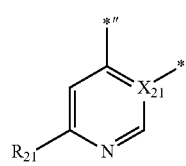
CY21(35)
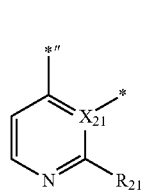
CY21(36)
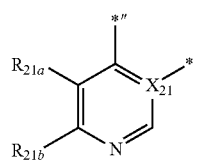
CY21(37)
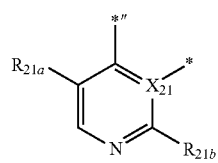
CY21(38)
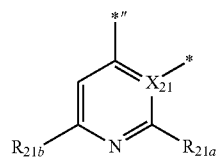
CY21(39)
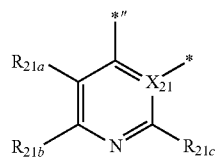
CY21(40)
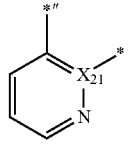
CY21(41)
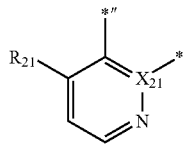
CY21(42)
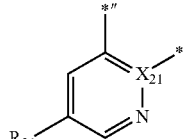
CY21(43)
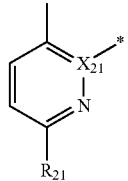
CY21(44)
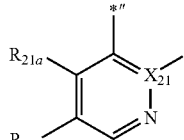
CY21(45)
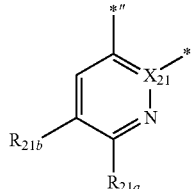
CY21(46)
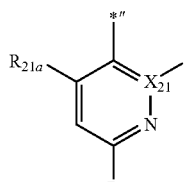
CY21(47)
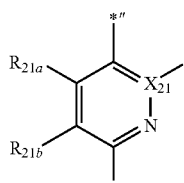
CY21(48)
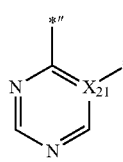
CY21(49)

CY21(50)
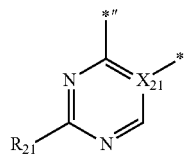
CY21(51)
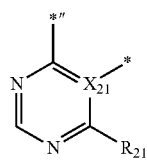
CY21(52)
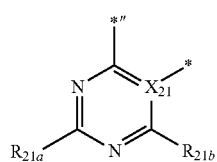
CY21(53)
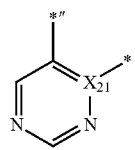
CY21(54)
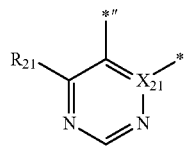
CY21(55)
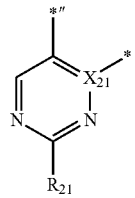
CY21(56)
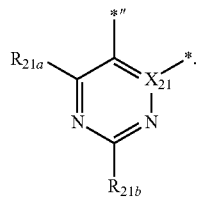
In Formulae CY21(1) to CY21(56),
$X_{21}$ and $R_{21}$ are the same as defined above,
$R_{21a}$ to $R_{21d}$ are defined the same as $R_{21}$, but $R_{21}$ and $R_{21a}$ to $R_{21d}$ are not each hydrogen,
*''' indicates a binding site to ring $CY_1$ in Formula 2, and
* indicates a binding site to M in Formula 1.
In one or more embodiments, $L_1$ in Formula 1 may be selected from groups represented by Formulae 2-1 to 2-6:
2-1
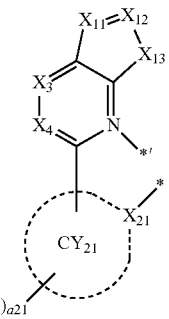
2-2
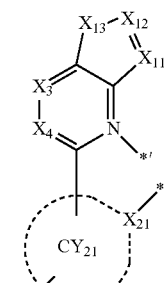
2-3
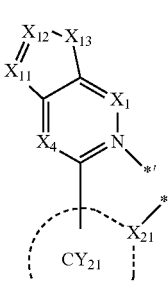
2-4
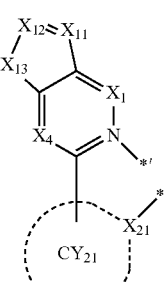
2-5
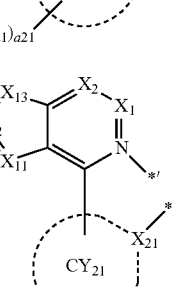

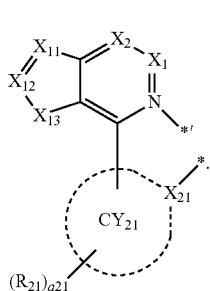

2-6

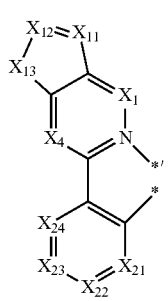

2(4)

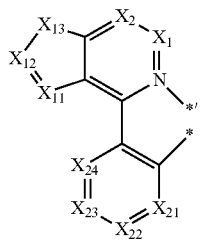

2(5)

In Formulae 2-1 to 2-6, $X_1$ to $X_4$, $X_{11}$ to $X_{13}$, ring $CY_{21}$, $R_{21}$, a21, *, and *' are each the same as defined above, wherein, when $X_{13}$ in Formulae 2-3 and 2-4 is $N(R_{13})$, at least one of $X_{11}$ and $X_{12}$ in Formulae 2-3 and 2-4 may be N.

In one or more embodiments, $L_1$ in Formula 1 may be selected from groups represented by Formulae 2(1) to 2(6):

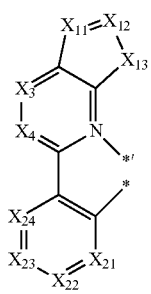

2(1)

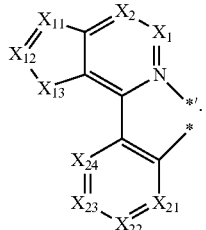

2(6)

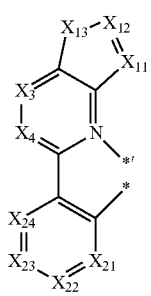

2(2)

In Formulae 2-1 to 2-6, $X_1$ to $X_4$, $X_{11}$ to $X_{13}$, *, and *' are each the same as defined above, wherein, when $X_{13}$ in Formulae 2-3 and 2-4 is $N(R_{13})$, at least one of $X_{11}$ and $X_{12}$ in Formulae 2-3 and 2-4 may be N, $X_{21}$ may be N or $C(R_{21})$, $X_{22}$ may be N or $C(R_{22})$, $X_{23}$ may be N or $C(R_{23})$, $X_{24}$ may be N or $C(R_{24})$, $R_{21}$ to $R_{24}$ are each defined the same as $R_{21}$, two neighboring groups selected from $R_{21}$ to $R_{24}$ may optionally be linked to each other to form a $C_5$-$C_{30}$ carbocyclic group unsubstituted or substituted with at least one $R_{20}$ or a $C_1$-$C_{30}$ heterocyclic group unsubstituted or substituted with at least one $R_{20}$, wherein $R_{20}$ is defined the same as $R_{21}$.

In an embodiment, in Formulae 2(1) to 2(6), $X_{23}$ may be C(CN), but embodiments of the present disclosure are not limited thereto.

In Formula 1, $L_2$ and $L_3$ may each independently be a monodentate ligand, and may be selected from, for example, I⁻, Br⁻, Cl⁻, sulfide, nitrate, azide, hydroxide, cyanate, isocyanate, thiocyanate, water, acetonitrile, pyridine, ammonia, carbon monoxide, $P(Ph)_3$, $P(Ph)_2CH_3$, $PPh(CH_3)_2$, and $P(CH_3)_3$, but embodiments of the present disclosure are not limited thereto.

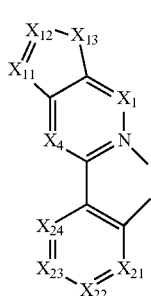

2(3)

In an embodiment, in Formula 1, $L_2$ and $L_3$ may each independently be a bidentate ligand, and may be selected from, for example, oxalate, acetylacetonate, picolinic acid, 1,2-bis(diphenylphosphino)ethane, 1,1-bis(diphenylphosphino)methane, glycinate, and ethylenediamine, but embodiments of the present disclosure are not limited thereto.

In an embodiment, in Formula 1, $L_2$ and $L_3$ may each independently be selected from groups represented by Formulae 3A to 3F:

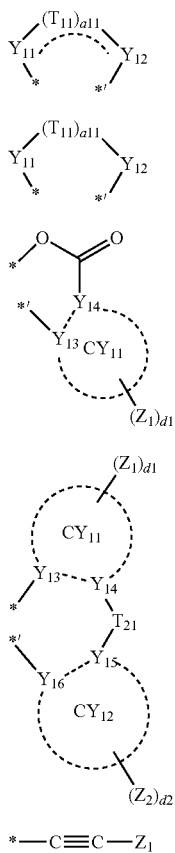

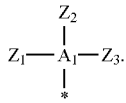

In Formulae 3A to 3F, $Y_{11}$ may be selected from O, N, $N(Z_1)$, $P(Z_1)(Z_2)$, and $As(Z_1)(Z_2)$, $Y_{12}$ may be selected from O, N, $N(Z_3)$, $P(Z_3)(Z_4)$, and $As(Z_3)(Z_4)$, $T_{11}$ may be selected from a single bond, a double bond, *—$C(Z_{11})(Z_{12})$—*', *—$C(Z_{11})$=$C(Z_{12})$—*', *=$C(Z_{11})$—*', *—$C(Z_{11})$=*', *=$C(Z_{11})$—$C(Z_{12})$=$C(Z_{13})$—*', *—$C(Z_{11})$=$C(Z_{12})$—$C(Z_{13})$=*', *—$N(Z_{11})$—*', and a $C_5$-$C_{30}$ carbocyclic group unsubstituted or substituted with at least one $Z_{11}$, a11 may be an integer from 1 to 10, $Y_{13}$ to $Y_{16}$ may each independently be C or N, $T_{21}$ may be a single bond, a double bond, O, S, $C(Z_{11})(Z_{12})$, $Si(Z_{11})(Z_{12})$, or $N(Z_{11})$, ring $CY_{11}$ and ring $CY_{12}$ may each independently be selected from a $C_5$-$C_{30}$ carbocyclic group and a $C_1$-$C_{30}$ heterocyclic group, $A_1$ may be P or As, $Z_1$ to $Z_4$ and $Z_{11}$ to $Z_{13}$ are each defined the same as $R_{21}$, d1 and d2 are each independently an integer from 0 to 10, and

* and *' each indicate a binding site to M in Formula 1.

Ring $CY_{11}$ and ring $CY_{12}$ are each defined the same as ring $CY_{21}$.

In an embodiment, in Formula 1, $L_2$ and $L_3$ may each independently be selected from groups Formulae 3-1 to 3-125, but embodiments of the present disclosure are not limited thereto:

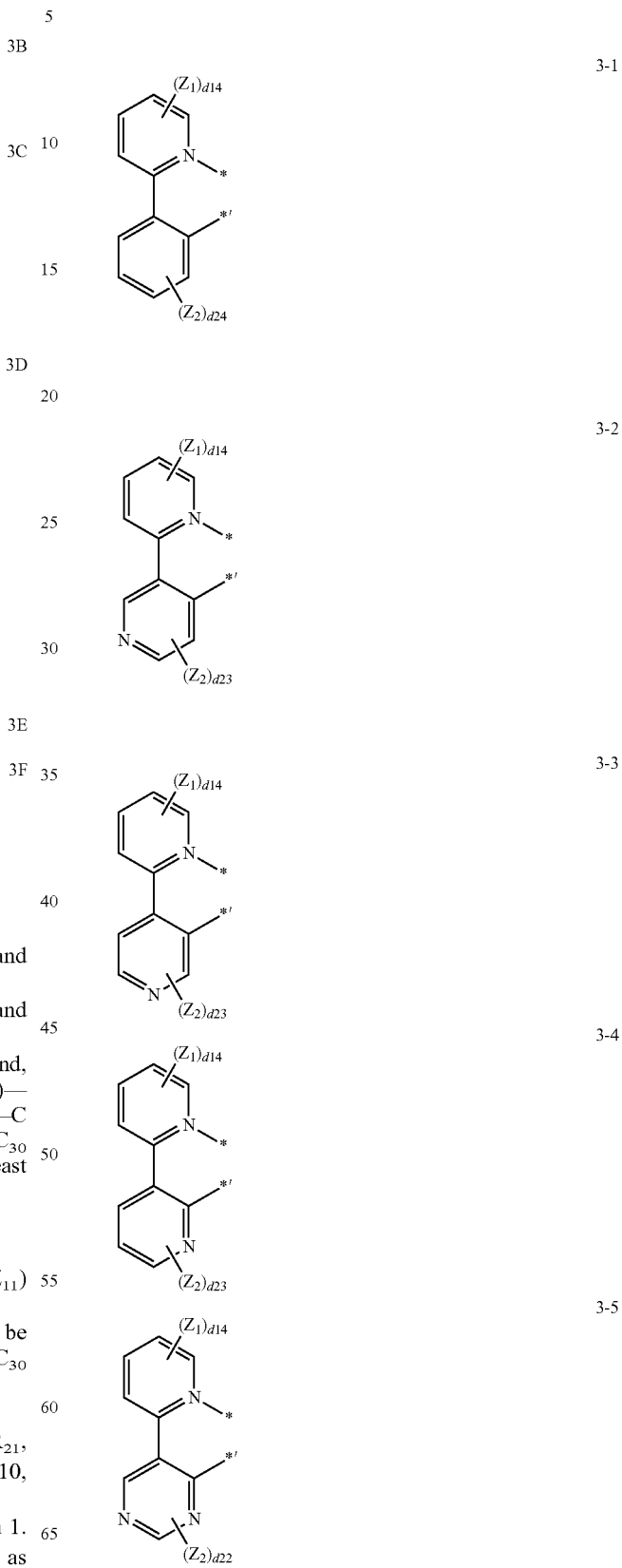

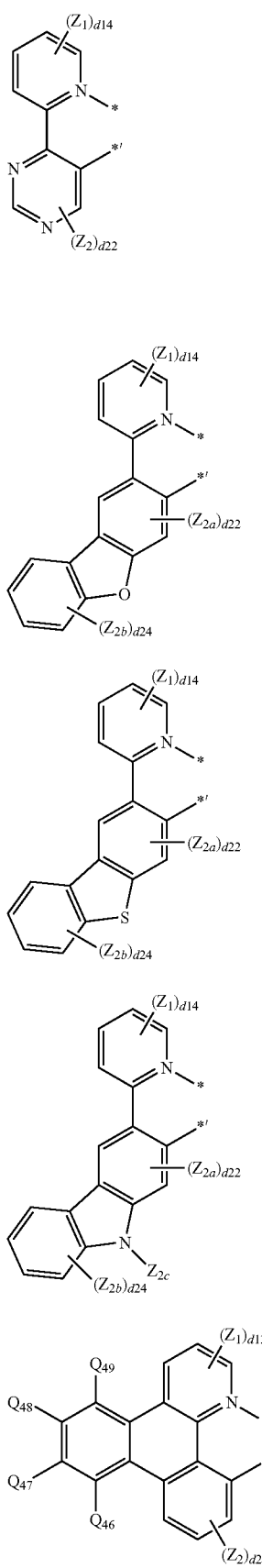

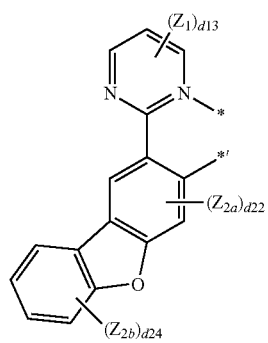
3-17
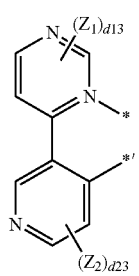
3-22
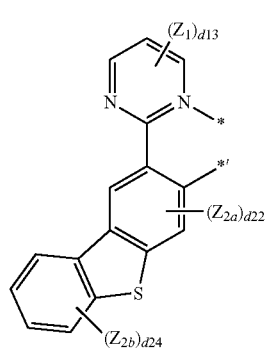
3-18
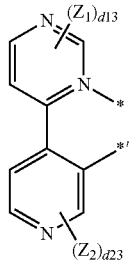
3-23
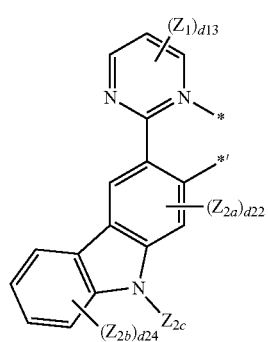
3-19
3-24
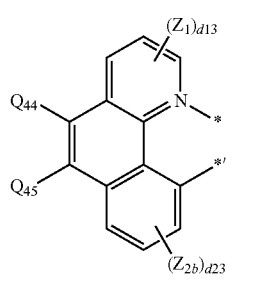
3-20
3-25
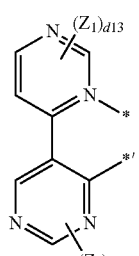
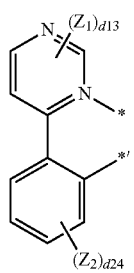
3-21
3-26
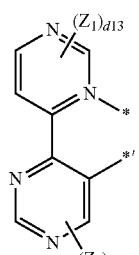

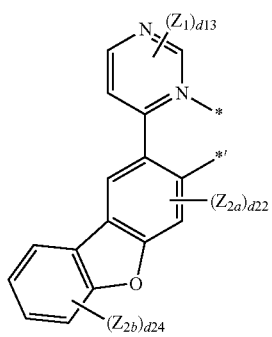 3-27
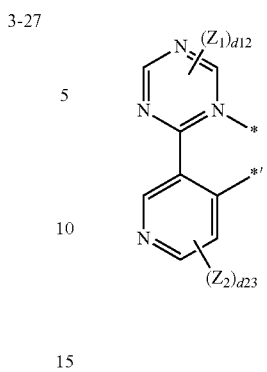 3-32
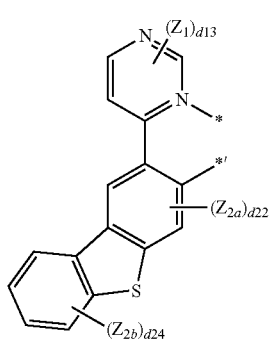 3-28
 3-33
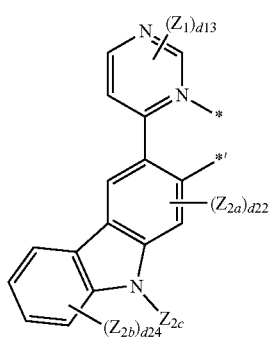 3-29
3-34
3-30
3-35
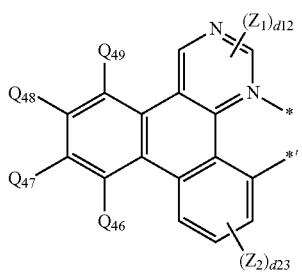
3-31
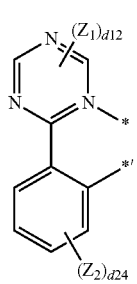
3-36

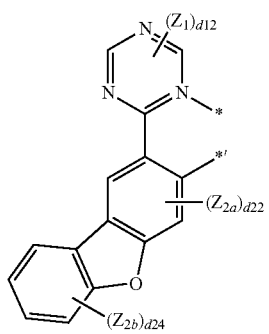
3-37
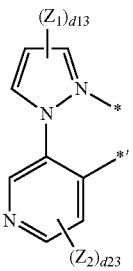
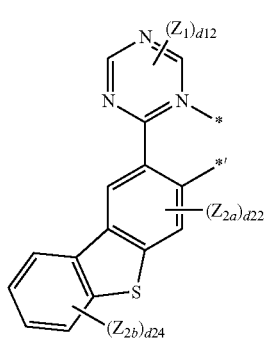
3-38
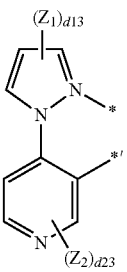
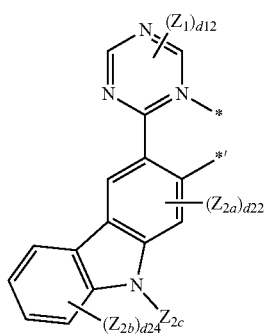
3-39
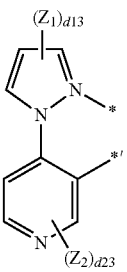
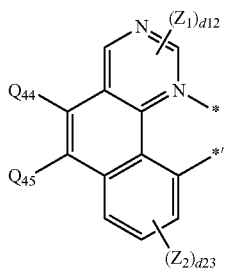
3-40
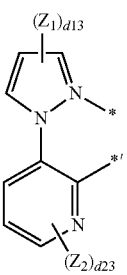
3-41
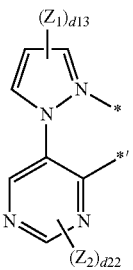
3-42
3-43
3-44
3-45
3-46
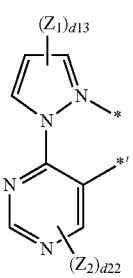

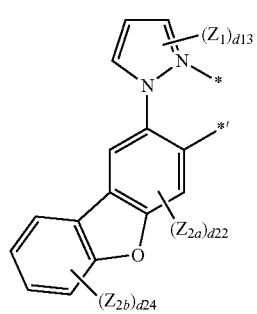
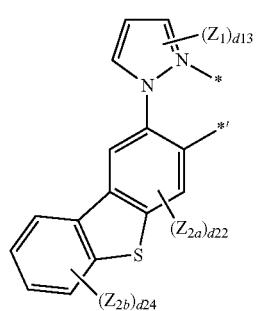
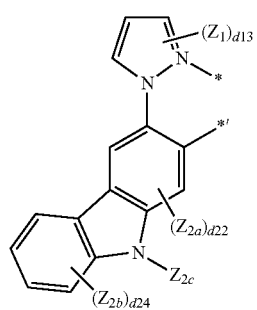
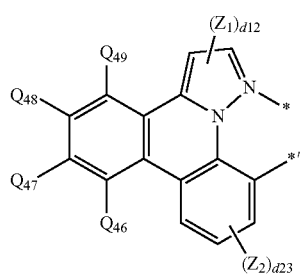
3-50
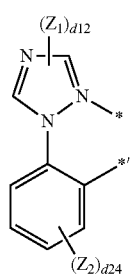
3-51
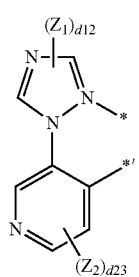
3-47
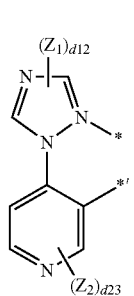
3-48
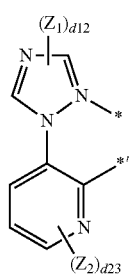
3-49
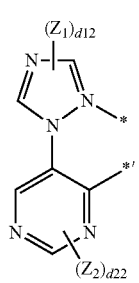
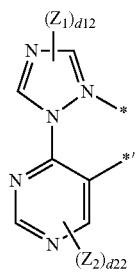
3-52
3-53
3-54
3-55
3-56

-continued
3-57
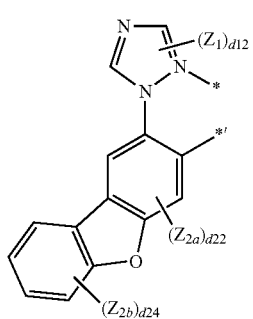
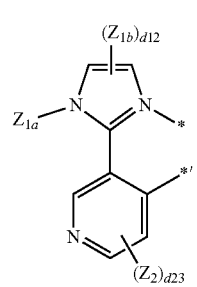
3-58
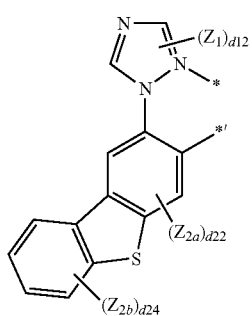
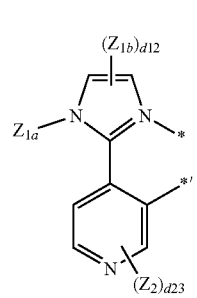
3-59
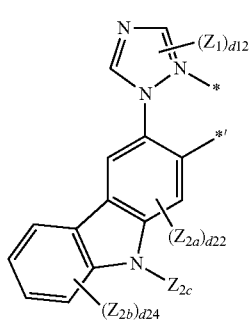
3-60
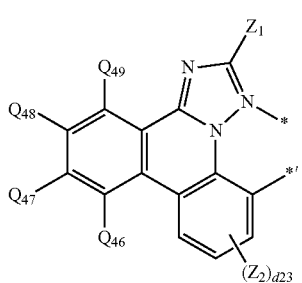
3-61
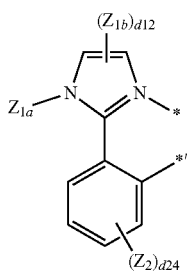
-continued
3-62
3-63
3-64
3-65
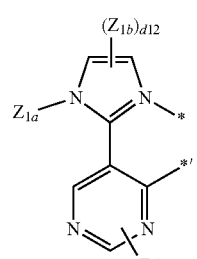
3-66
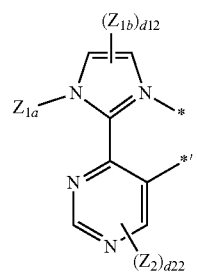

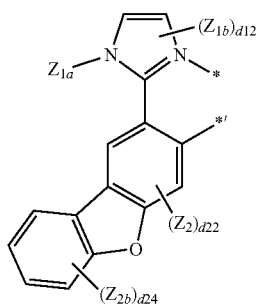
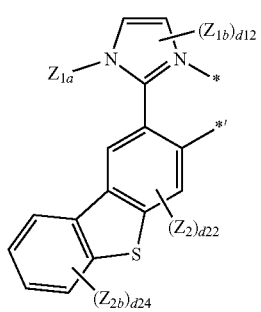
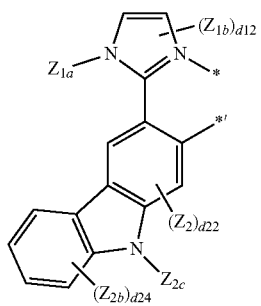
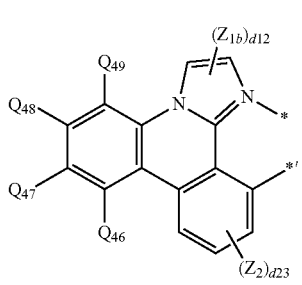
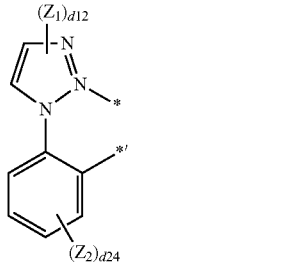
3-67
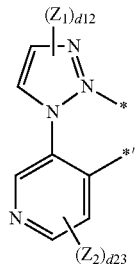
3-68
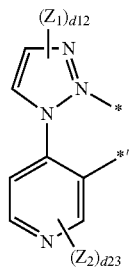
3-69
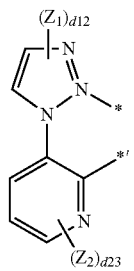
3-70
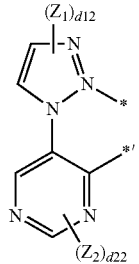
3-71
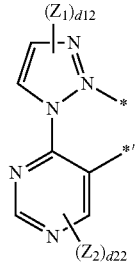
3-72
3-73
3-74
3-75
3-76

3-77

3-78

3-79

3-80

3-81

3-82

3-83

3-84

3-85

3-86

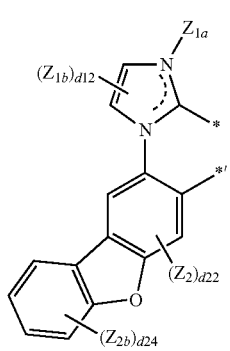
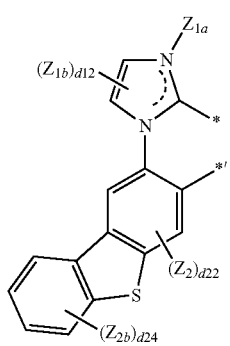
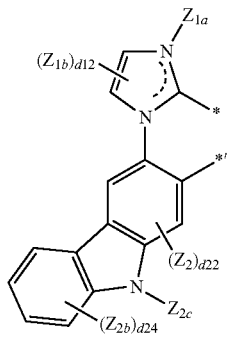
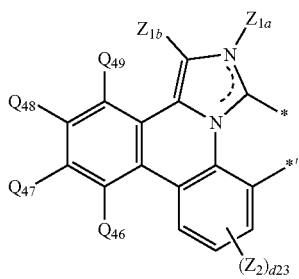
3-87
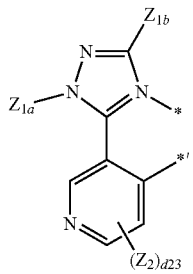
3-88
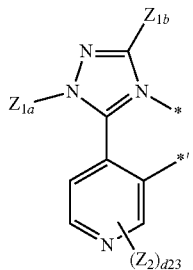
3-89
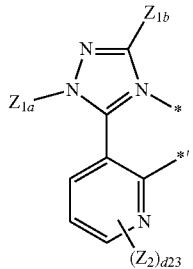
3-90
3-91
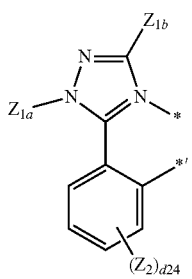
3-92
3-93
3-94
3-95
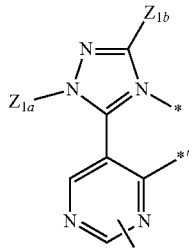
3-96
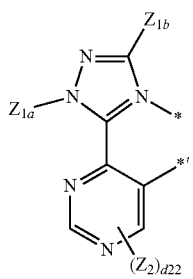

| | |
|---|---|
| 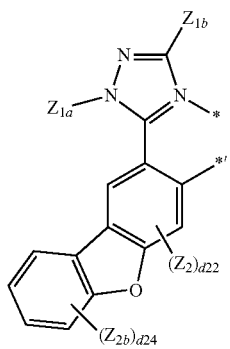 | 3-97 |
| 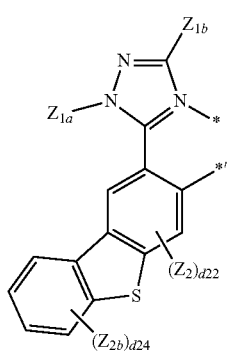 | 3-98 |
| 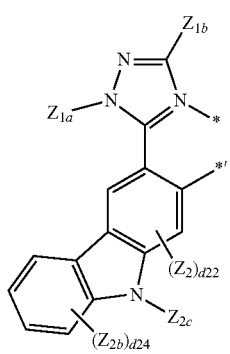 | 3-99 |
| 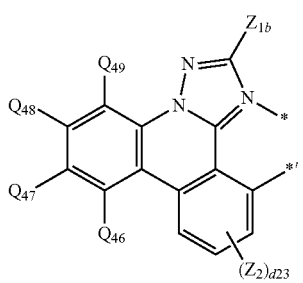 | 3-100 |
| 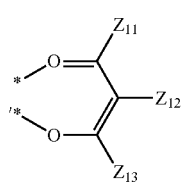 | 3-111 |
| 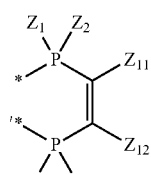 | 3-112 |
| 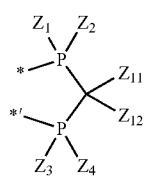 | 3-113 |
| 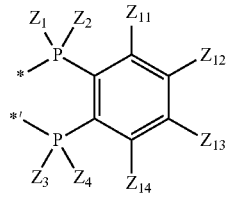 | 3-114 |
| 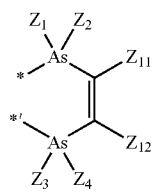 | 3-115 |
| 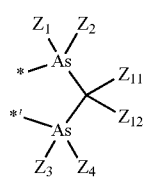 | 3-116 |
| 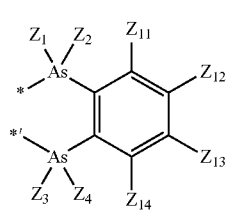 | 3-117 |
| 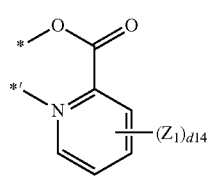 | 3-118 |
| 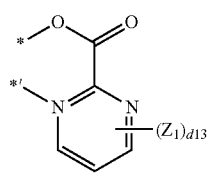 | 3-119 |

-continued

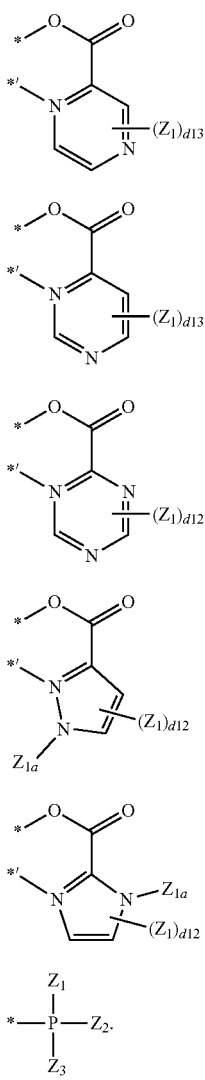

3-120

3-121

3-122

3-123

3-124

3-125

In Formulae 3-1 to 3-125, $Z_1$ to $Z_4$, $Z_{1a}$, $Z_{1b}$, $Z_{2a}$ to $Z_{2c}$, and $Z_{11}$ to $Z_{14}$ are each defined the same as $R_{21}$, d14 and d24 may each independently be an integer from 0 to 4, d13 and d23 may each independently be an integer from 0 to 3, d12 and d22 may each independently be an integer from 0 to 2, and

* and *' each indicate a binding site to M in Formula 1.

The organometallic compound represented by Formula 1 may emit blue light, for example, deep blue light having a maximum emission wavelength (a peak emission wavelength) in a range from 440 nanometers (nm) to 480 nm (or from 450 nm to 475 nm) (in terms of an actual measurement value).

The organometallic compound represented by Formula 1 may be, for example, one selected from Compounds 1 to 38, but embodiments of the present disclosure are not limited thereto:

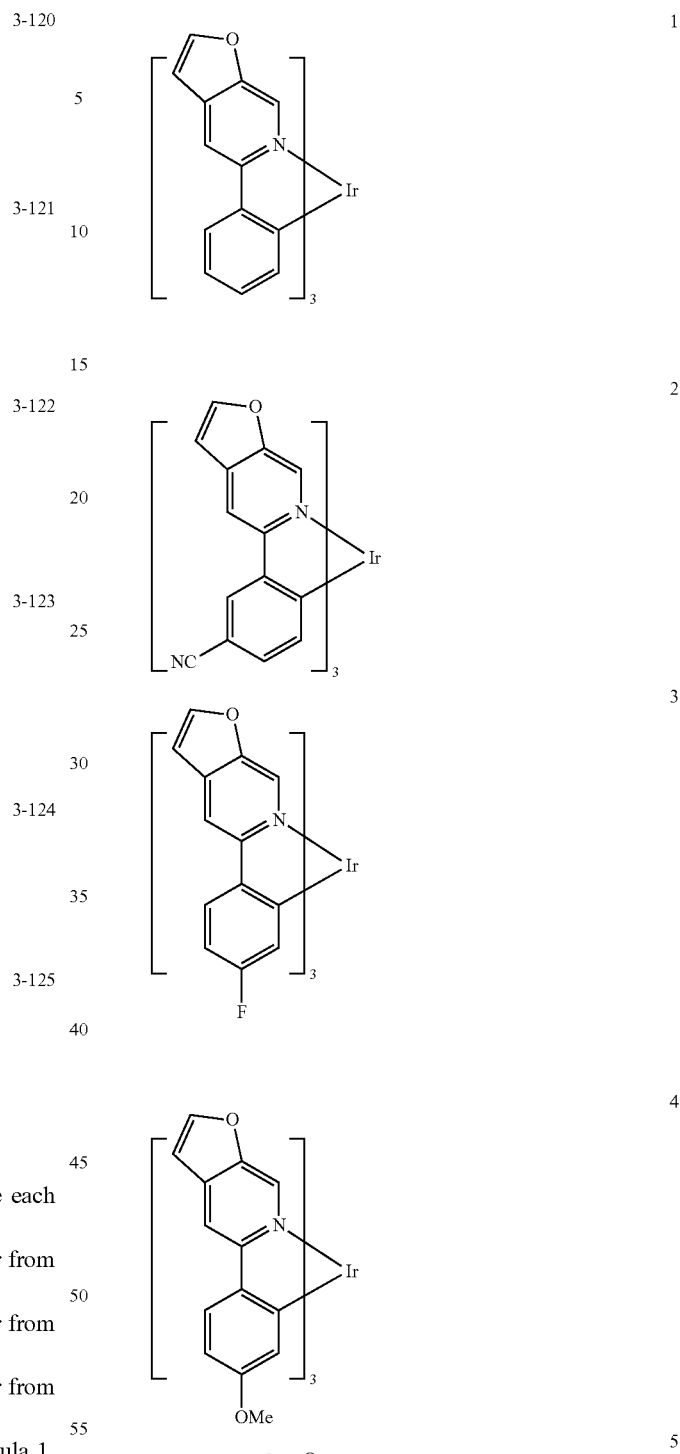

1

2

3

4

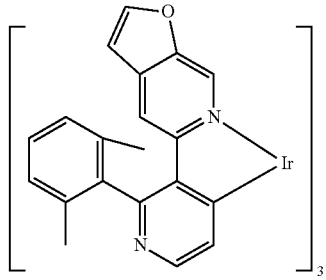

5

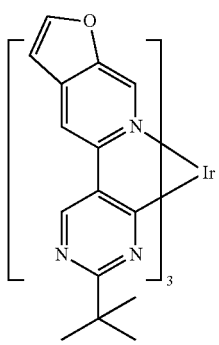
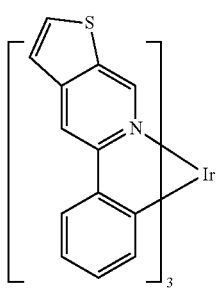
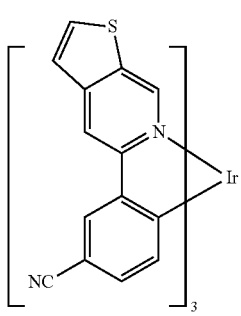
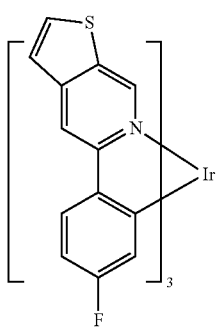
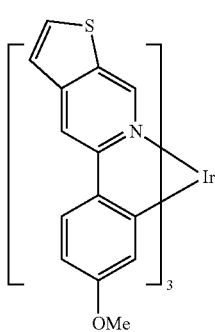
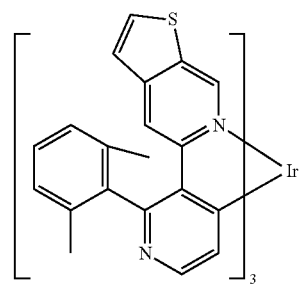
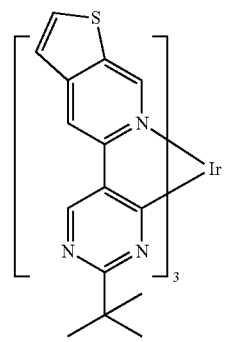
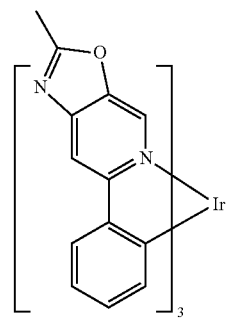
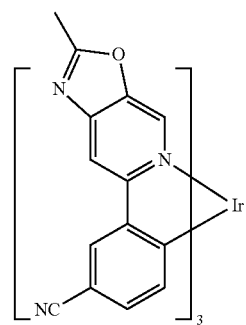
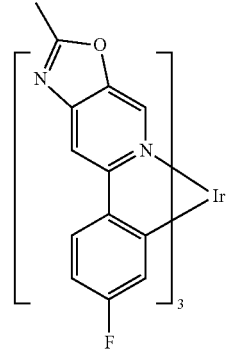

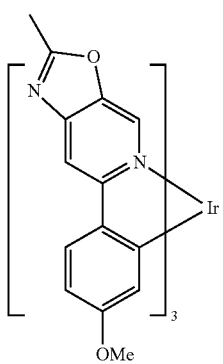
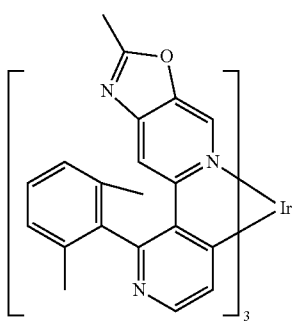
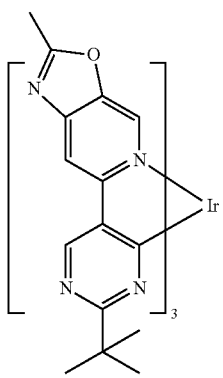
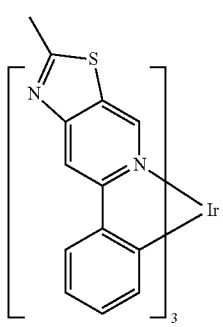
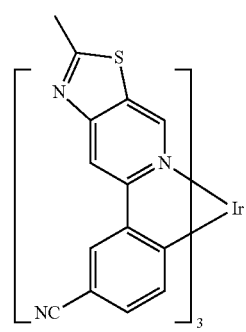
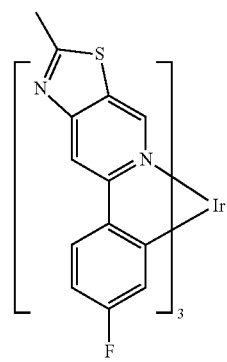
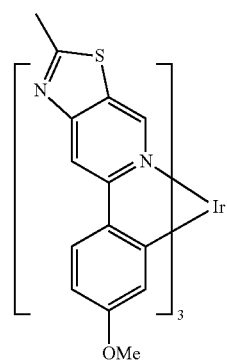
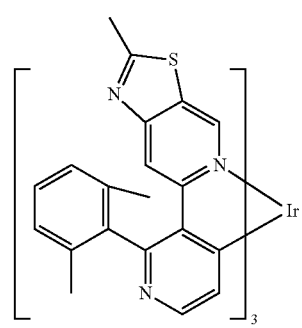

-continued
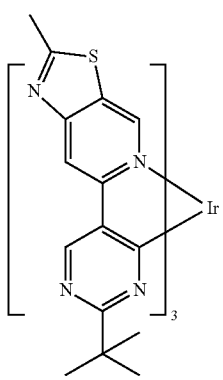
24
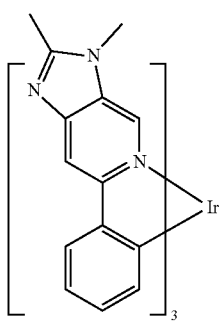
25
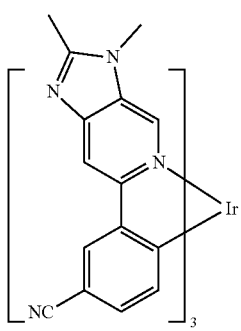
26
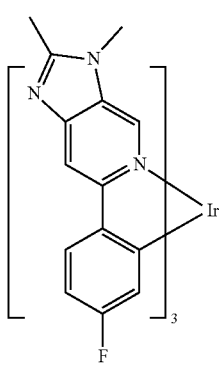
27
-continued
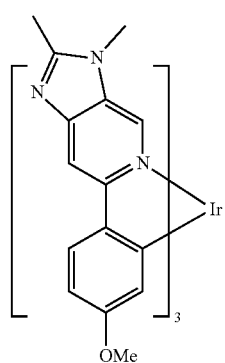
28
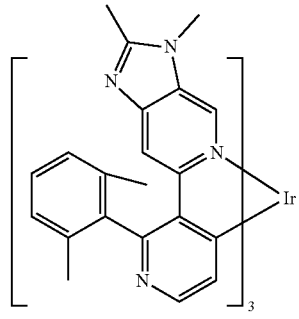
29
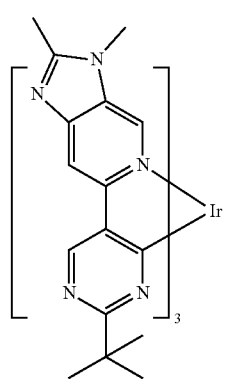
30
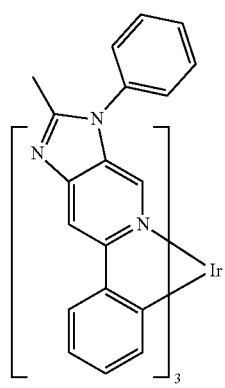
31

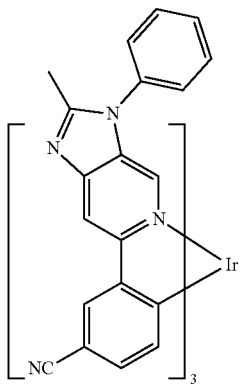

32

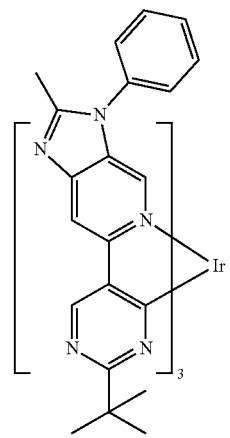

33

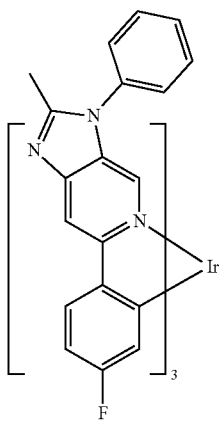

34

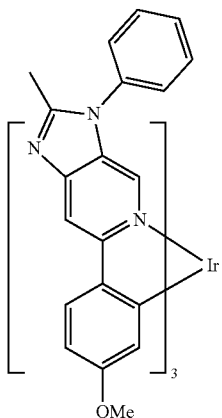

35

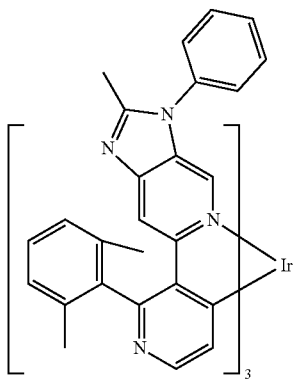

36

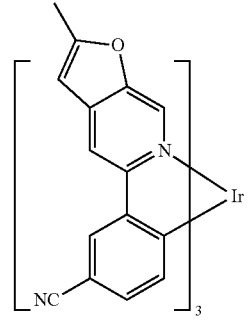

37

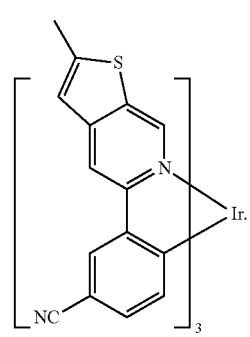

38

In $L_1$ which is a ligand represented by Formula 2, $X_{11}$ and $X_{12}$ in Formulae 4A and 4B are linked to each other via "a double bond". In addition, when $X_{11}$ in Formulae 4A and 4B is $C(R_{11})$ and $X_{12}$ in Formulae 4A and 4B is $C(R_{12})$, $R_{11}$ and $R_{12}$ are not linked to each other. That is, when $X_{11}$ in Formulae 4A and 4B is $C(R_{11})$ and $X_{12}$ in Formulae 4A and 4B is $C(R_{12})$, $R_{11}$ and $R_{12}$ are not linked to each other to form no other rings. Furthermore, $X_{13}$ in Formulae 4A and 4B may be O, S, Se, $N(R_{13})$, $B(R_{13})$, $P(R_{13})$, or $C(R_{13})(R_{14})$.

Accordingly, the organometallic compound represented by Formula 1 may have a relatively high triplet energy level and emit blue light having excellent color purity, for example, deep blue light having a maximum emission wavelength in a range from 440 nm to 480 nm (or from 450 nm to 475 nm) (in terms of an actual measurement value). Therefore, when the organometallic compound represented by Formula 1 is used, an electronic device (for example, an organic light-emitting device) having high efficiency and long lifespan may be implemented.

In an embodiment, at least one of groups $R_{21}$ in the number of a21 in Formula 2 may be a cyano group. For example, a group represented by

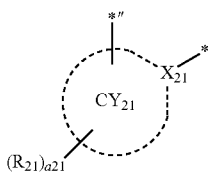

in Formula 2 may be represented by Formula CY21(3), wherein $R_{21}$ in Formula CY21(3) may be a cyano group. In one or more embodiments, $L_1$ in Formula 1 may be represented by one of Formulae 2(1) to 2(6), wherein $X_{23}$ in Formulae 2(1) to 2(6) may be C(CN). In this regard, the organometallic compound represented by Formula 1 may have a deep highest occupied molecular orbital (HOMO) energy level (i.e., a low HOMO level or a large absolute value of a HOMO energy level), and accordingly, the organometallic compound may have a higher triplet energy level than before. Therefore, when the organometallic compound represented by Formula 1 according to an embodiment is used, deep blue light having better color purity than before may be possibly emitted.

Regarding the organometallic compound represented by Formula 1, a HOMO energy level, a lowest unoccupied molecular orbital (LUMO) energy level, a triple (Ti) energy level, a singlet (Si) energy level, and a maximum emission wavelength of some compounds were measured by using a density functional theory (DFT)-dependent Gaussian 09 program structurally optimized at a level of B3LYP, and results of the measurement are shown in Table 1 below:

TABLE 1

| Compound No. | HOMO (eV) | LUMO (eV) | $T_1$ (eV) | $S_1$ (eV) | $\lambda_{max}$ (nm) |
|---|---|---|---|---|---|
| 37 | −5.58 | −1.96 | 2.66 | 2.97 | 474 |
| 2 | −5.66 | −2.00 | 2.74 | 3.01 | 461 |
| 38 | −5.58 | −1.96 | 2.66 | 2.97 | 474 |

From Table 1, it is confirmed that the organometallic compound represented by Formula 1 has such electric characteristics that are suitable for use in an electronic device, for example, for use as a dopant for an organic light-emitting device.

Synthesis methods of the organometallic compound represented by Formula 1 may be recognizable by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes:
a first electrode;
a second electrode; and
an organic layer that is disposed between the first electrode and the second electrode,
wherein the organic layer includes an emission layer and at least one of the organometallic compound represented by Formula 1.

The organic light-emitting device may have, due to the inclusion of an organic layer including the organometallic compound represented by Formula 1, a low driving voltage, high emission efficiency, high power, high quantum emission efficiency, a long lifespan, a low roll-off ratio, and excellent color purity.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host). The emission layer may emit blue light, for example, deep blue light having a maximum emission wavelength in a range from 440 nm to 480 nm (or from 450 nm to 475 nm) (in terms of an actual measurement value).

The expression "(an organic layer) includes at least one of organometallic compounds" as used herein may include an embodiment in which "(an organic layer) includes identical organometallic compounds represented by Formula 1" and an embodiment in which "(an organic layer) includes two or more different organometallic compounds represented by Formula 1".

For example, the organic layer may include, as the organometallic compound, only Compound 1. In this regard, Compound 1 may be included in an emission layer of the organic light-emitting device. In one or more embodiments, the organic layer may include, as the organometallic compound, Compound 1 and Compound 2. In this embodiment, Compound 1 and Compound 2 may be included in an identical layer (for example, Compound 1 and Compound 2 may all be included in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In an embodiment, in the organic light-emitting device, the first electrode is an anode, and the second electrode is a cathode, and the organic layer further includes a hole transport region disposed between the first electrode and the emission layer and an electron transport region disposed between the emission layer and the second electrode, wherein the hole transport region includes a hole injection layer, a hole transport layer, an electron blocking layer, a buffer layer or any combination thereof, and wherein the electron transport region includes a hole blocking layer, an electron transport layer, an electron injection layer, or any combination thereof.

The term "organic layer" as used herein refers to a single layer and/or a plurality of layers between the first electrode and the second electrode of the organic light-emitting device. The "organic layer" may include, in addition to an organic compound, an organometallic complex including metal.

FIG. 1 is a schematic view of an organic light-emitting device 10 according to an embodiment. Hereinafter, the structure of an organic light-emitting device according to an embodiment and a method of manufacturing an organic light-emitting device according to an embodiment will be described in connection with FIG. 1. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide ($SnO_2$), and zinc oxide (ZnO). In one or more embodiments, magnesium (Mg), aluminum (Al), aluminum-lithium (Al—Li), calcium (Ca), magnesium-indium (Mg—In), or magnesium-silver (Mg—Ag) may be used as the material for forming the first electrode.

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

A hole injection layer may be formed on the first electrode 11 by using one or more suitable methods selected from vacuum deposition, spin coating, casting, or Langmuir-Blodgett (LB) deposition.

When a hole injection layer is formed by vacuum deposition, the deposition conditions may vary according to a compound that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Angstroms per second (Å/sec) to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, 8-NPB, TPD, Spiro-TPD, Spiro-NPB, methylated-NPB, TAPC, HMTPD, 4,4',4''-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), polyaniline/poly(4-styrene sulfonate) (PANI/PSS), a compound represented by Formula 201 below, and a compound represented by Formula 202 below:

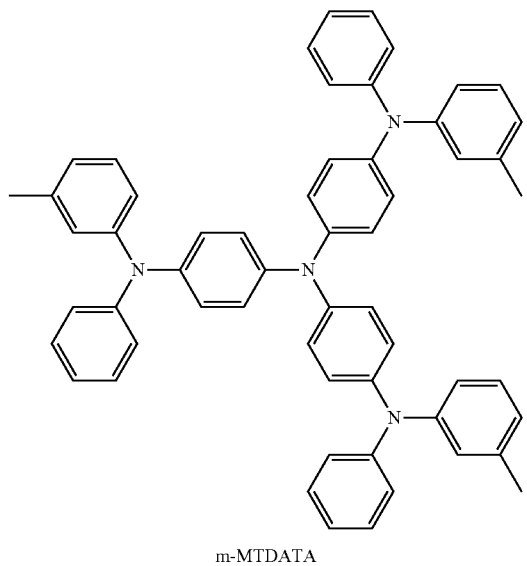

m-MTDATA

TDATA

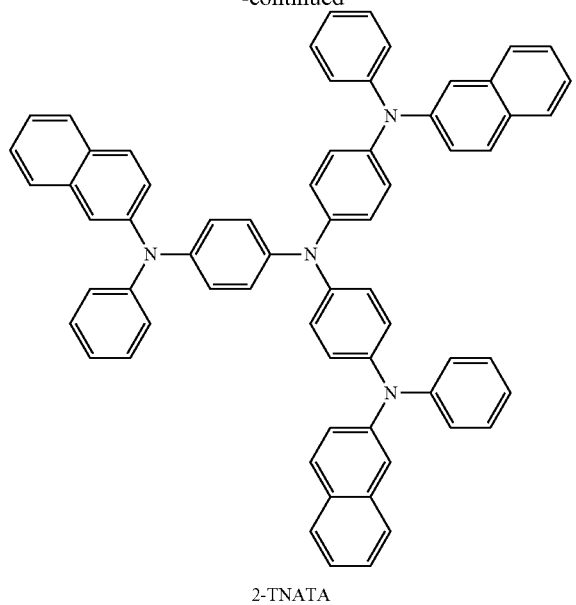
2-TNATA
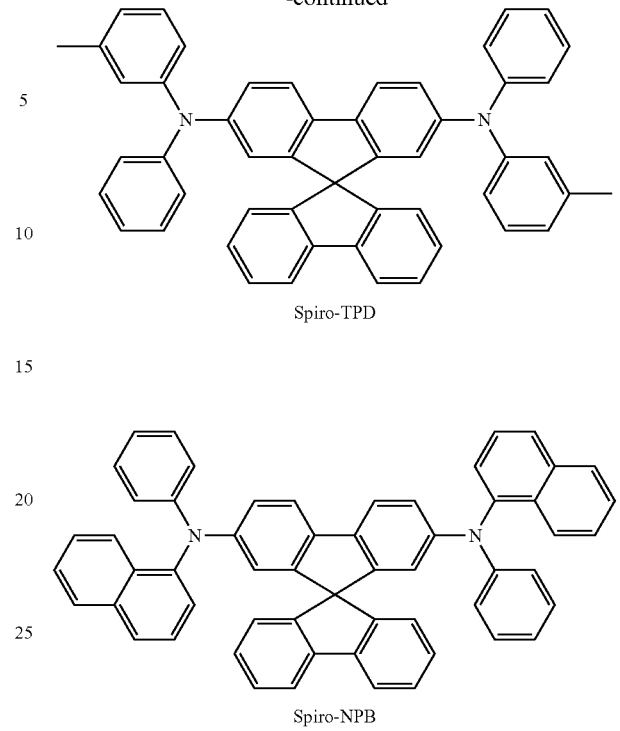
Spiro-TPD
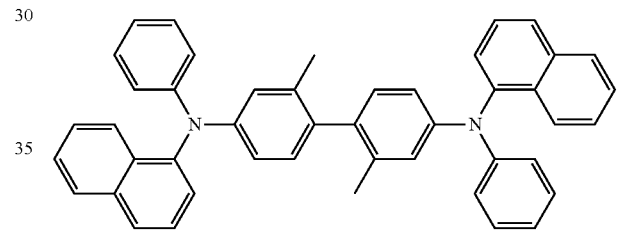
Spiro-NPB
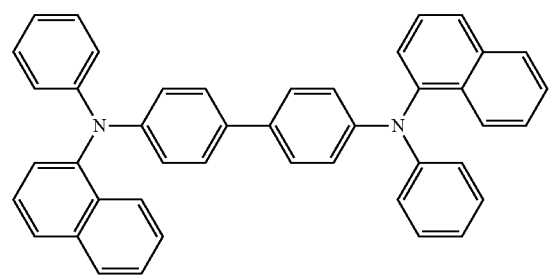
NPB
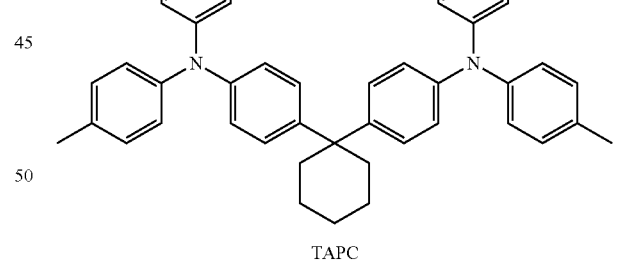
methylated NPB
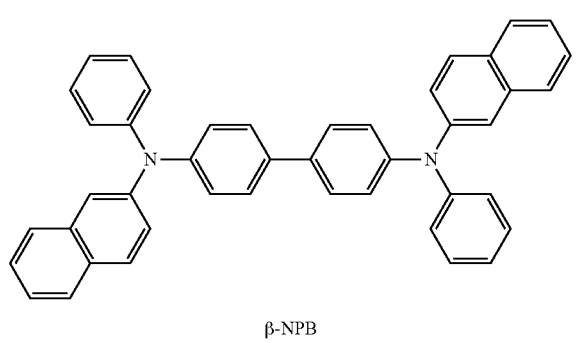
β-NPB
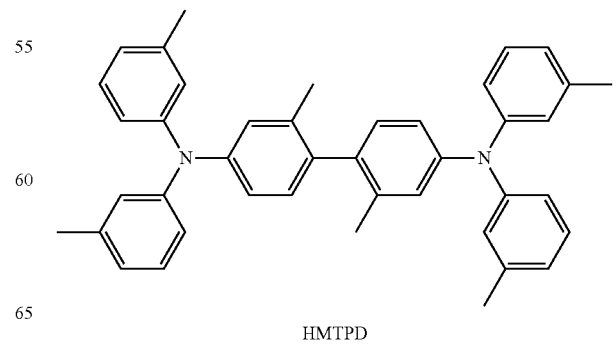
TAPC
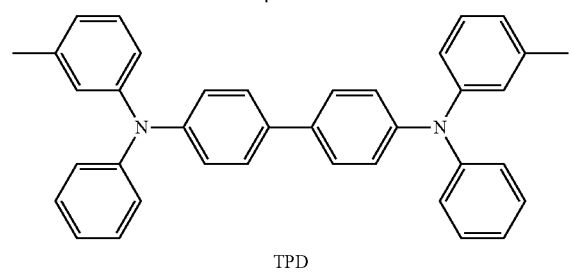
TPD
HMTPD Formula 201

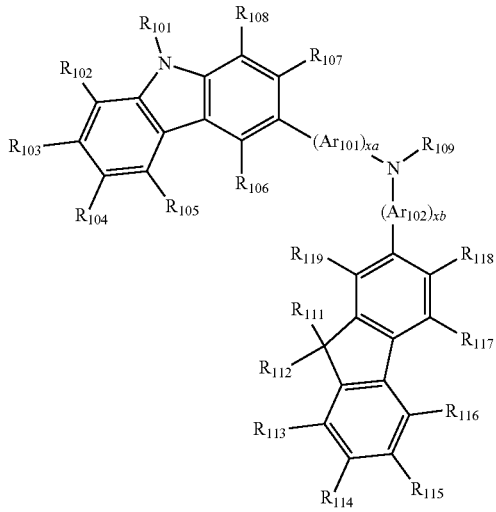

Formula 202

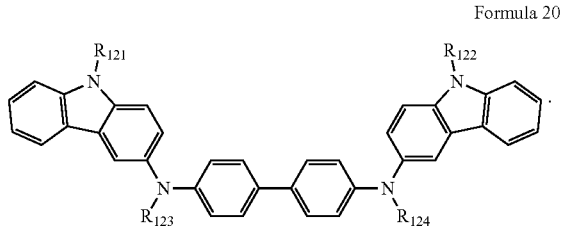

In Formula 201, $Ar_{101}$ and $Ar_{102}$ may each independently be selected from:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In Formula 201, xa and xb may each independently be an integer from 0 to 5, or may be 0, 1, or 2. For example, xa may be 1, and xb may be 0, but embodiments of the present disclosure are not limited thereto.

In Formulae 201 and 202, $R_{101}$ to $R_{108}$, $R_{111}$ to $R_{119}$, and $R_{121}$ to $R_{124}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, and the like), and a $C_1$-$C_{10}$ alkoxy group (for example, a methoxy group, an ethoxy group, a propoxy group, a butoxy group, a pentoxy group, and the like);

a $C_1$-$C_{10}$ alkyl group and a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments of the present disclosure are not limited thereto.

In Formula 201, $R_{109}$ may be selected from:

a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

In an embodiment, the compound represented by Formula 201 may be represented by Formula 201A, but embodiments of the present disclosure are not limited thereto:

Formula 201A
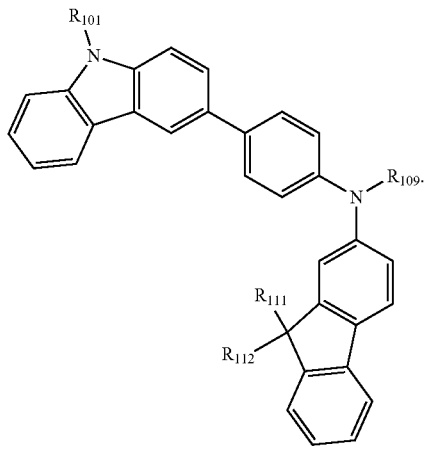
In Formula 201A, $R_{101}$, $R_{111}$, $R_{112}$, and $R_{109}$ are each the same as defined above.
For example, the compound represented by Formula 201 and the compound represented by Formula 202 may each include Compounds HT1 to HT20 below, but are not limited thereto:
HT1
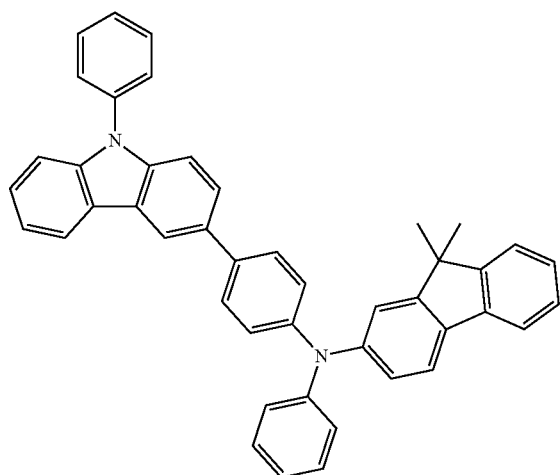
HT2
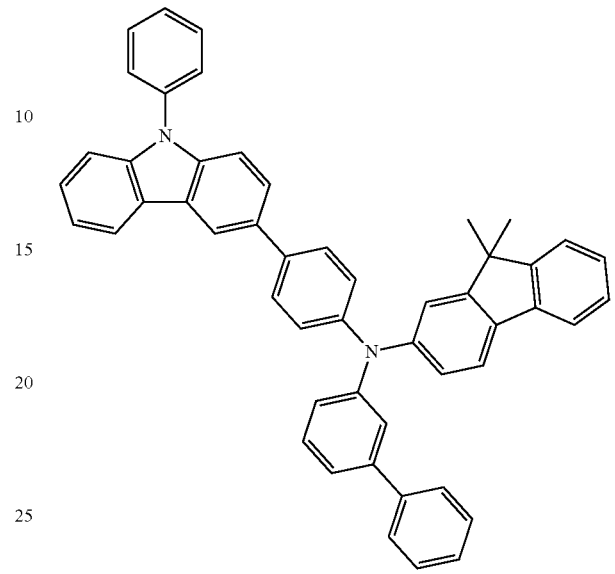
HT3
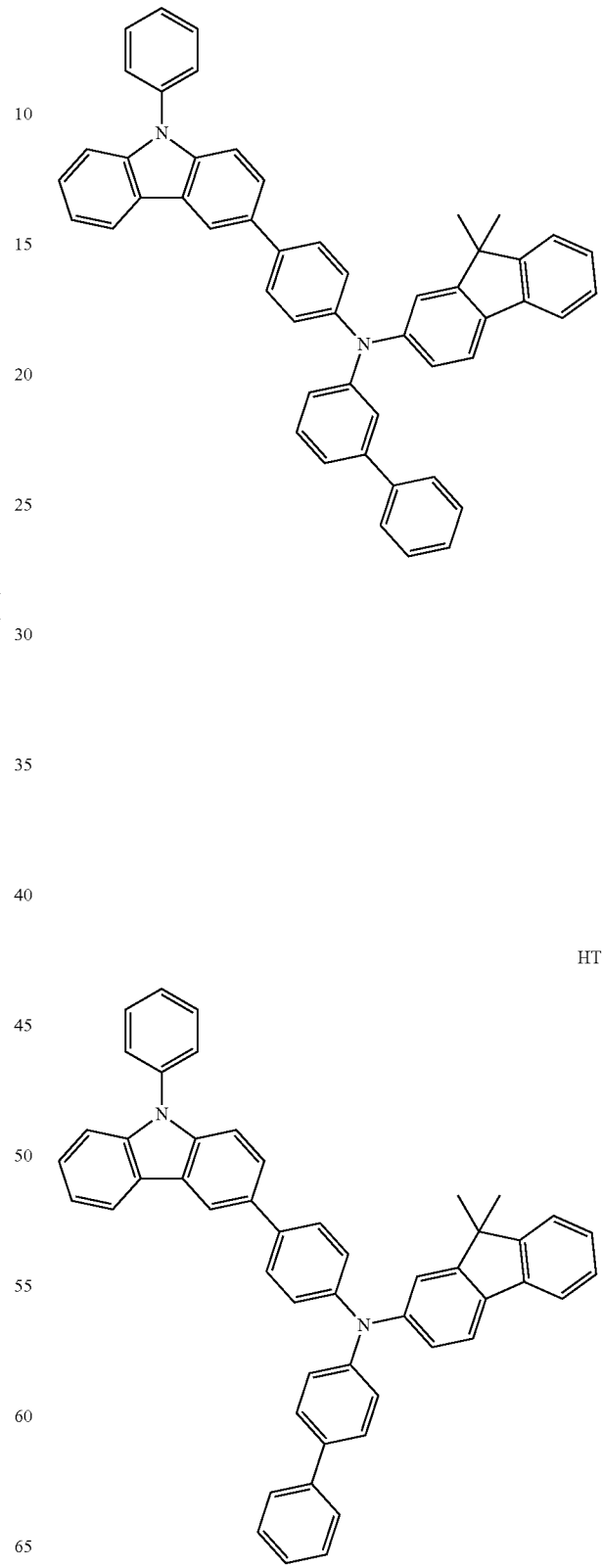

HT4
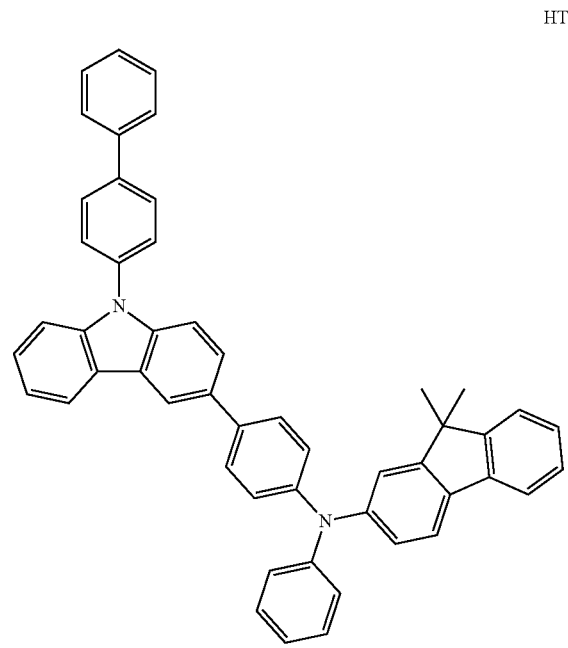
HT6
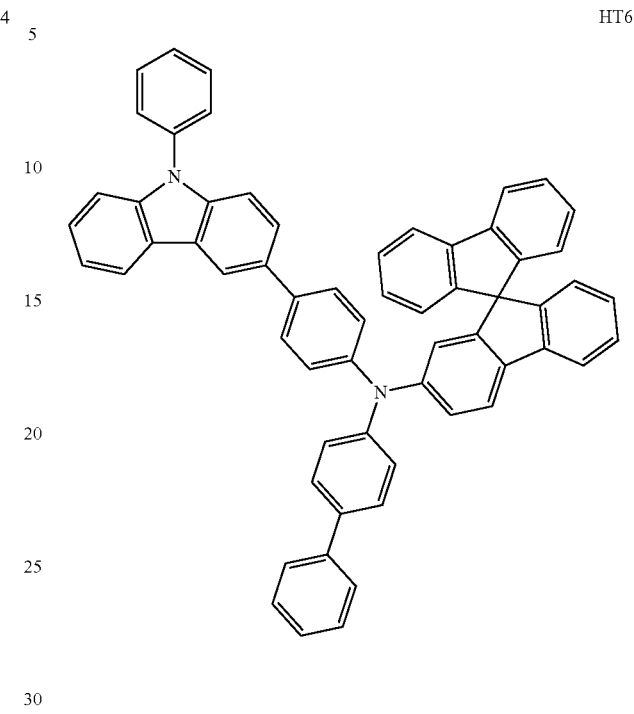
HT5
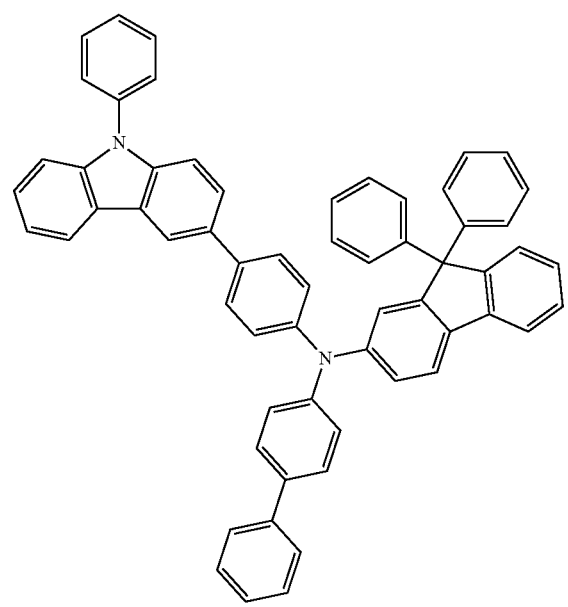
HT7
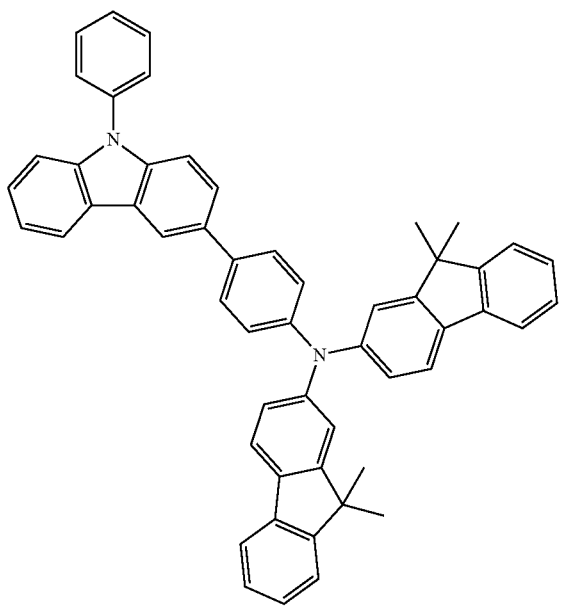

HT8
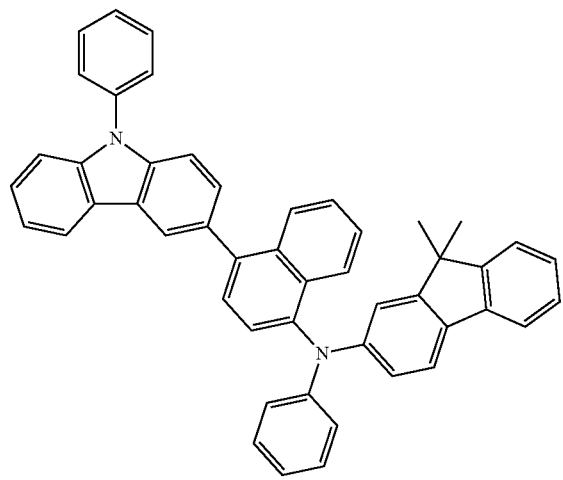
HT11
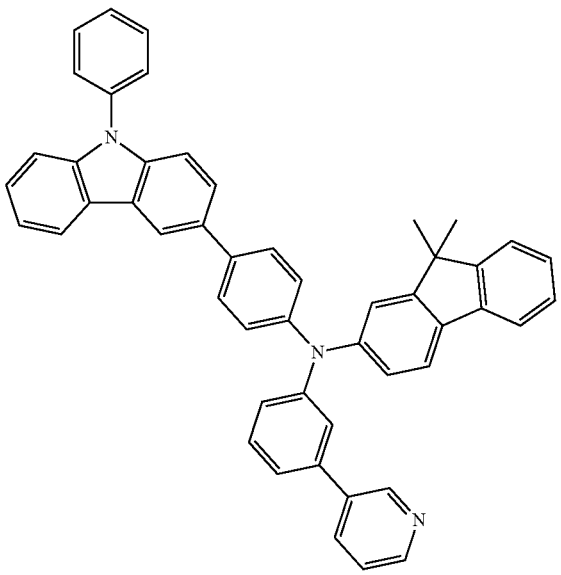
HT9
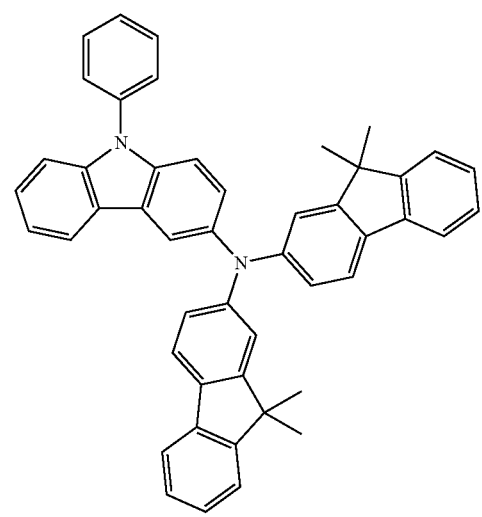
HT12
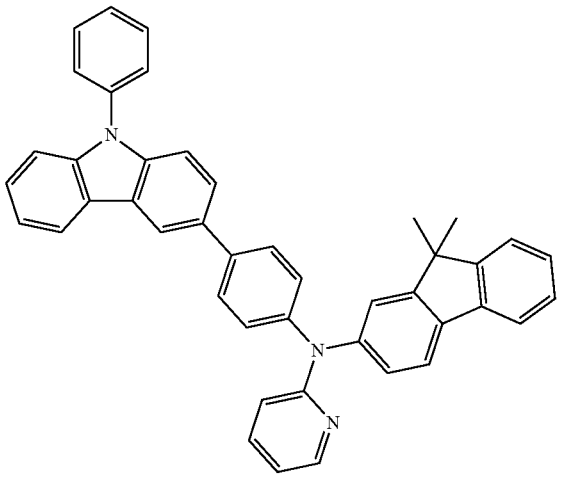
HT10
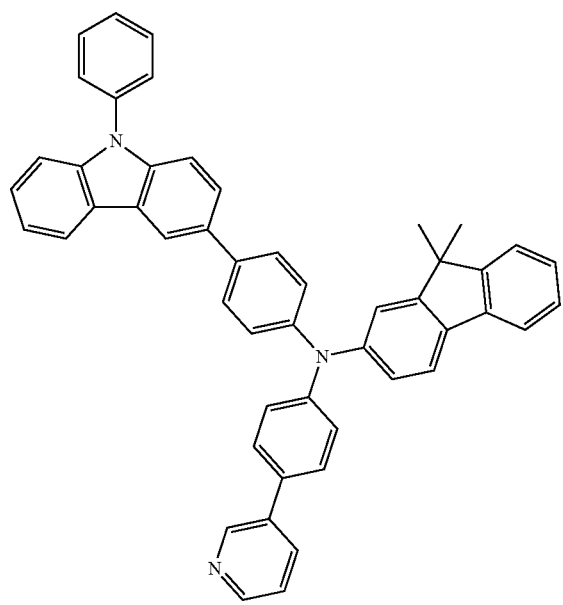
HT13
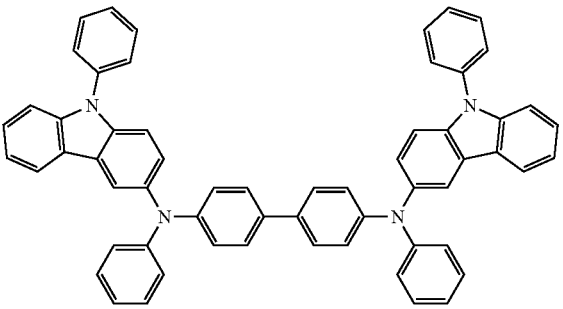

-continued

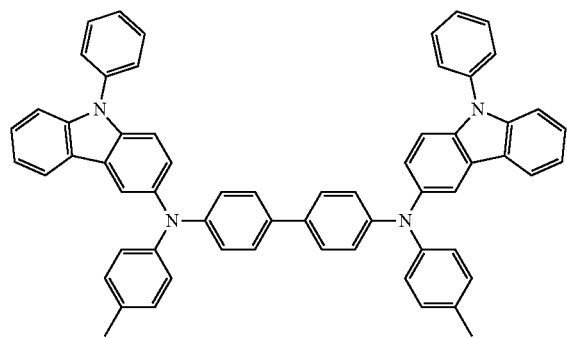
HT14

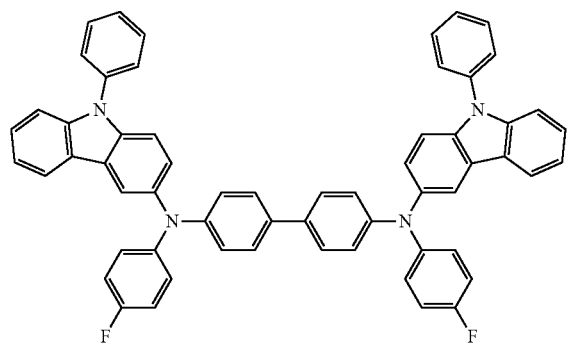
HT15

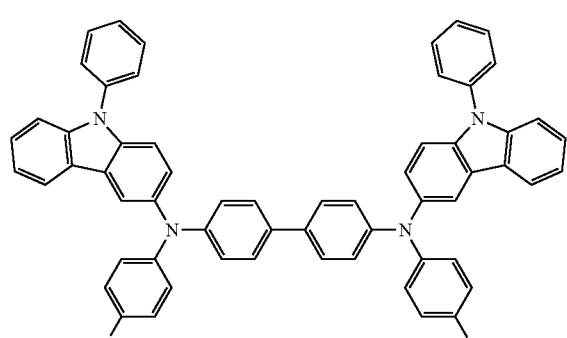
HT16

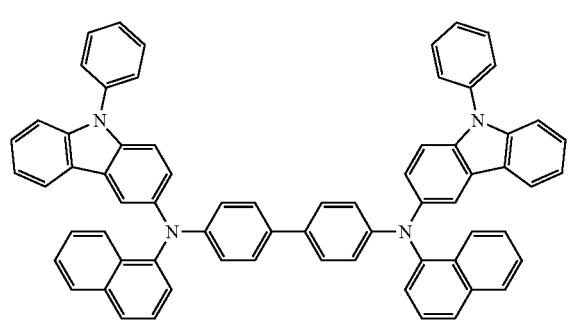
HT17

-continued

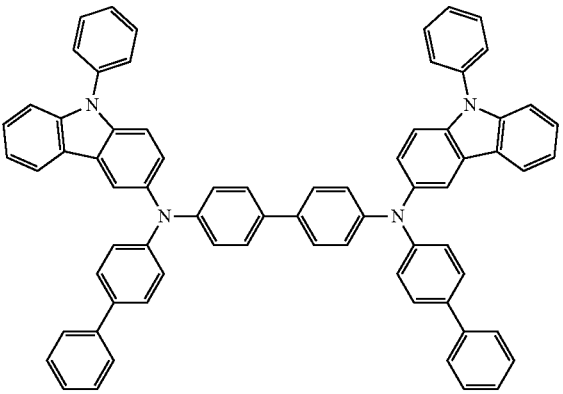
HT18

HT19

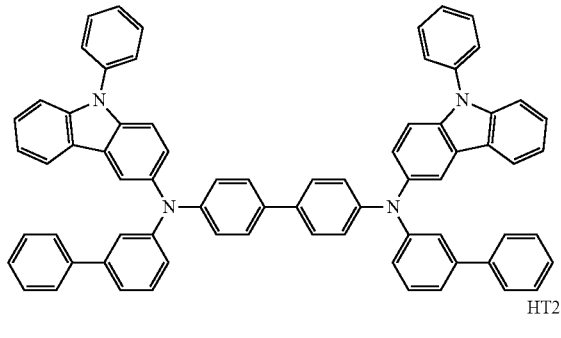
HT20

A thickness of the hole transport region may be in a range of about 100 Angstroms (Å) to about 10,000 Å, for example, about 100 Å to about 1,000 Å. When the hole transport region includes at least one of a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 below, but are not limited thereto:

HT-D1

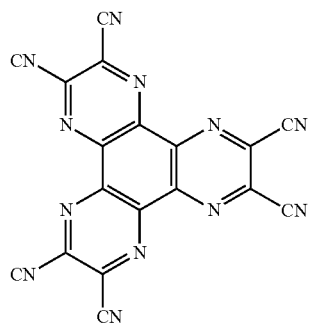

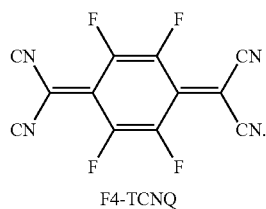

F4-TCNQ

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1.

The host may include at least one selected from TPBi, TBADN, ADN (also referred to as "DNA"), CBP, CDBP, TCP, mCP, Compound H50, Compound H51, and Compound H52:

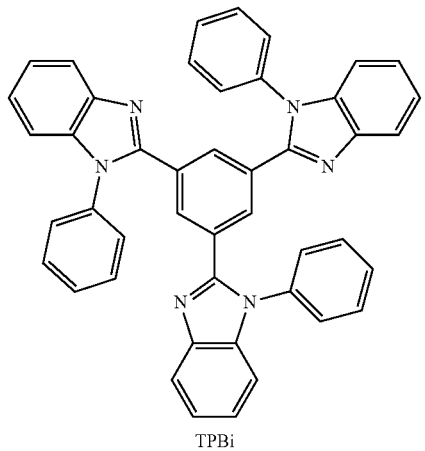

TPBi

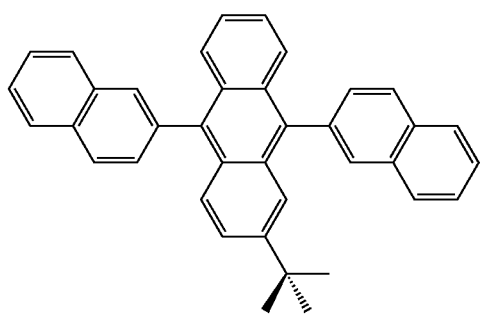

TBADN

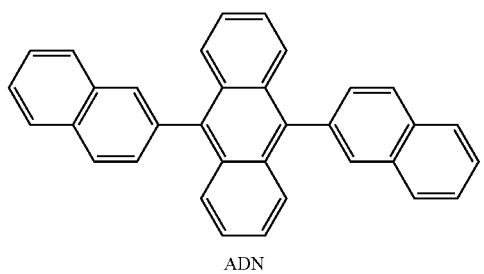

ADN

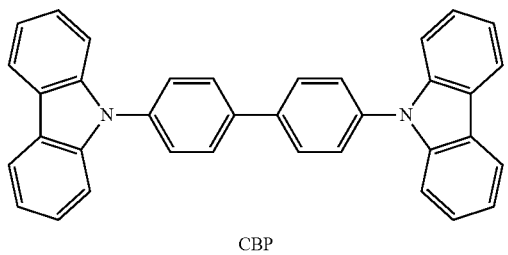

CBP

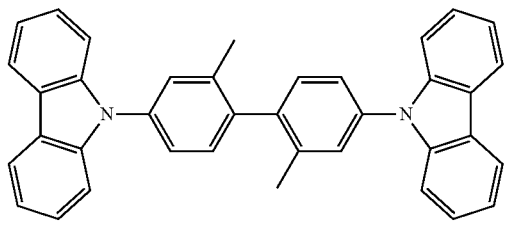

CDBP

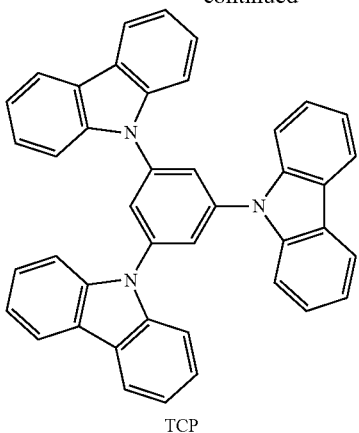

TCP

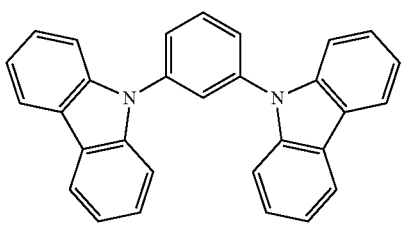

mCP

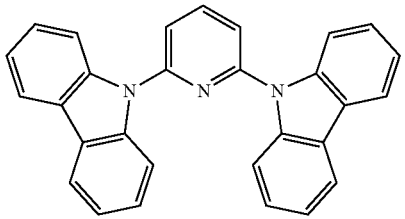

H50

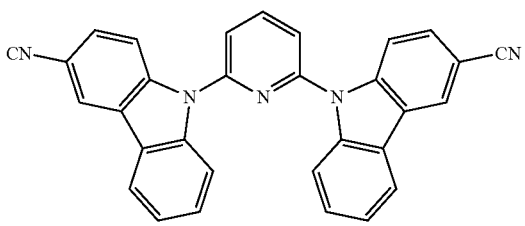

H51

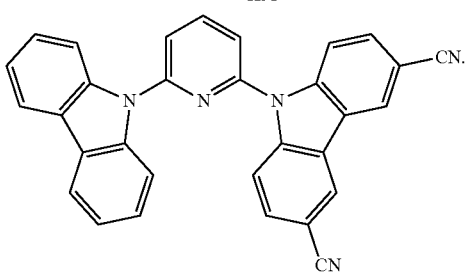

H52

In one or more embodiments, the host may further include a compound represented by Formula 301:

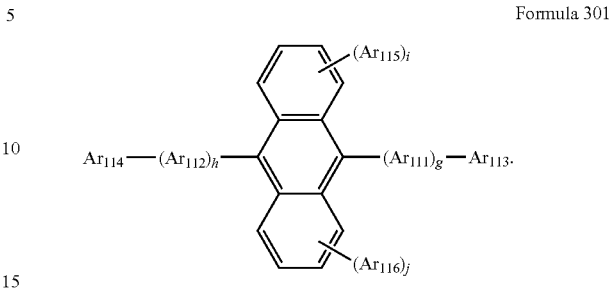

Formula 301

In Formula 301, $Ar_{111}$ and $Ar_{112}$ may each independently be selected from:

a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group.

In Formula 301, $Ar_{113}$ to $Ar_{116}$ may each independently be selected from:

a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group, and g, h, i, and j in Formula 301 may each independently be an integer from 0 to 4, and may be, for example, 0, 1, or 2.

In Formula 301, $Ar_{113}$ to $Ar_{116}$ may each independently be selected from:

a $C_1$-$C_{10}$ alkyl group substituted with at least one selected from a phenyl group, a naphthyl group, and an anthracenyl group;

a phenyl group, a naphthyl group, an anthracenyl group, a pyrenyl, a phenanthrenyl group, and a fluorenyl group;

a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

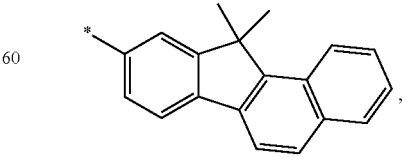

but embodiments of the present disclosure are not limited thereto.

In one or more embodiments, the host may include a compound represented by Formula 302:

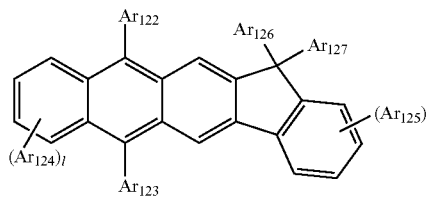

Formula 302

In Formula 302, $Ar_{122}$ to $Ar_{125}$ are each defined the same as $Ar_{113}$ in Formula 301.

In Formula 302, $Ar_{126}$ and $Ar_{127}$ may each independently be a $C_1$-$C_{10}$ alkyl group (for example, a methyl group, an ethyl group, or a propyl group).

In Formula 302, k and l may each independently be an integer from 0 to 4. For example, k and l may be 0, 1, or 2.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer include a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but embodiments of the present disclosure are not limited thereto.

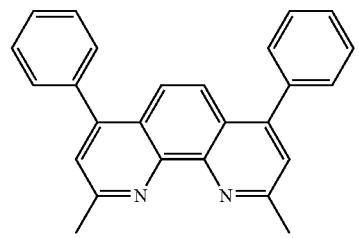

BCP

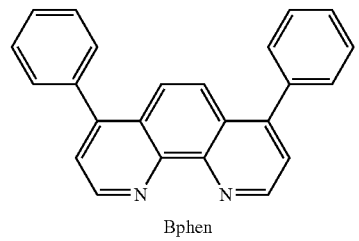

Bphen

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have improved hole blocking ability without a substantial increase in driving voltage.

The electron transport layer may further include at least one selected from BOP, Bphen, $Alq_3$, BAlq, TAZ, and NTAZ:

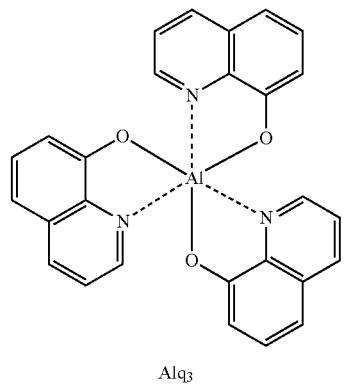

$Alq_3$

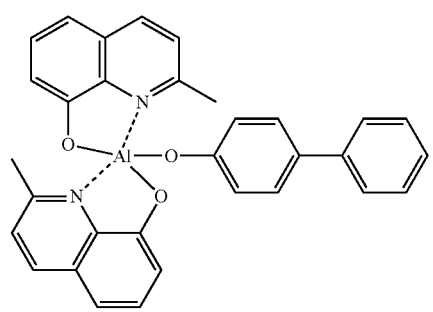

BAlq

101
-continued
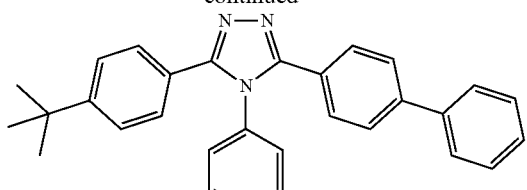
TAZ
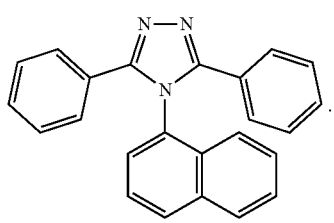
NTAZ
In one or more embodiments, the electron transport layer may include at least one of ET1 to ET25, but are not limited thereto:
ET1
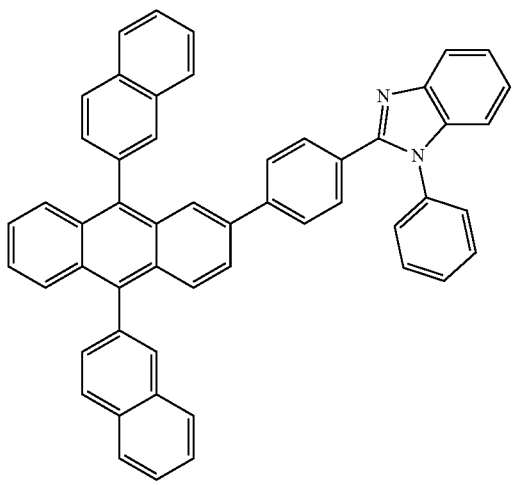
ET2
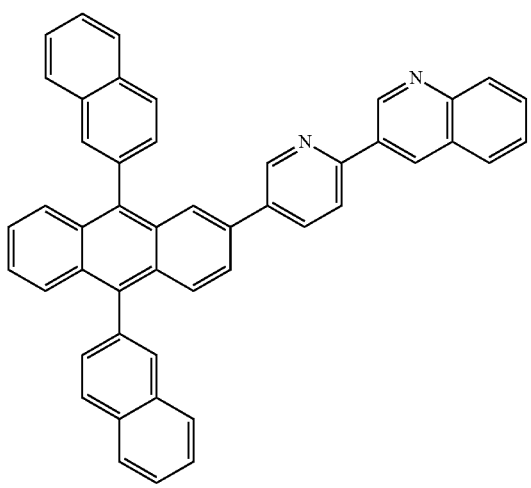
102
-continued
ET3
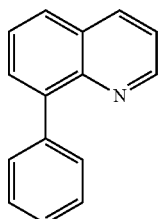
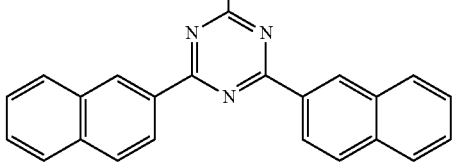
ET4
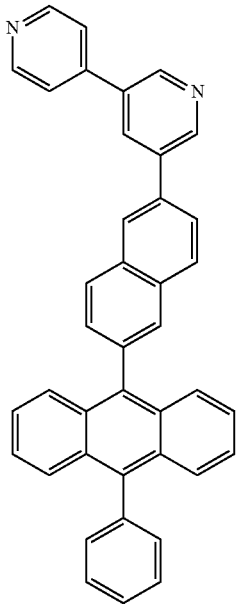
ET5
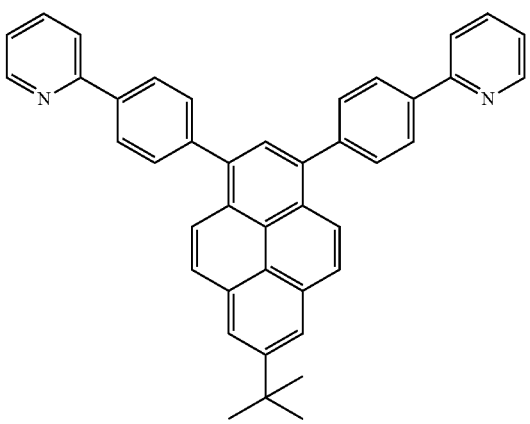

103
-continued
ET6
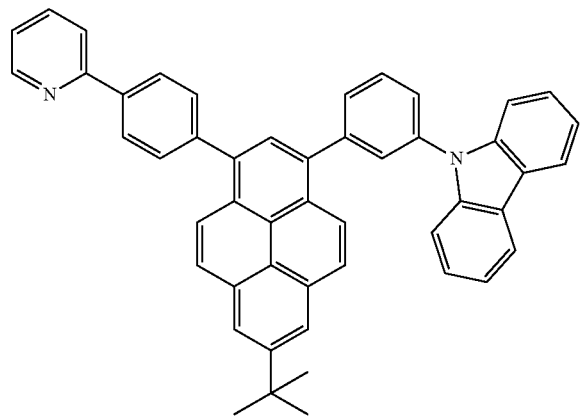
ET7
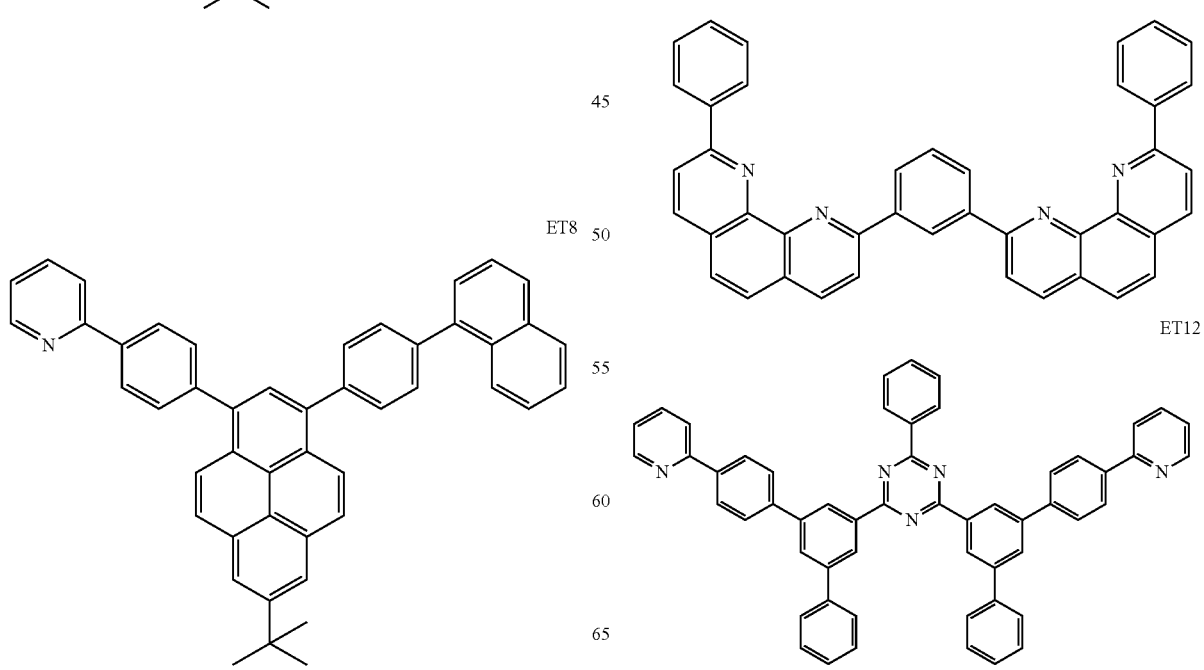
ET8
104
-continued
ET9
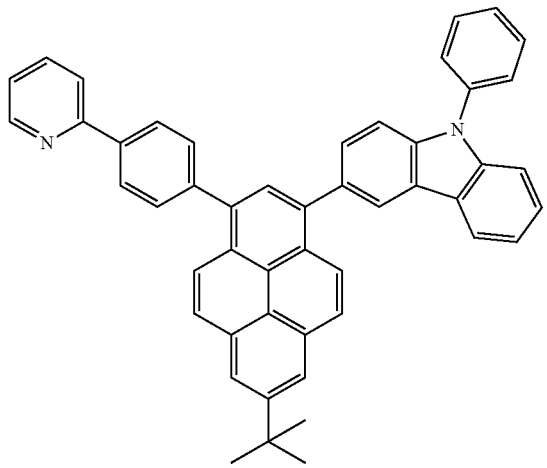
ET10
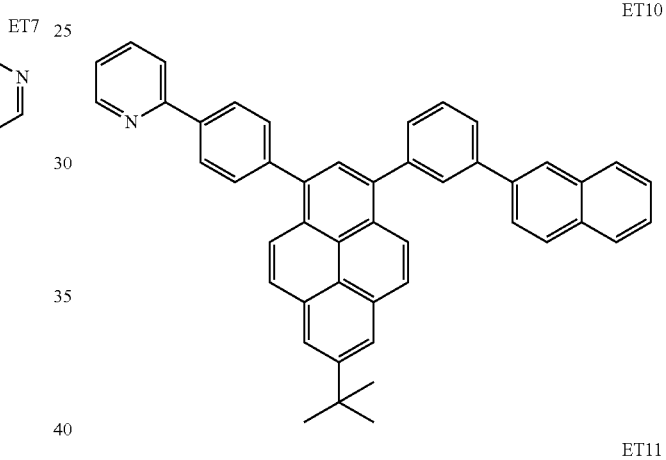
ET11
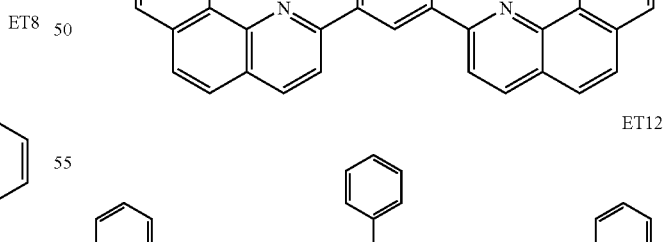
ET12

ET13
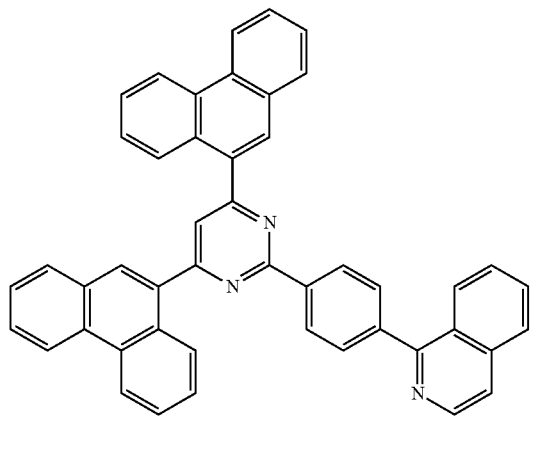
ET16
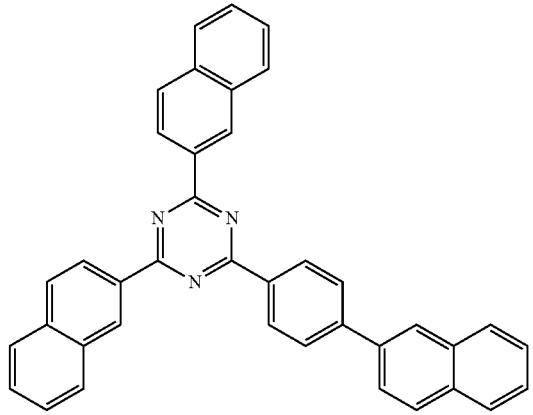
ET14
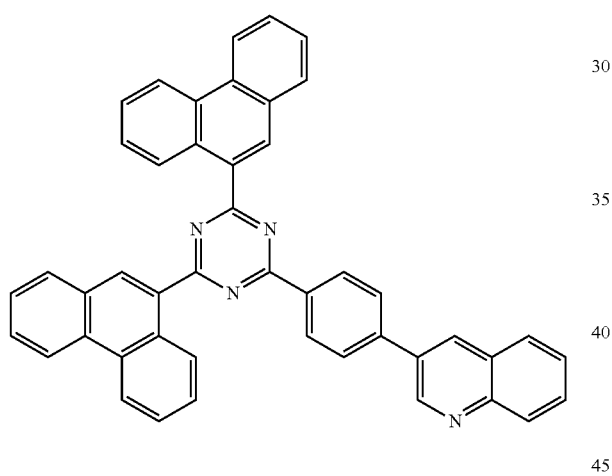
ET17
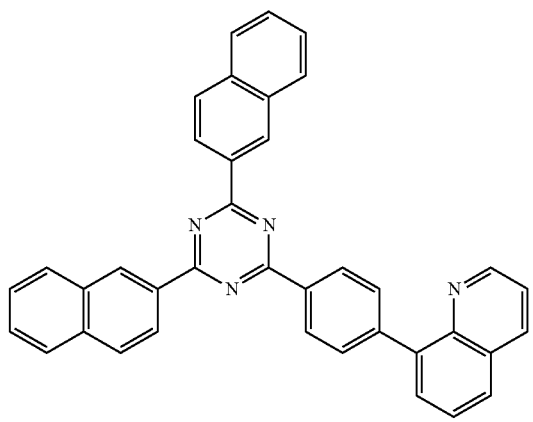
ET15
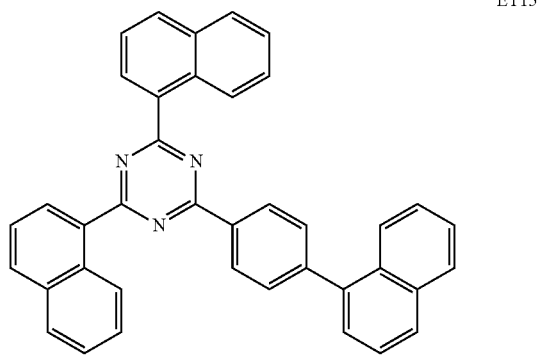
ET18
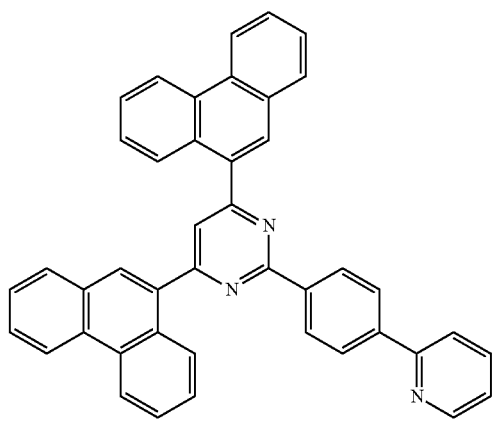

ET19
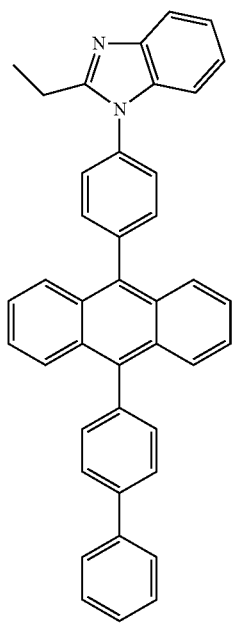
ET20
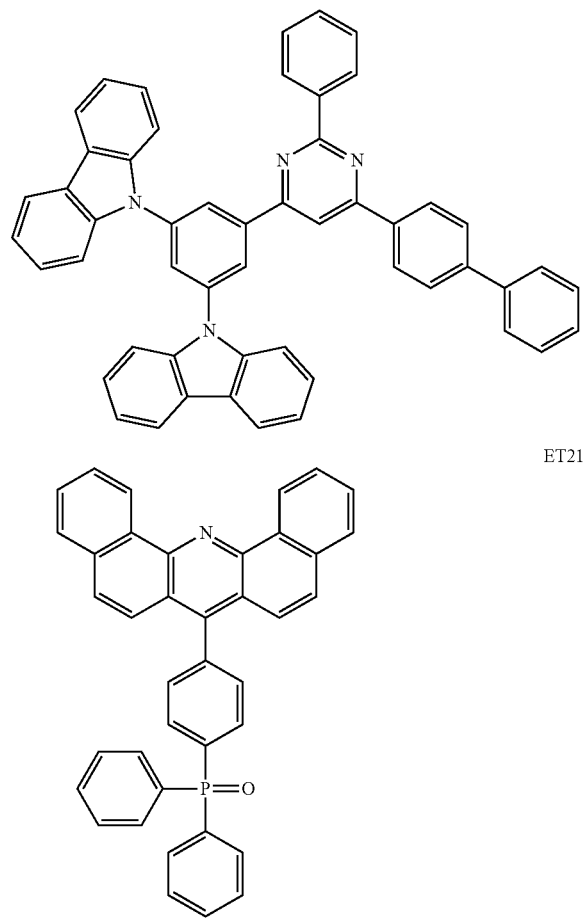
ET21
ET22
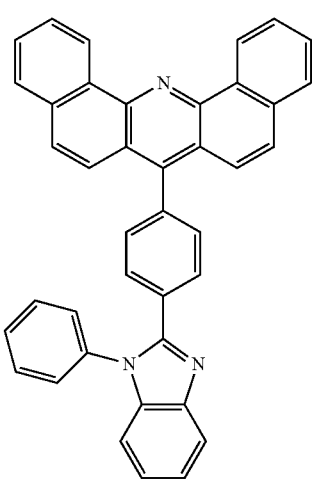
ET23
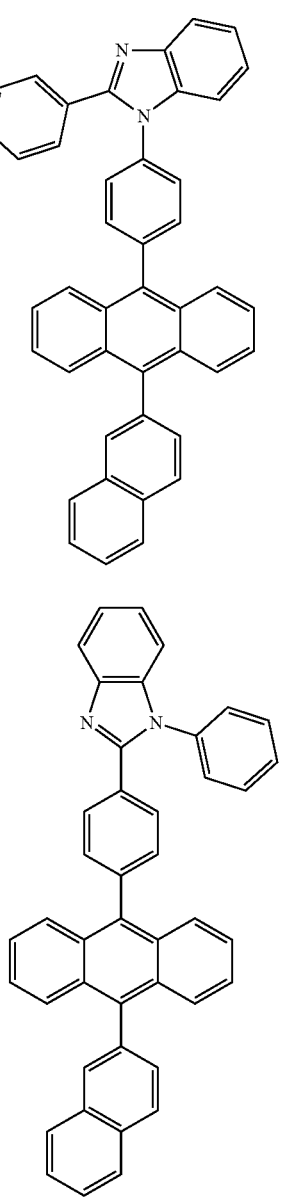
ET24

ET25

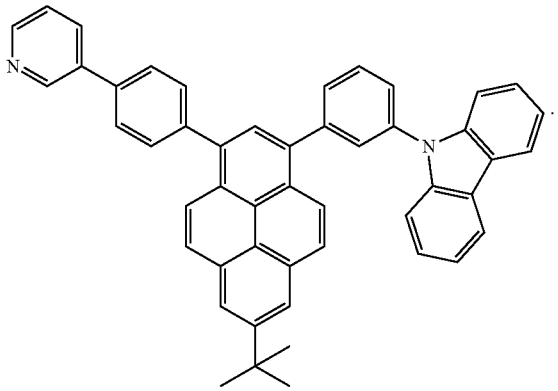

A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium 8-hydroxyquinolate, LiQ) or ET-D2:

ET-D1

ET-D2

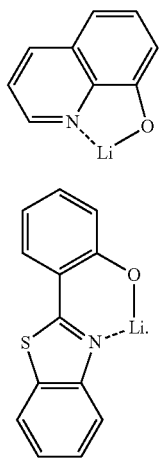

The electron transport region may include an electron injection layer that promotes flow of electrons from the second electrode 19 thereinto.

The electron injection layer may include at least one selected from LiF, NaCl, CsF, $Li_2O$, and BaO.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as a material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to FIG. 1, but embodiments of the present disclosure are not limited thereto.

Another aspect of the present disclosure provides a diagnostic composition including at least one organometallic compound represented by Formula 1.

The organometallic compound represented by Formula 1 provides high emission efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an isopropyloxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a heterocyclic aromatic system that has at least one heteroatom selected from N, O, P, Si, and S as a ring-forming atom, and 1 to 60 carbon atoms. The term "$C_1$-$C_{60}$ heteroarylene group" as used herein refers to a divalent group having a heterocyclic aromatic system that has at least one heteroatom selected from N, O, P, Si and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein indicates —$OA_{102}$ (wherein $A_{102}$ is the $C_6$-$C_{60}$ aryl group), and a $C_6$-$C_{60}$ arylthio group as used herein indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms. The $C_1$-$C_{30}$ heterocyclic group may be a monocyclic group or a polycyclic group.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —$N(Q_{31})(Q_{32})$, —$Si(Q_{33})(Q_{34})(Q_{35})$, —$B(Q_{36})(Q_{37})$, and —$P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Br, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1 (Compound 2)

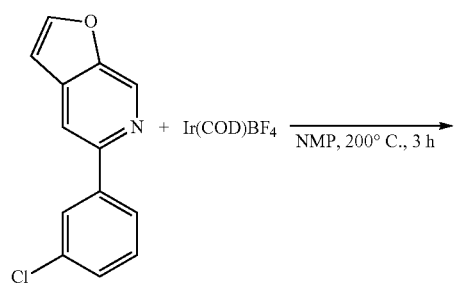

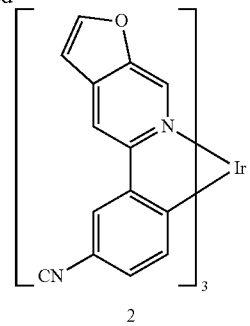

3-(furo[2,3-c]pyridin-5-yl)benzonitrile (8 grams (g), 36.3 millimoles (mmol)) and Ir(COD)BF$_4$ (4.5 g, 9.1 mmol) were added to 40 milliliters (mL) of 1-methyl-2-pyrrolidone (NMP). The mixed solution was heated at a temperature of 200° C. for 3 hours, and then, cooled to room temperature. Afterwards, an extraction process was performed thereon by using dichloromethane and distilled water to extract an organic layer, and a solvent was removed therefrom under reduced pressure. The resulting product was subjected to silica gel chromatography (eluent:DCM) to obtain a yellow solid, Compound 2 (0.5 g, yield of 7%) (Mass: 850.130).

Synthesis Example 2 (Compound 38)

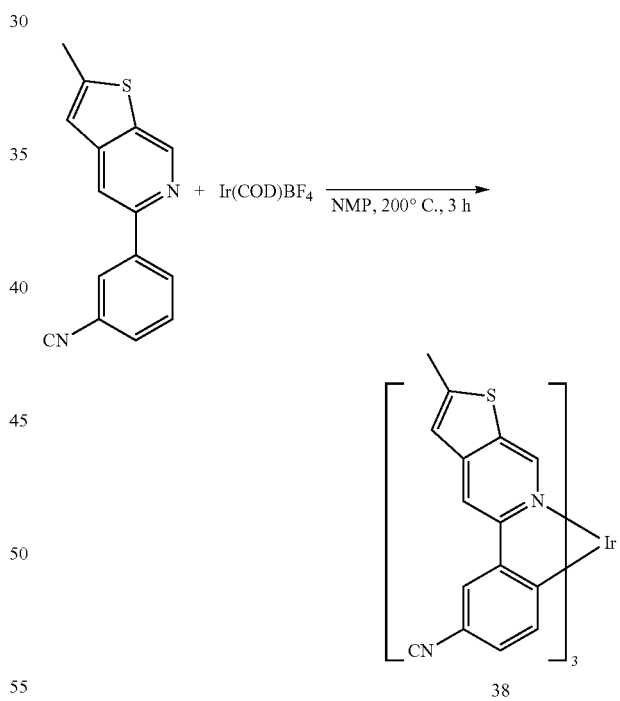

3-(2-methylthieno[2,3-c]pyridin-5-yl)benzonitrile (6 g, 24 mmol) and Ir(COD)BF$_4$ (3 g, 6.1 mmol) were added to 30 mL of NMP. The mixed solution was heated at a temperature of 200° C. for 3 hours, and then, cooled to room temperature. Afterwards, an extraction process was performed thereon by using dichloromethane and distilled water to extract an organic layer, and a solvent was removed therefrom under reduced pressure. The resulting product was subjected to silica gel chromatography (eluent:DCM) to obtain a yellow solid, Compound 38 (0.38 g, yield of 6%) (Mass: 940.109).

Evaluation Example 1: Evaluation of HOMO, LUMO, and T₁ Energy Levels

According to methods described in Table 2, $T_1$ energy levels of Compound 2 and Compound 38 were measured, and results thereof are shown in Table 3:

TABLE 2

| | |
|---|---|
| $T_1$ energy level evaluation method | A mixture of toluene and respective compound (i.e., a mixture including 1 milligram (mg) of respective compound dissolved in 3 cubic centimeters (cc) of toluene) was added to a quartz cell, and added to liquid nitrogen (at 77 Kelvins (K)). A photoluminescence (PL) spectrum of the mixture was measured by using a photoluminescence measurement device. The PL spectrum was compared with a general room-temperature photoluminescence spectrum, and only a peak observed at a low temperature was analyzed to calculate a $T_1$ energy level |

TABLE 3

| Compound No. | $T_1$ (eV) |
|---|---|
| 2 | 2.68 |
| 38 | 2.62 |

Referring to Table 3, it was confirmed that Compound 2 and Compound 38 are good materials having suitable electric characteristics to be used in an organic light-emitting device.

Evaluation Example 2: Thermal Characteristics Evaluation

Regarding Compound 2 and Compound 38, thermo gravimetric analysis (TGA) (N₂ atmosphere, temperature range: room temperature to 600° C. (10° C./min), Pan Type: Pt Pan in disposable Al Pan) was carried out, and results are shown in Table 4.

TABLE 4

| Compound No. | Td (1%, ° C.) |
|---|---|
| 2 | 411 |
| 38 | 288 |

Referring to Table 4, it was confirmed that Compound 2 and Compound 38 have excellent thermal stability.

Evaluation Example 3: Luminance Spectrum Evaluation

Figure 2:
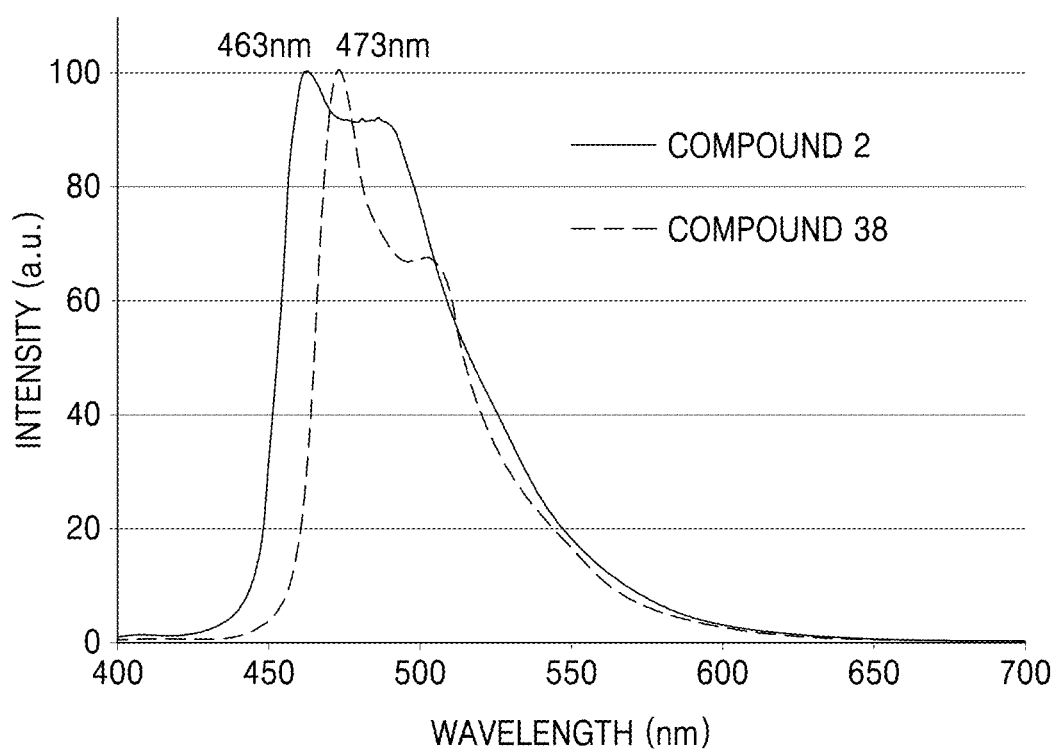
FIG. 2 is a graph of intensity (arbitrary units, a. u.) versus wavelength (nanometers, nm) showing a photoluminescence (PL) spectrum of Compounds 2 and 38.

The emission characteristics of each of Compound 2 and Compound 38 were evaluated by evaluating the PL spectra of the compounds. In detail, Compound 2 and Compound 38 were each diluted with CHCl₃ at a concentration of 10 millimolar (mM), and a PL spectrum of the compounds was measured at room temperature by using an ISC PC1 spectrofluorometer equipped with a xenon lamp. The PL spectra (i.e., peak emission wavelength) of Compound 2 and Compound 38 were summarized in Table 5 and shown in FIG. 2.

TABLE 5

| Compound No. | $\lambda_{max}$ (nm) |
|---|---|
| 2 | 463 |
| 38 | 473 |

Referring to Table 5, it was confirmed that Compound 2 and Compound 38 had PL emission characteristics suitable for the emission of deep blue light.

Example 1

A glass substrate, on which an indium tin oxide (ITO) electrode (also referred to as a first electrode or an anode) having a thickness of 1,500 Angstroms (Å) was formed, was washed with distilled water with ultrasonic wave. After the completion of the washing with distilled water, sonification washing was performed thereon by sequentially using isopropyl alcohol, acetone, and methanol. The resulting substrate was dried and transferred to a plasma cleaning machine. Then, by using an oxygen plasma, the substrate was cleaned for 5 minutes, and then, transferred to a vacuum deposition device.

Compound HT3 was vacuum-deposited on the ITO electrode of the glass substrate to form a first hole injection layer having a thickness of 3,500 Å, Compound HT-D1 was vacuum-deposited on the first hole injection layer to form a second hole injection layer having a thickness of 300 Å, and TAPC was deposited on the second hole injection layer to form an electron blocking layer having a thickness of 100 Å, thereby forming a hole transport region.

Compound H52 and Compound 2 (dopant, 10 weight %) were co-deposited on the hole transport region to form an emission layer having a thickness of 300 Å.

Compound ET3 was vacuum-deposited on the emission layer to form an electron transport layer having a thickness of 250 Å, ET-D1 (LiQ) was deposited on the electron transport layer to form an electron injection layer having a thickness of 5 Å, and Al was deposited on the electron injection layer to form an Al second electrode (cathode) having a thickness of 1,000 Å, thereby completing the manufacture of an organic light-emitting device.

HT3

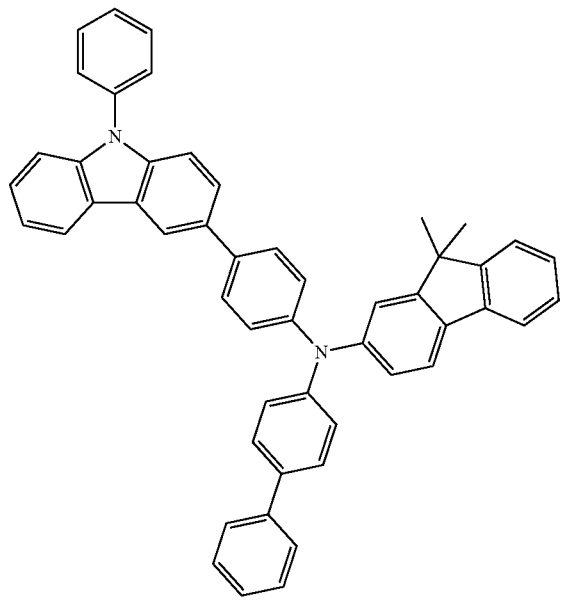

HT-D1

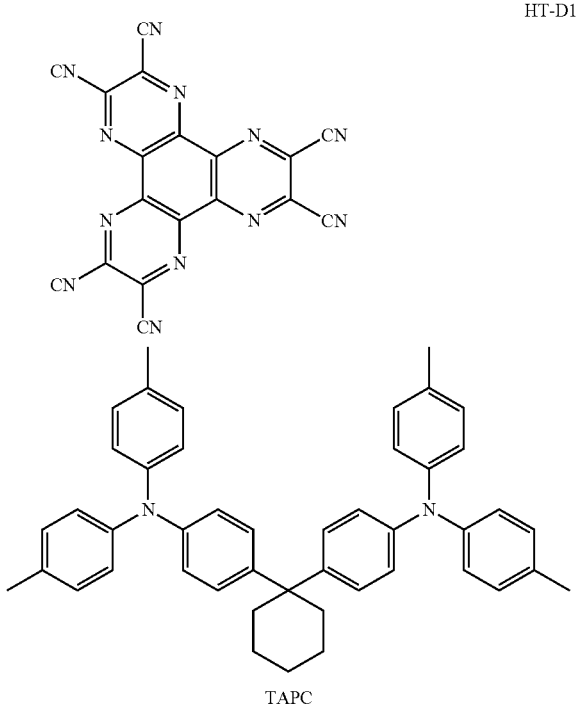

TAPC

H52

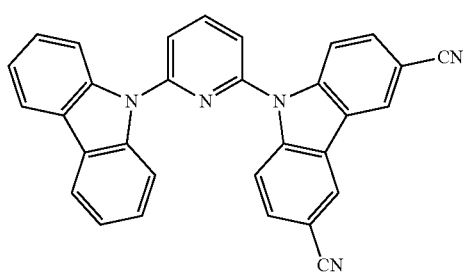

ET3

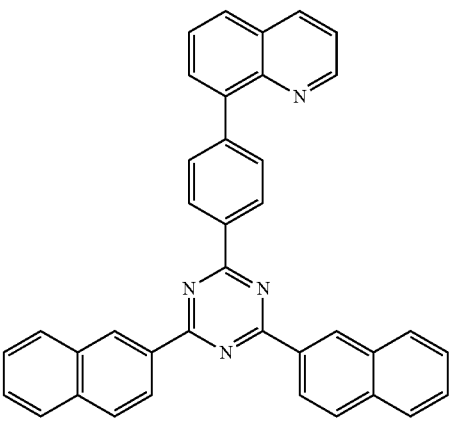

ET-D1

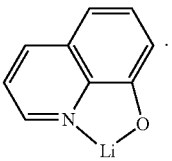

Evaluation Example 4: Evaluation of Characteristics of Organic Light-Emitting Devices Regarding the organic light-emitting device of Example 1, the EL spectrum, the voltage-dependent current density, the voltage-dependent luminance, emission efficiency, converted efficiency, external quantum emission efficiency (EQE), lifespan, and CIE color coordinate were measured. Detailed measurement methods are as follows, and results of the measurements are shown in Table 6.

(1) Measurement of EL Spectrum

Regarding the prepared organic light-emitting device, an EL spectrum was measured at a luminance level of 1000 candelas per square meter (cd/m$^2$) by using a luminance measurement device (Minolta Cs-1000A).

(2) Measurement of Voltage-Dependent Current Density

Regarding the prepared organic light-emitting device, the current flowing through the unit device was measured by using a current-voltage measurement meter (Keithley 2400) while the voltage was raised from 0 volts (V) to 10 V, and the measured current value was divided by an area to obtain voltage-dependent current density.

(3) Measurement of Voltage-Dependent Luminance

Regarding the prepared organic light-emitting device, the luminance was measured by using a luminance measurement device (Minolta Cs-1000A) while the voltage was raised from 0 V to 10 V.

(4) Measurement of Converted Efficiency

Based on the current density (2) and luminance (3) results and the application of the voltage, the current efficiency (candelas per square meter, cd/A) at the same current density (10 milliamperes per square centimeters (mA/cm$^2$)) was calculated. Then, the current efficiency was divided by y-axis value of the CIE color coordinates measured in (6) to obtain the converted efficiency.

(5) Measurement of Lifespan

The time required until the luminance obtained in (3) (initial luminance was set to be 100%) was reduced to 95% ($T_{95}$) and 50% ($T_{50}$) was calculated, respective.

(6) Measurement of CIE Color Coordinates

Regarding the prepared organic light-emitting device, the CIE color coordinates were obtained by measuring the EL spectrum at luminance of 1,000 cd/m$^2$ by using a luminance measurement device (Minolta Cs-1000A).

TABLE 6

| No. | Dopant | Current density (mA/cm$^2$) | Luminance (cd/m$^2$) | Emission efficiency (cd/A) | Converted efficiency | EQE (%) | EL (nm) | T$_{95}$ (hr) (at 1,000 cd/m$^2$) | Color coordinate (x, y) |
|---|---|---|---|---|---|---|---|---|---|
| 1 | 2 | 3.38 | 1000 | 29.60 | 81.3 | 13.0 | 467 | 2 | (0.14, 0.27) |

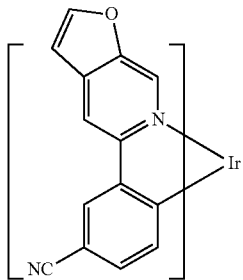

Referring to Table 6, it was confirmed that the organic light-emitting device of Example 1 was excellent in terms of emission efficiency, external quantum emission efficiency, and long lifespan while being able to emit deep blue light.

According to the one or more embodiments, an organometallic compound may have excellent color purity, electric characteristics, and thermal stability, and thus, an organic light-emitting device including the organometallic compound may accordingly have excellent driving voltage, current density, efficiency, electrical energy power, color purity, and long lifespan.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present description as defined by the following claims.

What is claimed is:

1. An organometallic compound represented by Formula 1:

Formula 1

$$M(L_1)_{n1}(L_2)_{n2}(L_3)_{n3}$$

2

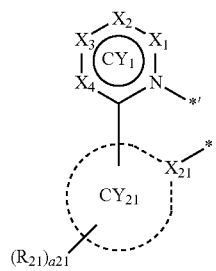

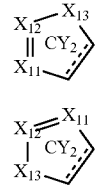

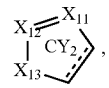

-continued

4A

4B wherein, in Formula 1, M is a transition metal,
in Formula 1, L$_1$ is a ligand represented by Formula 2,
in Formula 1, n1 is 1, 2, or 3, wherein, when n1 is two or more, two or more of groups L$_1$ are identical to or different from each other,
in Formula 1, L$_2$ and L$_3$ are each independently selected from a monodentate ligand, a bidentate ligand, a tridentate ligand, and a tetradentate ligand,
in Formula 1, n2 and n3 are each independently 0, 1, 2, 3, or 4, wherein, when n2 is two or more, two or more of groups L$_2$ are identical to or different from each other, and when n3 is two or more, two or more of groups L$_3$ are identical to or different from each other,
in Formula 2, X$_1$ is C(R$_1$) or N, X$_2$ is C(R$_2$) or N, X$_3$ is C(R$_3$) or N, and X$_4$ is C(R$_4$) or N,
in Formulae 4A and 4B, X$_{11}$ is C(R$_{11}$) or N, X$_{12}$ is C(R$_{12}$) or N, and X$_{13}$ is O, S, Se, N(R$_{13}$), B(R$_{13}$), P(R$_{13}$), or C(R$_{13}$)(R$_{14}$),
in Formulae 4A and 4B, when X$_{11}$ is C(R$_{11}$) and X$_{12}$ is C(R$_{12}$), R$_{11}$ and R$_{12}$ are not linked to each other,
in Formulae 4A and 4B, ⫽ represents a single bond or a double bond,
in Formula 2, i) X$_1$ is C(R$_1$) and X$_2$ is C(R$_2$), wherein R$_1$ and R$_2$ are linked to each other to form ring CY$_2$ represented by Formula 4A or 4B, ii) X$_2$ is C(R$_2$) and X$_3$ is C(R$_3$), wherein R$_2$ and R$_3$ are linked to each other to form ring CY$_2$ represented by Formula 4A or 4B, or iii) X$_3$ is C(R$_3$) and X$_4$ is C(R$_4$), wherein R$_3$ and R$_4$ are linked to each other to form ring CY$_2$ represented by Formula 4A or 4B,
ring CY$_1$ in Formula 2 and ring CY$_2$ represented by Formula 4A or 4B are condensed with each other,
a) when X$_2$ in Formula 2 is C(R$_2$) and X$_3$ is C(R$_3$), then R$_2$ and R$_3$ are linked to each other to form ring CY$_2$ represented by Formula 4A or 4B, b) when X$_{13}$ in Formula 4A and 4B is N(R$_{13}$), then at least one of X$_{11}$ and X$_{12}$ in Formula 4A and 4B is N,
in Formula 2,
X$_2$ is C(R$_2$) and X$_3$ is C(R$_3$), wherein R$_2$ and R$_3$ are linked to each other to form ring CY$_2$ represented by Formula 4A or 4B, wherein in Formulae 4A and 4B, X$_{11}$ is N and X$_{13}$ is N(R$_{13}$), O, or S, or
in Formula 2, X$_{21}$ is C or N,
ring CY$_{21}$ is i) a first ring, ii) a second ring, iii) a ring in which at least two second rings are condensed with each other, or iv) a ring in which at least one first ring and at least one second rings are condensed with each other, the first ring is a cyclopentadiene group, a furan group, a thiophene group, a pyrrole group, a silole group, an oxazole group, an isoxazole group, an oxadiazole group, an isozadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, and a triazasilole group, the second ring is an adamantane group, a norbornane group, a norbornene group, a cyclohexane group, a cyclohexene group, a benzene group, a pyridine group, a pyrimidine group, a pyrazine group, a pyridazine group, or a triazine group, provided that when $CY_{21}$ is a ring in which at least one first ring and at least one second rings are condensed with each other, then the at least one second ring is bound to M, $R_1$ to $R_4$, $R_{11}$ to $R_{14}$, and $R_{21}$ are each independently selected from hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), a21 is an integer from 0 to 20, in formula 2, when ring $CY_{21}$ is a $C_5$-$C_{30}$ carbocyclic group, then i) $R_{21}$ is selected from —F, —Cl, —Br, —I, —SF$_5$, a cyano group, a substituted or unsubstituted $C_1$-$C_{60}$ alkoxy group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and ii) a21 is an integer from 1 to 20, two of a plurality of neighboring groups $R_{21}$ are optionally linked to each other to form a substituted or unsubstituted $C_5$-$C_{30}$ carbocyclic group or a substituted or unsubstituted $C_1$-$C_{30}$ heterocyclic group, in Formula 2, * and *' each indicate a binding site to M in Formula 1, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(=O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(=O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, and the organometallic compound emits blue light having a maximum emission wavelength in a range from 440 nanometers to 480 nanometers.

2. The organometallic compound of claim 1, wherein
M is Ir or Os, and the sum of n1+n2+n3 is 3 or 4; or
M is Pt, and the sum of n1+n2+n3 is 2.

3. The organometallic compound of claim 1, wherein in Formulae 4A and 4B, $X_{13}$ is O, S, or N($R_{13}$).

4. The organometallic compound of claim 1, wherein ring $CY_{21}$ is selected from a cyclopentene group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-on group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-on group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzooxadiazole group, a benzothiadiazole group, a 5,6,7,8-tetrahydroisoquinoline group, and a 5,6,7,8-tetrahydroquinoline group.

5. The organometallic compound of claim 1, wherein $R_1$ to $R_4$, $R_{11}$ to $R_{14}$, and $R_{21}$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{20}$ alkyl group, a C$_1$-C$_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a C$_1$-C$_{20}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —N(Q$_1$)(Q$_2$), —Si(Q$_3$)(Q$_4$)(Q$_5$), —B(Q$_6$)(Q$_7$), and —P(=O)(Q$_8$)(Q$_9$), and Q$_1$ to Q$_9$ are each independently be selected from:
—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a C$_1$-C$_{10}$ alkyl group, and a phenyl group.

6. The organometallic compound of claim 1, wherein at least one R$_{21}$ in the number of a21 in Formula 2 is a cyano group.

7. The organometallic compound of claim 1, wherein a group represented by

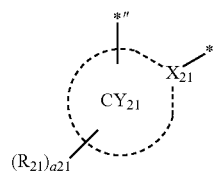

in Formula 2 is selected from groups represented by Formulae CY21-1 to CY21-25:

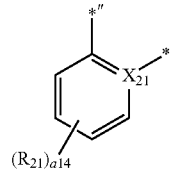

CY21-1

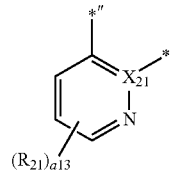

CY21-2

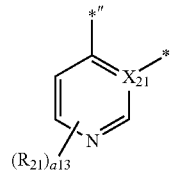

CY21-3

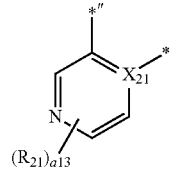

CY21-4

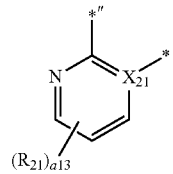

CY21-5

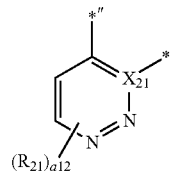

CY21-6

CY21-7
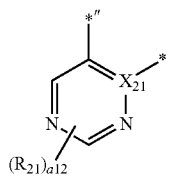
CY21-8
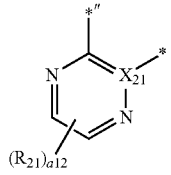
CY21-9
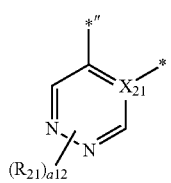
CY21-10
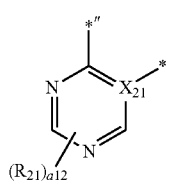
CY21-11
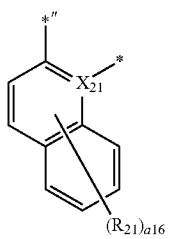
CY21-12
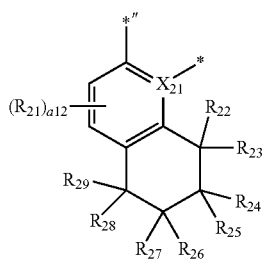
CY21-13
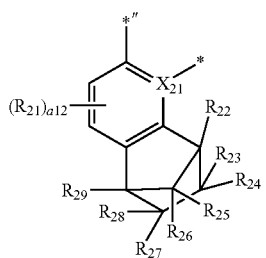
CY21-14
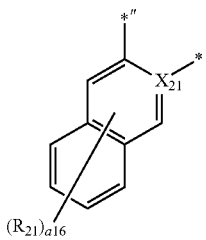
CY21-15
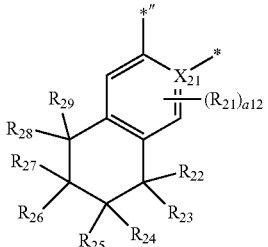
CY21-16
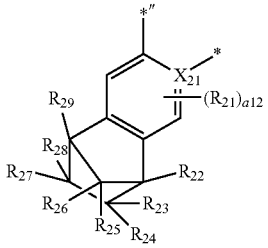
CY21-17
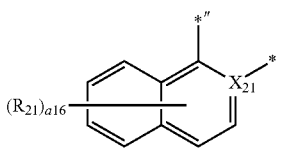
CY21-18
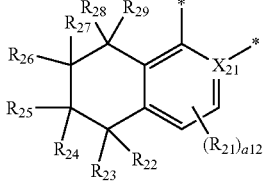
CY21-19
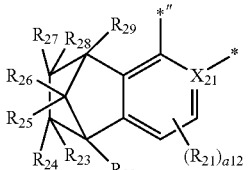
CY21-20
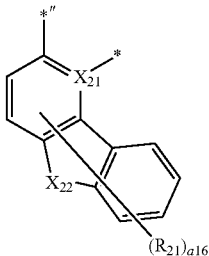

-continued

CY21-21
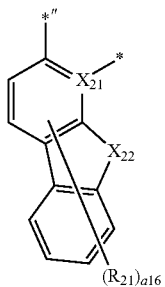

CY21-22
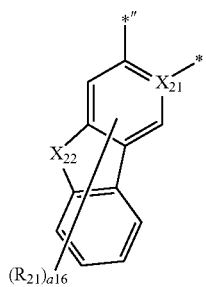

CY21-23
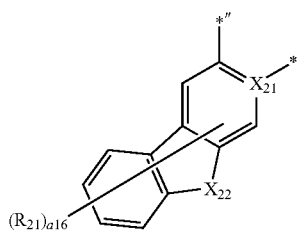

CY21-24
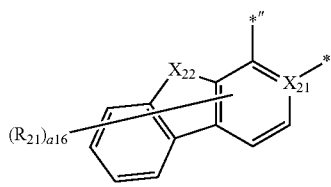

CY21-25
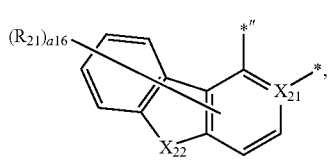

wherein, in Formulae CY21-1 to CY21-25, $X_{21}$ and $R_{21}$ are each the same as defined in claim 1, respectively, $X_{22}$ is $C(R_{22})(R_{23})$, $N(R_{22})$, O, S, Se, or $Si(R_{22})(R_{23})$, $R_{22}$ to $R_{29}$ are each defined the same as $R_{21}$ in claim 1, respectively, a16 is an integer from 0 to 6, a14 is an integer from 0 to 4, a13 is an integer from 0 to 3, a12 is an integer from 0 to 2,

*″ indicates a binding site to ring $CY_1$ in Formula 2, and

* indicates a binding site to M in Formula 1.

8. The organometallic compound of claim 1, wherein a group represented by

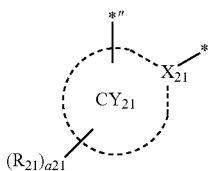

in Formula 2 is selected from groups represented by Formulae CY21(1) to CY21(56):

CY21(1)
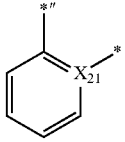

CY21(2)
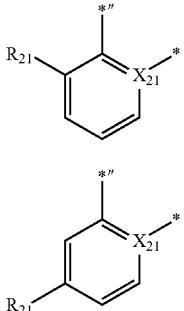

CY21(3)
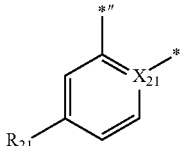

CY21(4)
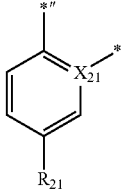

CY21(5)
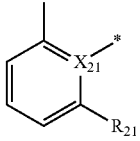

CY21(6)
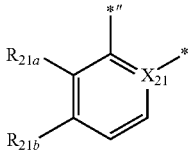

CY21(7)
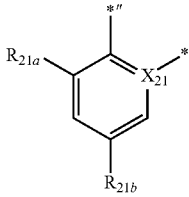

-continued
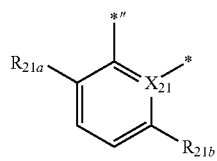
CY21(8)
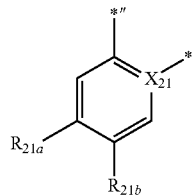
CY21(9)
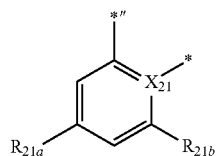
CY21(10)
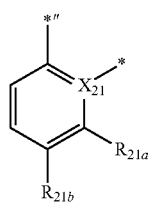
CY21(11)
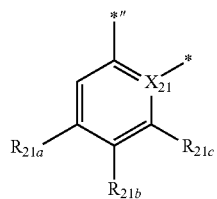
CY21(12)
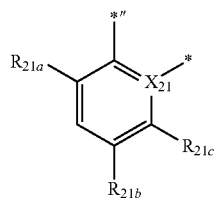
CY21(13)
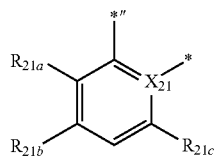
CY21(14)
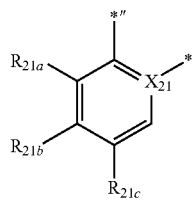
CY21(15)
-continued
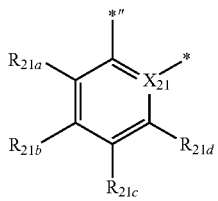
CY21(16)
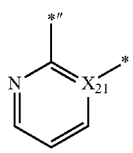
CY21(17)
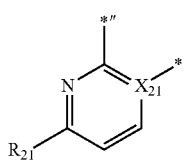
CY21(18)
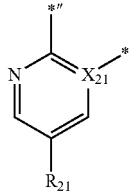
CY21(19)
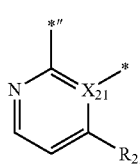
CY21(20)
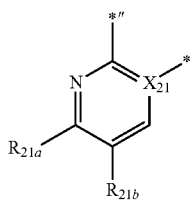
CY21(21)
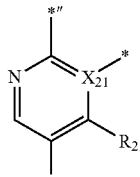
CY21(22)
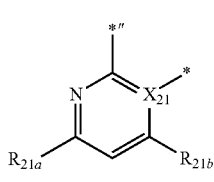
CY21(23)

-continued
CY21(24)
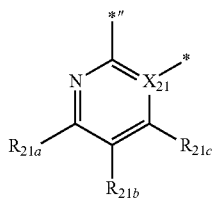
CY21(25)
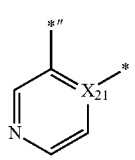
CY21(26)
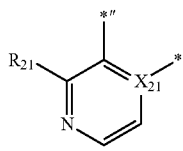
CY21(27)
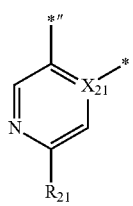
CY21(28)
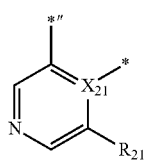
CY21(29)
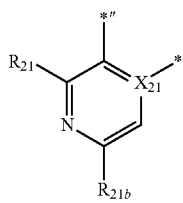
CY21(30)
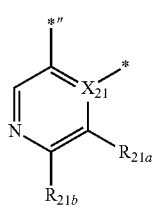
CY21(31)
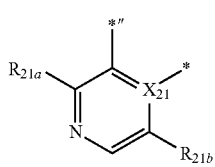
-continued
CY21(32)
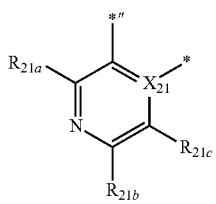
CY21(33)
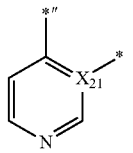
CY21(34)
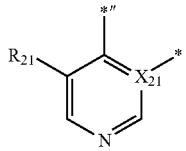
CY21(35)
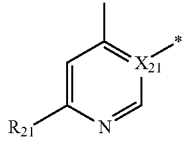
CY21(36)
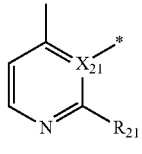
CY21(37)
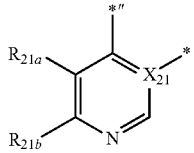
CY21(38)
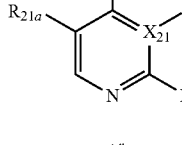
CY21(39)
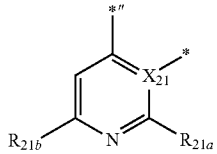
CY21(40)
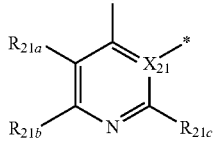

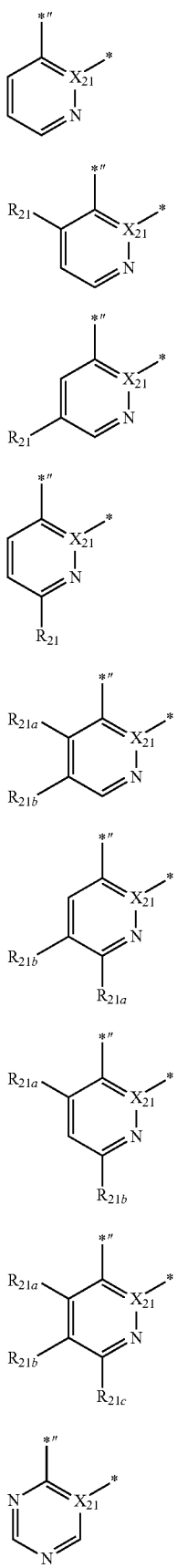
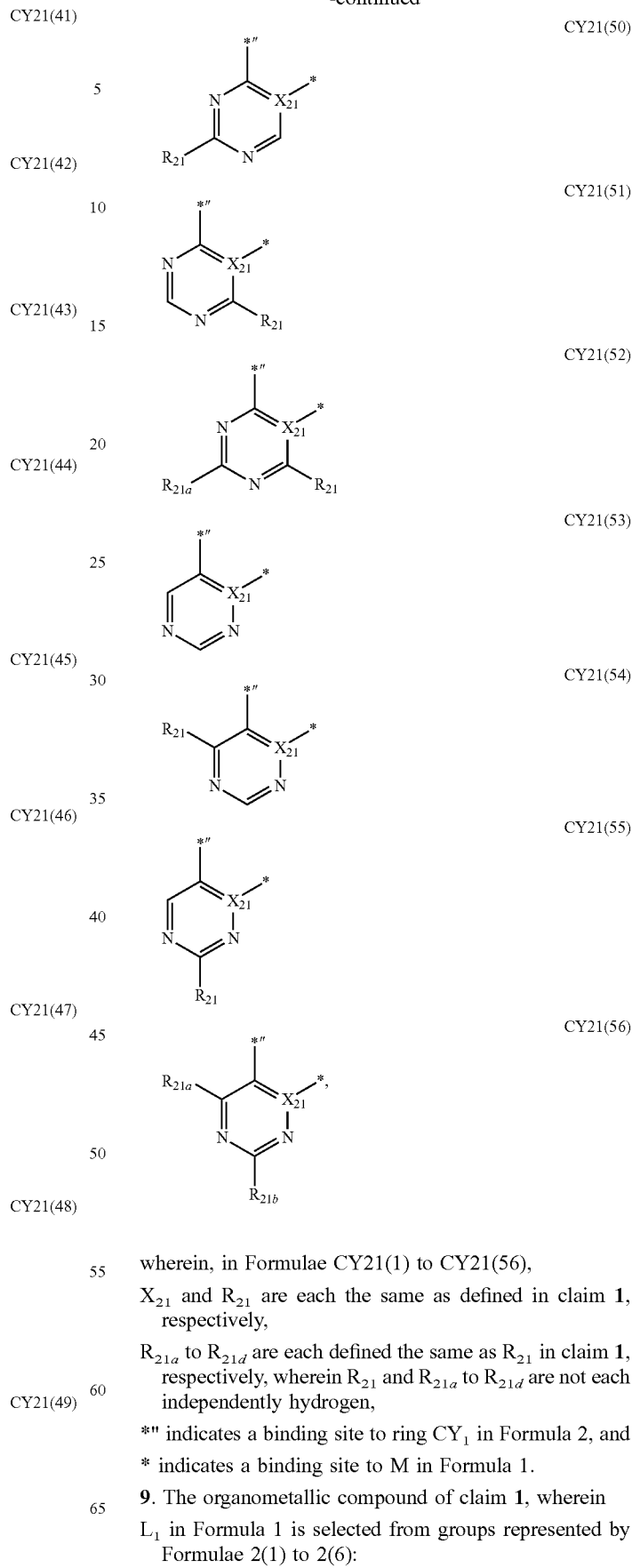

wherein, in Formulae CY21(1) to CY21(56),

X$_{21}$ and R$_{21}$ are each the same as defined in claim 1, respectively, R$_{21a}$ to R$_{21d}$ are each defined the same as R$_{21}$ in claim 1, respectively, wherein R$_{21}$ and R$_{21a}$ to R$_{21d}$ are not each independently hydrogen,

*″ indicates a binding site to ring CY$_1$ in Formula 2, and

* indicates a binding site to M in Formula 1.

9. The organometallic compound of claim 1, wherein

L$_1$ in Formula 1 is selected from groups represented by Formulae 2(1) to 2(6):

2(1)

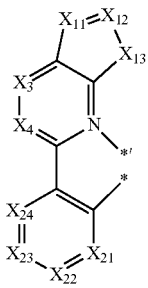

2(2)

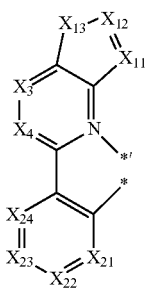

2(3)

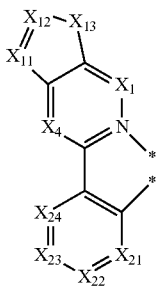

2(4)

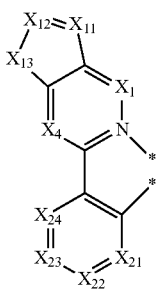

2(5)

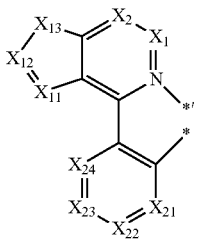

2(6)

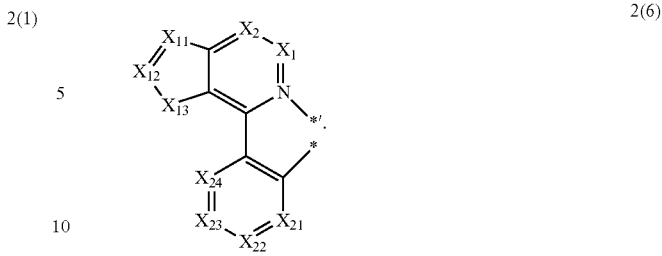

wherein, in Formulae 2-1 to 2-6,
$X_1$ to $X_4$, $X_{11}$ to $X_{13}$, *, and *' are each the same as defined in claim 1, respectively, wherein, when $X_{13}$ in Formulae 2-3 and 2-4 is $N(R_{13})$, at least one of $X_{11}$ and $X_{12}$ in Formulae 2-3 and 2-4 is N,
$X_{21}$ is N or $C(R_{21})$, $X_{22}$ is N or $C(R_{22})$, $X_{23}$ is N or $C(R_{23})$, $X_{24}$ is N or $C(R_{24})$,
$R_{21}$ to $R_{24}$ are defined the same as $R_{21}$ in claim 1, and two or more neighboring groups selected from $R_{21}$ to $R_{24}$ are optionally linked to each other to form a $C_5$-$C_{30}$ carbocyclic group unsubstituted or substituted with at least one $R_{20}$ or a $C_1$-$C_{30}$ heterocyclic group unsubstituted or substituted with at least one $R_{20}$, wherein $R_{20}$ is defined the same as $R_{21}$ in claim 1.

10. The organometallic compound of claim 9, wherein $X_{23}$ in Formulae 2(1) to 2(6) is C(CN).

11. The organometallic compound of claim 1, wherein $L_2$ and $L_3$ in Formula 1 are each independently selected from groups represented by Formulae 3A to 3F:

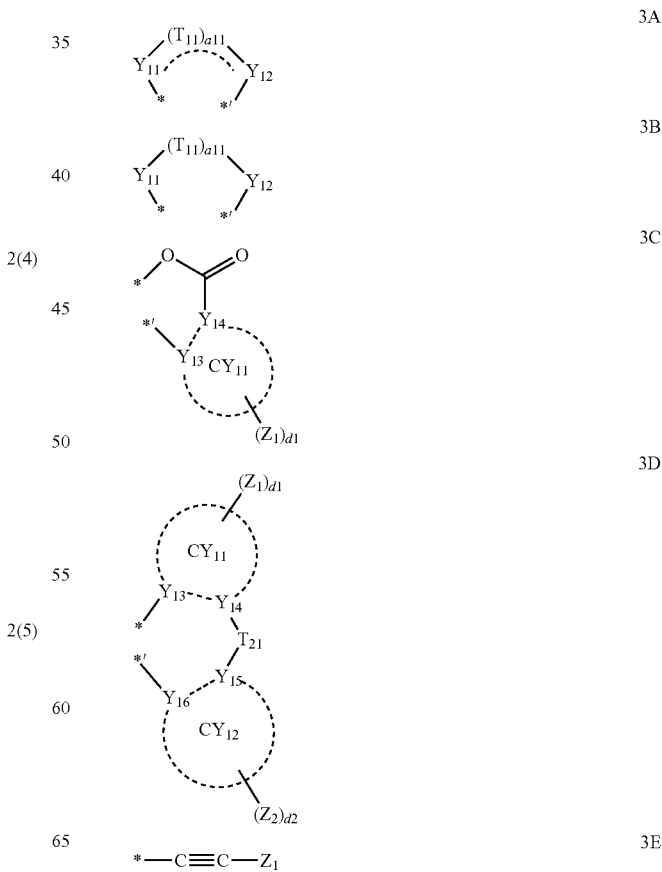

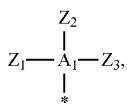

wherein, in Formulae 3A to 3F, $Y_{11}$ is selected from O, N, $N(Z_1)$, $P(Z_1)(Z_2)$, and $As(Z_1)(Z_2)$, $Y_{12}$ is selected from O, N, $N(Z_3)$, $P(Z_3)(Z_4)$, and $As(Z_3)(Z_4)$, $T_{11}$ is selected from a single bond, a double bond, *—$C(Z_{11})(Z_{12})$—*', *—$C(Z_{11})$=$C(Z_{12})$—*', *=$C(Z_{11})$—*', *=$C(Z_{11})$—$C(Z_{12})$=$C(Z_{13})$—*', *—$C(Z_{11})$=$C(Z_{12})$—$C(Z_{13})$=*', *—$N(Z_{11})$—*', and a $C_5$-$C_{30}$ carbocyclic group unsubstituted or substituted with at least one $Z_{11}$, a11 is an integer from 1 to 10, $Y_{13}$ to $Y_{16}$ are each independently C or N, $T_{21}$ is a single bond, a double bond, O, S, $C(Z_{11})(Z_{12})$, $Si(Z_{11})(Z_{12})$, or $N(Z_{11})$, ring $CY_{11}$ and ring $CY_{12}$ are each independently selected from a $C_5$-$C_{30}$ carbocyclic group and a $C_1$-$C_{30}$ heterocyclic group, $A_1$ is P or As, $Z_1$ to $Z_4$ and $Z_{11}$ to $Z_{13}$ are each the same as defined in $R_{21}$ in claim 1, respectively, d1 and d2 are each independently an integer from 0 to 10, and

* and *' each indicate a binding site to M in Formula 1.

12. An organometallic compound of Compounds 1 to 12, 14 to 18, 20 to 30, and 32 to 38 below:

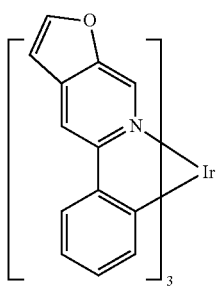

1

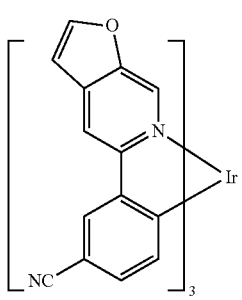

2

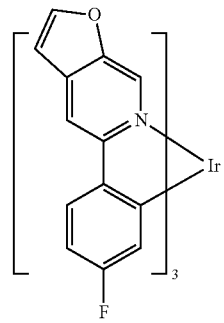

3

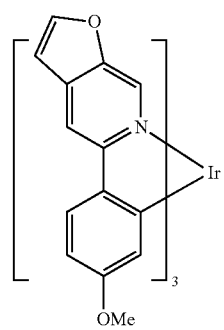

4

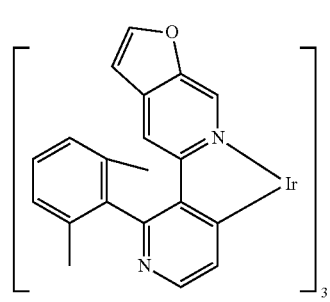

5

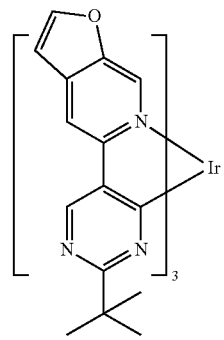

6

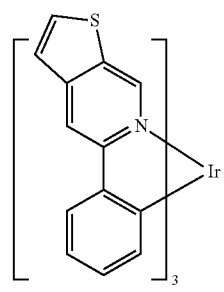

7

-continued
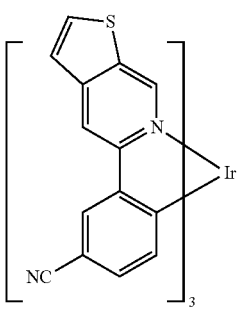
8
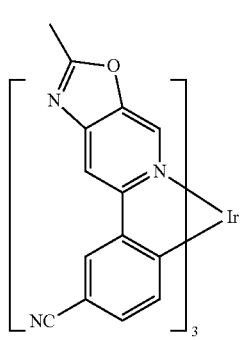
9
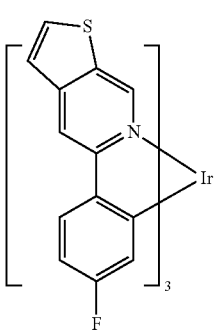
9
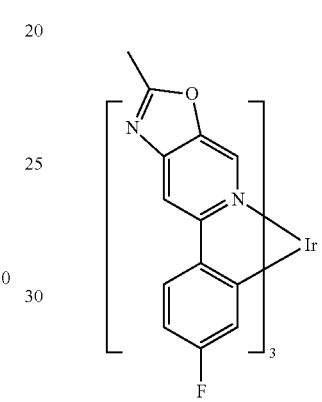
10
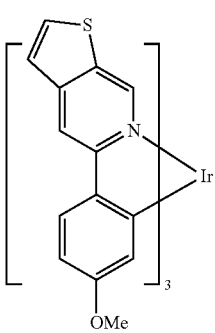
10
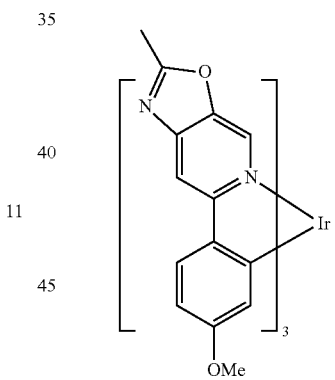
11
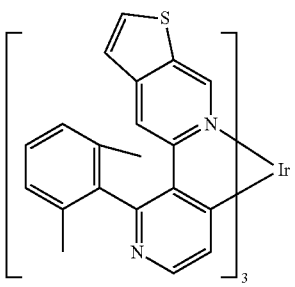
11
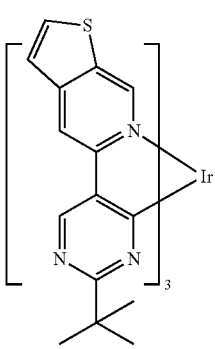
12
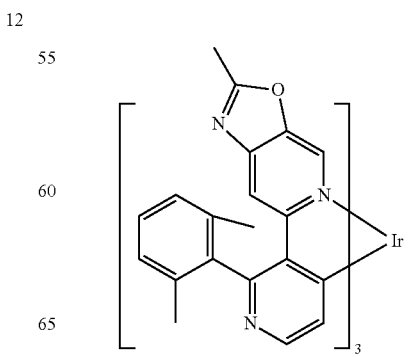

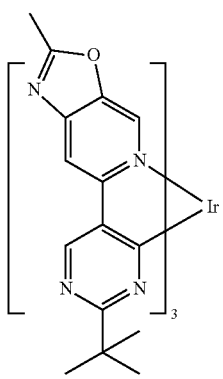
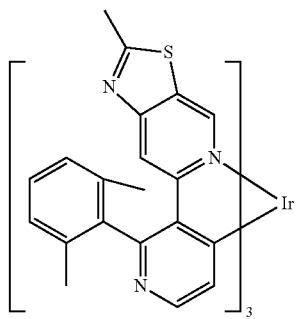
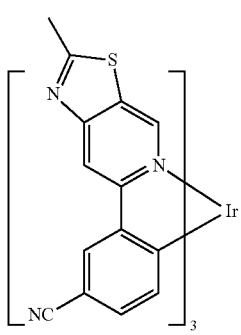
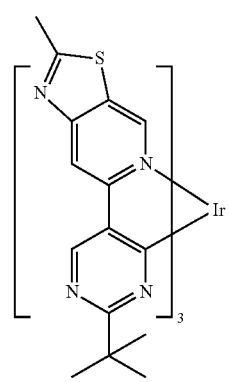
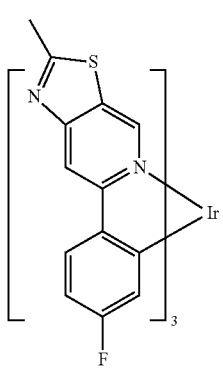
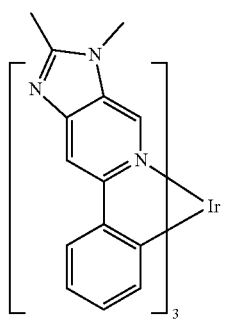
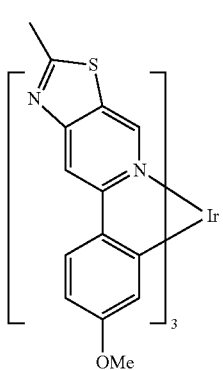
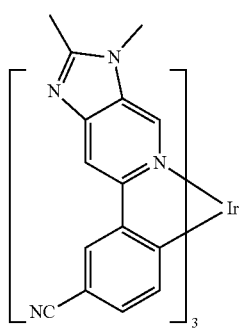

145
-continued
27
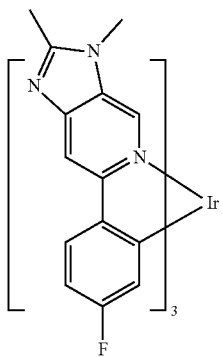
28
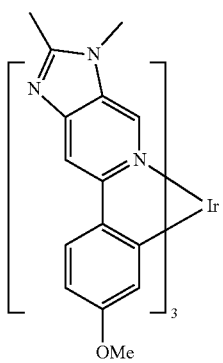
29
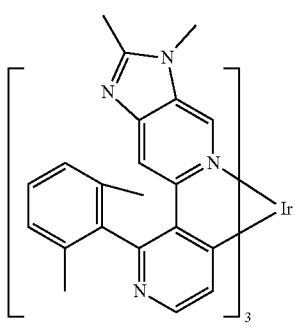
30
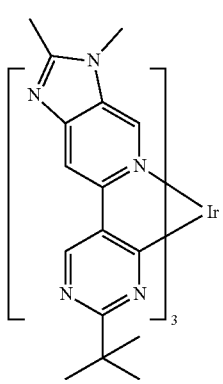
146
-continued
27
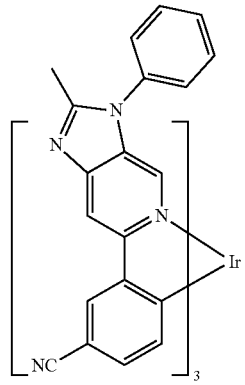
28
29
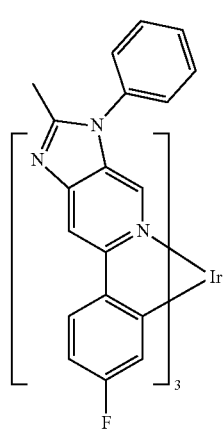
30
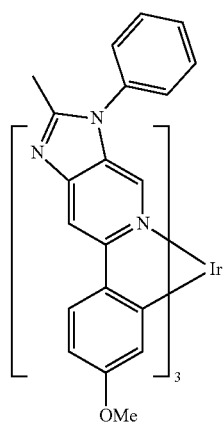
32
33
34

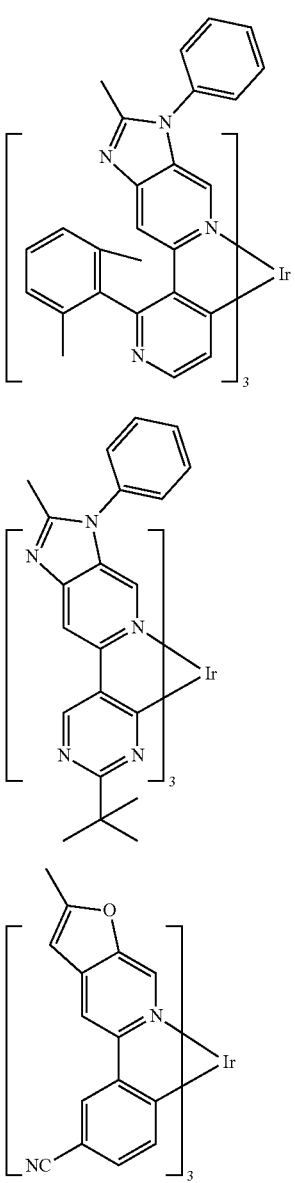

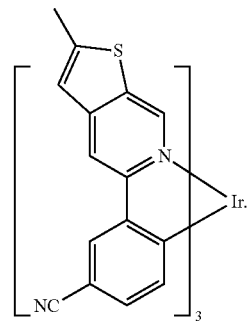

13. An organic light-emitting device comprising:
a first electrode;
a second electrode; and
an organic layer between the first electrode and the second electrode, the organic layer comprising at least one organometallic compound of claim 1.

14. The organic light-emitting device of claim 13, wherein
the first electrode is an anode,
the second electrode is a cathode,
the organic layer further comprises a hole transport region between the first electrode and the emission layer and an electron transport region between the emission layer and the second electrode,
the hole transport region comprises a hole injection layer, a hole transport layer, an electron blocking layer, a buffer layer or any combination thereof, and
the electron transport region comprises a hole blocking layer, an electron transport layer, an electron injection layer, or any combination thereof.

15. The organic light-emitting device of claim 13, wherein the emission layer comprises the organometallic compound.

16. The organic light-emitting device of claim 15, wherein the emission layer further comprises a host, and an amount of the host is greater than that of the organometallic compound.

17. The organic light-emitting device of claim 15, wherein the emission layer emits blue light having a maximum emission wavelength in a range from 440 nanometers to 480 nanometers.

* * * * *